(12) United States Patent
Ohguro et al.

(10) Patent No.: US 7,427,797 B2
(45) Date of Patent: Sep. 23, 2008

(54) SEMICONDUCTOR DEVICE HAVING ACTUATOR

(75) Inventors: Tatsuya Ohguro, Yokohama (JP); Tamio Ikehashi, Yokohama (JP); Mie Matsuo, Kamakura (JP); Shuichi Sekine, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 405 days.

(21) Appl. No.: 11/094,320

(22) Filed: Mar. 31, 2005

(65) Prior Publication Data

US 2006/0098059 A1 May 11, 2006

(30) Foreign Application Priority Data

Nov. 11, 2004 (JP) ............... 2004-327727

(51) Int. Cl.
*H01L 27/20* (2006.01)
(52) U.S. Cl. ............. 257/415; 257/414; 257/416; 257/417; 257/418; 257/419
(58) Field of Classification Search ......... 257/414–419
See application file for complete search history.

(56) References Cited

U.S. PATENT DOCUMENTS

| | | | |
|---|---|---|---|
| 4,670,682 A | 6/1987 | Harnden et al. | |
| 4,672,849 A | 6/1987 | Hoshino | |
| 5,914,507 A | 6/1999 | Polla et al. | |
| 6,120,178 A | 9/2000 | Meusburger et al. | |
| 6,229,684 B1 | 5/2001 | Cowen et al. | |
| 6,336,593 B1 | 1/2002 | Bhatnagar | |
| 6,355,498 B1 | 3/2002 | Chan et al. | |
| 6,359,374 B1 | 3/2002 | Dausch et al. | |
| 6,377,438 B1 | 4/2002 | Deane et al. | |
| 6,496,351 B2 | 12/2002 | Hill et al. | |
| 6,953,977 B2* | 10/2005 | Mlcak et al. | 257/414 |
| 2003/0034535 A1 | 2/2003 | Barenburg et al. | |
| 2003/0094663 A1* | 5/2003 | Sato et al. | 257/414 |
| 2003/0119220 A1* | 6/2003 | Mlcak et al. | 438/52 |
| 2004/0075364 A1 | 4/2004 | Mehta | |
| 2005/0032266 A1* | 2/2005 | Suzuki | 438/50 |
| 2005/0218466 A1* | 10/2005 | Kondo et al. | 257/415 |

FOREIGN PATENT DOCUMENTS

| | | |
|---|---|---|
| CN | 2289302 Y | 8/1998 |
| CN | 1300386 A | 6/2001 |
| CN | 1408120 A | 4/2003 |
| DE | 36 11 969 A1 | 10/1986 |
| JP | 2004-117525 A | 4/2004 |
| WO | WO 99/42282 A1 | 8/1999 |
| WO | WO 2004/047190 A2 | 6/2004 |

OTHER PUBLICATIONS

G. Dong, et al., "Crosstalk effects in mixed-signal CMOS IC," Semiconductor Technology, vol. 27, No. 10, Oct. 2002, pp. 34-37.

* cited by examiner

*Primary Examiner*—Manish S. Shah
*Assistant Examiner*—Mark J Stevenosky, Jr.
(74) *Attorney, Agent, or Firm*—Foley & Lardner LLP

(57) ABSTRACT

A semiconductor device having a surface MEMS element, includes a semiconductor substrate, and an actuator which is arranged above the semiconductor substrate via a space and has a lower electrode, an upper electrode, and a piezoelectric layer sandwiched between the lower electrode and the upper electrode, at least an entire surface of the piezoelectric layer being substantially flat.

15 Claims, 62 Drawing Sheets

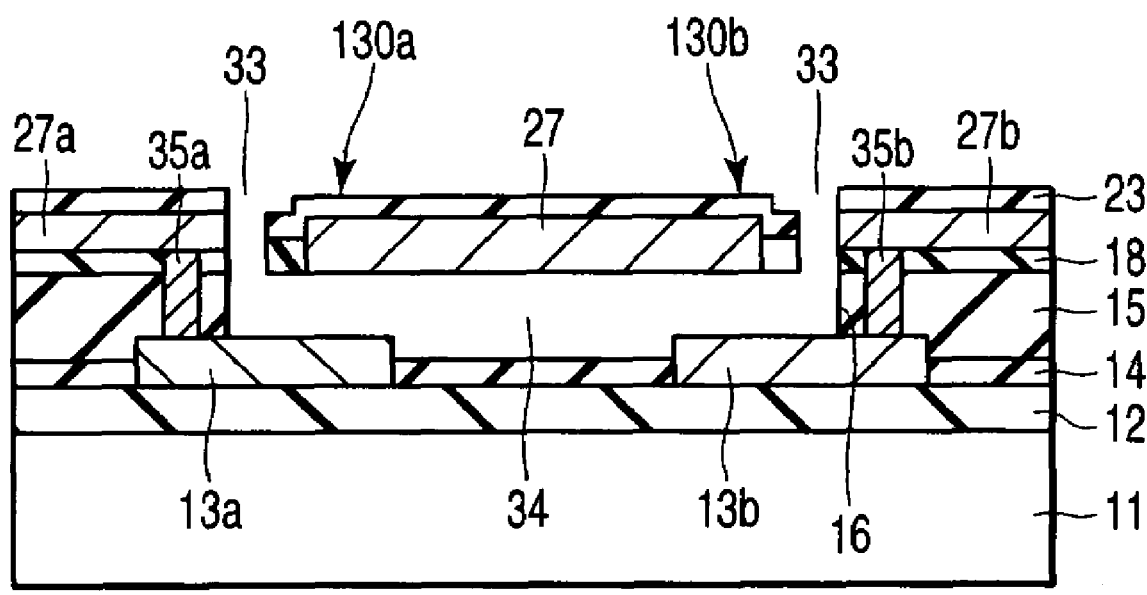
F I G. 5 2

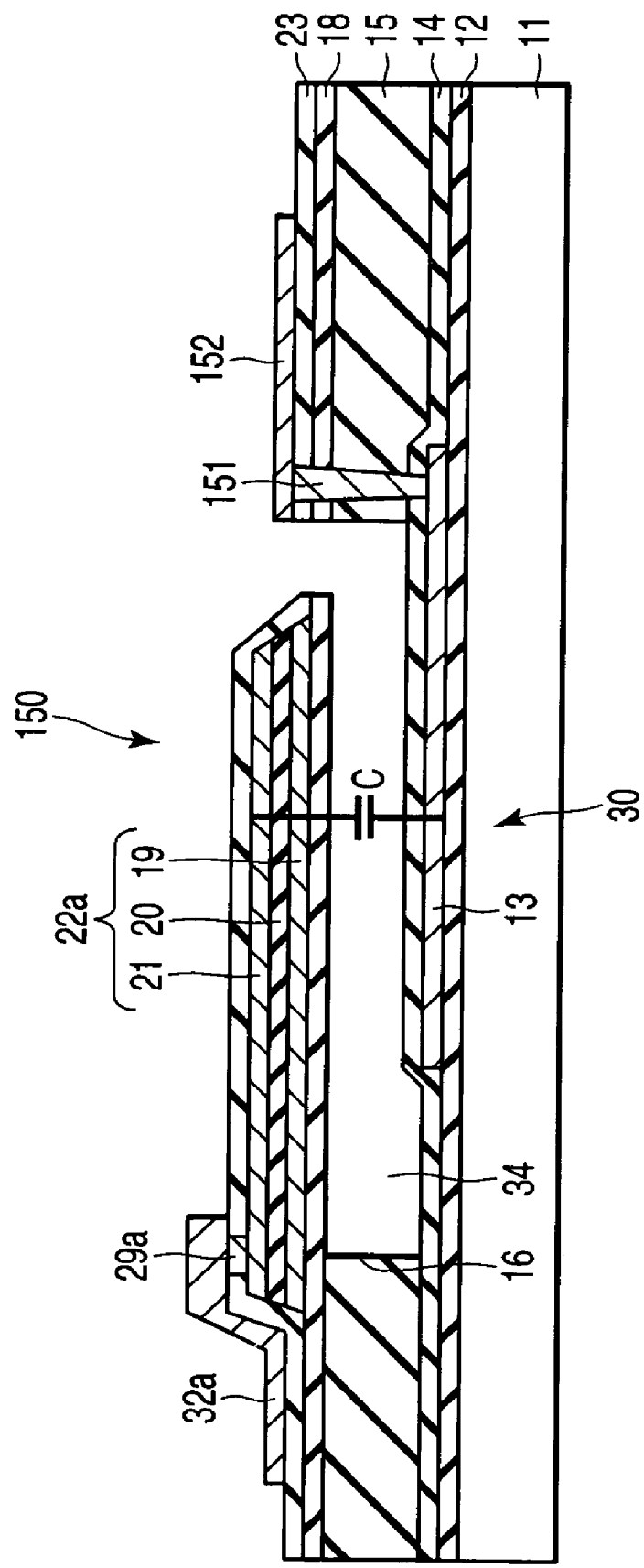
F I G . 6 0

SEMICONDUCTOR DEVICE HAVING ACTUATOR

CROSS-REFERENCE TO RELATED APPLICATIONS

This application is based upon and claims the benefit of priority from prior Japanese Patent Application No. 2004-327727, filed Nov. 11, 2004, the entire contents of which are incorporated herein by reference.

BACKGROUND OF THE INVENTION

1. Field of the Invention

The present invention relates to a semiconductor device having a MEMS (Micro-Electro-Mechanical Systems) element with an actuator.

2. Description of the Related Art

In recent years, development of MEMS (Micro-Electro-Mechanical Systems) elements having a movable structure formed by micromachining is progressing on an extensive scale.

Typical examples of MEMS elements are a variable capacitor, switch, sensor, gyroscope, and mirror device. The MEMS elements include a piezoelectric MEMS element using a piezoelectric material which deforms upon receiving a voltage.

U.S. Pat. Nos. 6,359,374 and 6,355,498 disclose examples of piezoelectric MEMS elements functioning as a variable capacitor. Each of the actuators of U.S. Pat. Nos. 6,359,374 and 6,355,498 includes an upper electrode, lower electrode, and a piezoelectric film sandwiched between the upper electrode and the lower electrode. The actuator is moved by adjusting the voltage applied to the upper and lower electrodes of the actuator. The capacitance is changed by changing the distance between the upper electrode and the lower electrode of the variable capacitor.

However, in the structures described in U.S. Pat. Nos. 6,359,374 and 6,355,498, the piezoelectric layer is not flat because of a step. For this reason, when a voltage is applied to the electrodes on the upper and lower sides of the piezoelectric film, the piezoelectric film stretches nonuniformly, or the horizontal stretch of the piezoelectric film decreases. In addition, when the actuator moves, a crack may be formed at the step portion of the piezoelectric film, resulting in a decrease in yield.

As described above, in the conventional piezoelectric MEMS element, since the piezoelectric film is not flat, the reliability of the MEMS element is low.

BRIEF SUMMARY OF THE INVENTION

A semiconductor device according to a first aspect of the present invention is a semiconductor device having a surface MEMS element, comprising a semiconductor substrate, and an actuator which is arranged above the semiconductor substrate via a space and has a lower electrode, an upper electrode, and a piezoelectric layer sandwiched between the lower electrode and the upper electrode, at least an entire surface of the piezoelectric layer being substantially flat.

A semiconductor device according to a second aspect of the present invention comprises a semiconductor substrate which has a first region and a second region, an actuator which is arranged above the semiconductor substrate in the first region via a space and has a lower electrode, an upper electrode, and a piezoelectric layer sandwiched between the lower electrode and the upper electrode, a first electrode layer which is formed on the semiconductor substrate in the first region, a second electrode layer which is arranged above the semiconductor substrate in the first region via the space, opposes the first electrode layer, and moves in accordance with movement of the actuator, and a gate electrode which is formed on the semiconductor substrate in the second region and made of a same material as the first electrode layer.

BRIEF DESCRIPTION OF THE SEVERAL VIEWS OF THE DRAWING

FIG. 52 is a sectional view showing the MEMS element taken along a line LII-LII in FIG. 50;

FIG. 60 is a sectional view showing the MEMS element taken along a line LX-LX in FIG. 59;

DETAILED DESCRIPTION OF THE INVENTION

Figure 1:
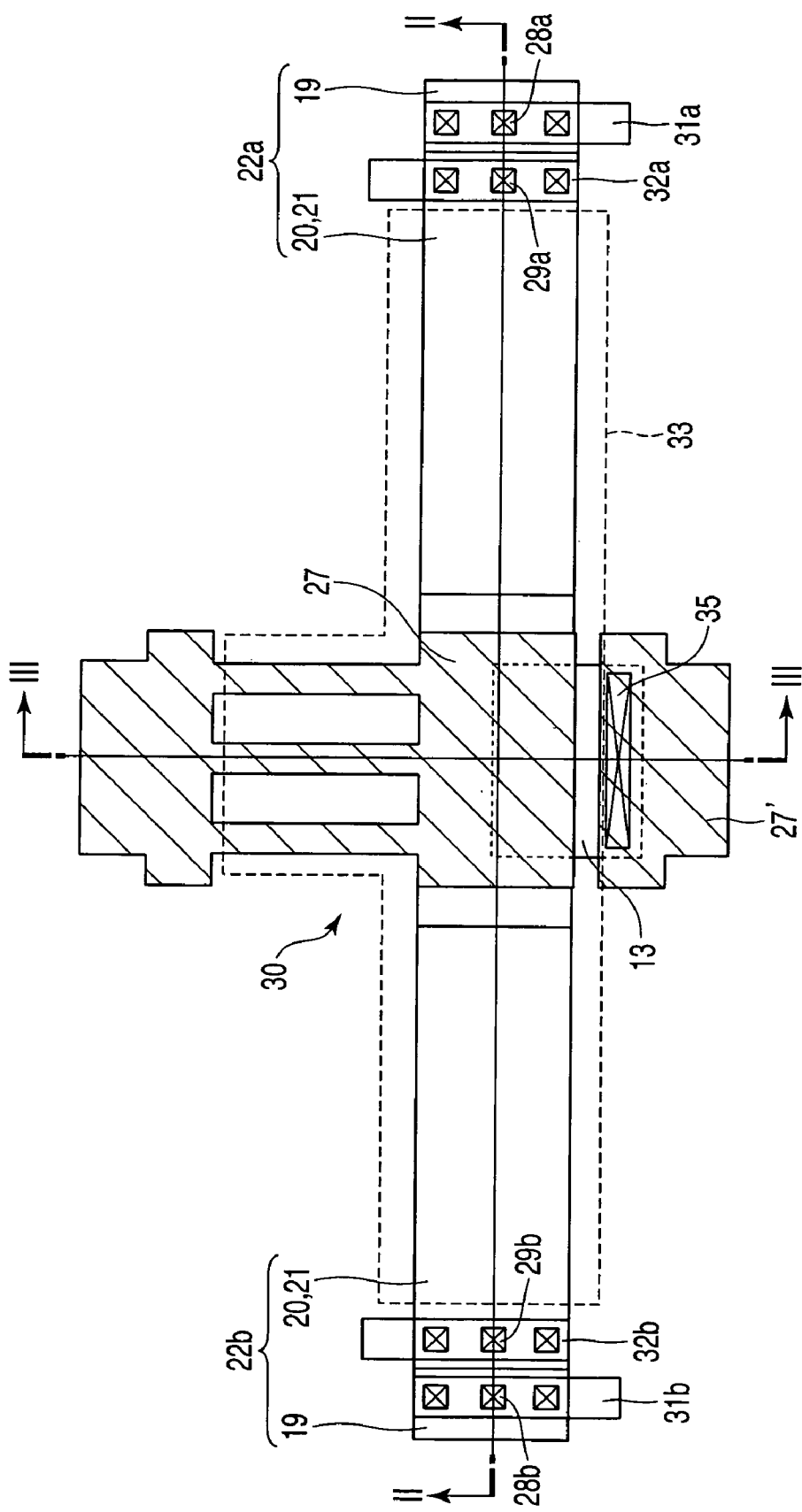
FIG. 1 is a plan view showing a MEMS element according to a first embodiment of the present invention.

The embodiments of the present invention will be described below with reference to the accompanying drawing. In the description, the same reference numerals denote the same parts throughout the drawing.

The embodiments of the present invention are directed to a surface MEMS (Micro-Electro-Mechanical Systems) having an actuator.

An actuator converts, e.g., an electrical signal into a mechanical movement to move the movable portion of a MEMS element. Actuators can be classified into an electrostatic type, thermal type, electromagnetic type, and piezoelectric type in accordance with the driving method. Of these actuators, a piezoelectric actuator implements a movable structure by using the piezoelectric effect of a piezoelectric material. A MEMS element (piezoelectric MEMS element) having a piezoelectric actuator can implement both low-voltage operation and low power consumption and can suitably be used as a component for, e.g., portable devices.

In the embodiments of the present invention, the piezoelectric MEMS element is applied to [1] a variable capacitor, [2] a switch, [3] a mirror, [4] a sensor, [5] an ultrasonic transducer, and [6] an FBAR (Film Bulk Acoustic Resonator) filter.

[1] Variable Capacitor

First to eleventh embodiments of the present invention point to structures in which a piezoelectric MEMS element functions as a variable capacitor.

1-1 FIRST EMBODIMENT

In the first embodiment, a MEMS element functions as a variable capacitor.

(1) Structure

Figure 2:
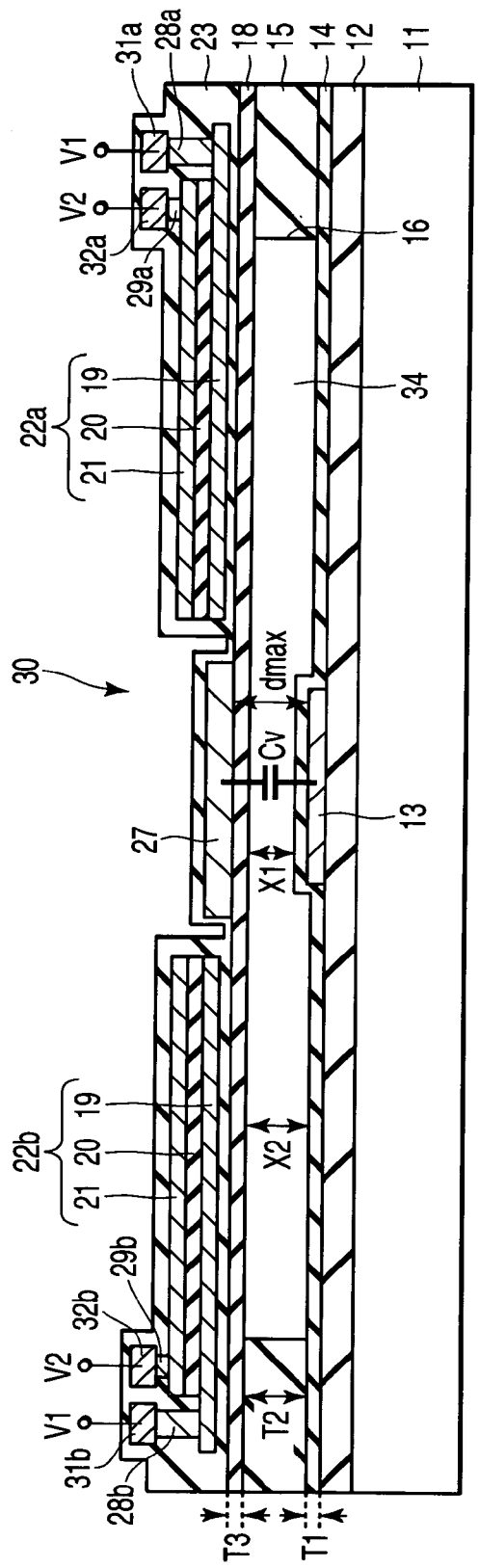
FIG. 2 is a sectional view showing the MEMS element taken along a line II-II in FIG. 1.
Figure 3:
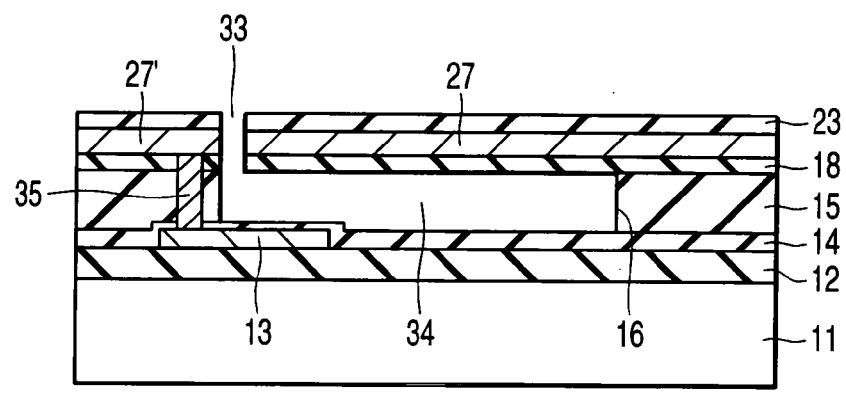
FIG. 3 is a sectional view showing the MEMS element taken along a line III-III in FIG. 1.
Figure 4:
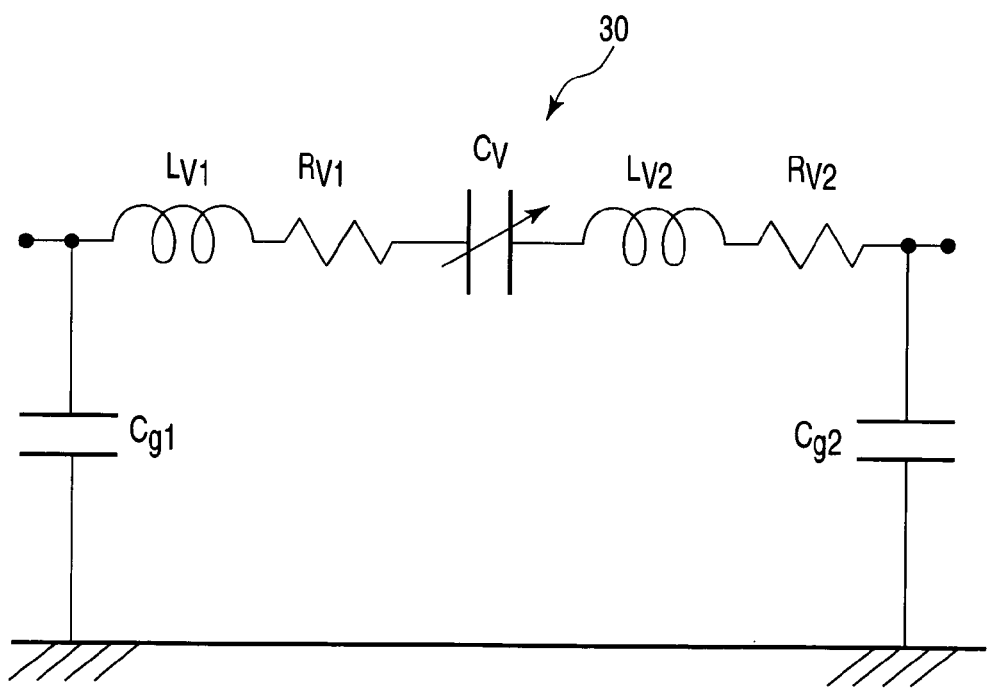
FIG. 4 is an equivalent circuit diagram showing the MEMS element according to the first embodiment of the present invention.

FIG. 1 is a plan view of a MEMS element according to the first embodiment of the present invention. FIG. 2 is a sectional view of the MEMS element taken along a line II-II in FIG. 1. FIG. 3 is a sectional view of the MEMS element taken along a line III-III in FIG. 1. FIG. 4 is a schematic equivalent circuit diagram of the MEMS element according to the first embodiment of the present invention. The structure of the MEMS element according to the first embodiment of the present invention will be described below.

As shown in FIGS. 1 and 2, a thermal oxide film 12 is formed on a semiconductor substrate (e.g., a silicon substrate) 11. A first electrode layer 13 of a variable capacitor 30 is formed on the thermal oxide film 12. A first insulating film 14 is formed on the first electrode layer 13 and thermal oxide film 12. The first insulating film 14 covers the first electrode layer 13 of the variable capacitor 30.

Second insulating films 15 are partially formed on the first insulating film 14. A cavity 34 is present above the first electrode layer 13 so that actuators 22a and 22b can move. A third insulating film 18 is formed on the second insulating films 15 across over the cavity 34. A second electrode layer 27 of the variable capacitor 30 is formed on the third insulating film 18 to oppose the first electrode layer 13.

The actuators 22a and 22b are formed on both sides of the second electrode layer 27. The actuators 22a and 22b are separated from the second electrode layer 27. Each of the actuators 22a and 22b includes a lower electrode 19, an upper electrode 21, and a piezoelectric layer 20 sandwiched between the lower electrode 19 and the upper electrode 21. Contacts 28a and 28b and interconnection layers 31a and 31b are connected to the lower electrodes 19. Contacts 29a and 29b and interconnection layers 32a and 32b are connected to the upper electrodes 21. Voltages V1 and V2 are applied to the lower electrode 19 and upper electrode 21, respectively. The size of a chip including the variable capacitor 30 is, e.g., 2 cm×2 cm.

As shown in FIG. 3, the MEMS element has an opening portion 33 to remove a sacrificial layer (not shown) in a trench 16. When the sacrificial layer is removed through the opening portion 33, the cavity 34 is formed between the first electrode layer 13 and the second electrode layer 27 of the variable capacitor 30. The second electrode layer 27 is interrupted at a part by the opening portion 33. The interrupted part serves as an extraction interconnection layer 27'. The extraction interconnection layer 27' is connected to the first electrode layer 13 through a contact 35. For example, ground potential or variable potential is supplied to the first electrode layer 13.

FIG. 4 is a schematic equivalent circuit diagram showing the above-described MEMS element. As shown in FIG. 4, for example, parasitic resistances Rv1 and Rv2 and parasitic inductances Lv1 and Lv2 of leads are present at the two terminals of the variable capacitor 30. Parasitic capacitances Cg1 and Cg2 are present between the variable capacitor 30 and the substrate. Hence, the semiconductor substrate 11 is preferably connected to ground. However, the semiconductor substrate 11 need not always be connected to ground.

The thermal oxide film 12 need not always be formed on the semiconductor substrate 11. If the thermal oxide film 12 is to be formed, it can be formed very thin. For example, if the thermal oxide film 12 should function as an etching stopper in fabricating the first electrode layer 13, a thickness of, e.g., 400 nm or more suffices. If the thermal oxide film 12 should function as an insulating layer, a thickness of, e.g., 3 nm or more suffices.

(Actuator)

The actuators 22a and 22b have the following structure.

Of the lower electrode 19, upper electrode 21, and piezoelectric layer 20, at least the piezoelectric layer 20 is almost flat. All the three layers are preferably flat. An entire surface of the piezoelectric layer 20 is preferably almost flat. In other words, the entire surface of the piezoelectric layer 20 preferably forms a flat surface almost parallel to the surface of the semiconductor substrate 11.

The area of the lower electrode 19 may be either almost equal to or larger or smaller than the area of the upper electrode 21. As shown in FIGS. 1 and 2, when the area of the lower electrode 19 is larger than that of the upper electrode 21, the contacts 28a and 28b connected to the lower electrodes 19 can easily be extracted upward.

The area of the piezoelectric layer 20 may be either almost equal to or larger or smaller than the area of the lower electrode 19. In addition, the area of the piezoelectric layer 20 may be either almost equal to or larger or smaller than the area of the upper electrode 21. In other words, all the piezoelectric layer 20, lower electrode 19, and upper electrode 21 can have the same planar shape. Alternatively at least one of them may have a different shape. More specifically, for example, the area of the piezoelectric layer 20 can be made smaller than that of the lower electrode 19 such that the piezoelectric layer 20 is formed on only the lower electrode 19. Alternatively, the layered structure including the lower electrode 19, piezoelectric layer 20, and upper electrode 21 may be formed such that an upper layer has a smaller area.

The side surfaces of the piezoelectric layer 20, lower electrode 19, and upper electrode 21 may almost match with each other (almost flush with each other) or partially be unmatched. More specifically, for example, the side surface of the piezoelectric layer 20 may almost match with the side surface of the upper electrode 21. The side surfaces of the piezoelectric layer 20, lower electrode 19, and upper electrode 21 may almost match with each other at the end of each of the actuators 22a and 22b on the side of the variable capacitor 30. The side surface of the lower electrode 19 may project from the side surfaces of the piezoelectric layer 20 and upper electrode 21 at the end of each of the actuators 22a and 22b on the opposite side of the variable capacitor 30. Alternatively, the lower electrode 19, piezoelectric layer 20, and upper electrode 21 may be formed such that the side surface of a lower layer (e.g., lower electrode 19) may be covered with an upper layer (e.g., piezoelectric layer 20). The side surfaces of all of these layers may be in contact with an insulating film 23.

The piezoelectric layer 20, lower electrode 19, and upper electrode 21 can have various planar shapes. They can have, e.g., a polygonal shape (e.g., a square shape, rectangular shape, tetragonal shape, or hexagonal shape) or circular shape. The upper electrode 21 may have a planar shape having five or more sides and obtuse angles. In this case, deformation of the upper electrode 21 or its peeling of it from the piezoelectric layer 20 can be suppressed.

The piezoelectric layer 20, lower electrode 19, and upper electrode 21 may have either almost the same thickness or different thicknesses. For example, the lower electrode 19 may be thinner or thicker than the upper electrode 21. The thickness of the piezoelectric layer 20 can be, e.g., 0.2 nm or less.

The insulating films 15 are preferably present under the ends of the actuators 22a and 22b on the opposite sides of the variable capacitor 30. That is, the actuators 22a and 22b are preferably partially located on the insulating films 15 instead of locating the actuators 22a and 22b wholly on the cavity 34. This is because when the insulating films 15 function as fulcrums in moving the actuators 22a and 22b, the movement controllability can be increased.

(Variable Capacitor)

The variable capacitor 30 has the following structure.

The area of the second electrode layer 27 may be either larger or smaller then or almost equal to the area of the first electrode layer 13.

The first electrode layer 13 and second electrode layer 27 may have either different planar shapes or almost the same planar shape.

The sheet resistance of at least one of the first electrode layer 13 and second electrode layer 27 is, e.g., 10Ω/sq or less.

The first electrode layer 13 and second electrode layer 27 may have almost the same thickness or different thicknesses. For example, the first electrode layer 13 may be thinner or thicker than the second electrode layer 27.

(2) Material

The layers of the MEMS element are made of, e.g., the following materials.

Examples of the material of the second electrode layer 27 of the variable capacitor 30 are Al, Cu, and W.

Examples of the material of the first electrode layer 13 of the variable capacitor 30 are W, Al, Cu, Au, Ti, Pt, or polysilicon. To decrease the resistance of the first electrode layer 13, W is preferably used. When polysilicon is used as the material of the first electrode layer 13, a silicide layer is preferably formed on the first electrode layer 13. The material of the first electrode layer 13 may contain one of Co, Ni, Si, and N.

Examples of the material of the piezoelectric layers 20 of the actuators 22a and 22b are a ceramic piezoelectric material such as PZT (Pb(Zr,Ti)O$_3$), AlN, ZnO, PbTiO, or BTO (BaTiO) and a polymer piezoelectric material such as PVDF (polyvinylidene fluoride).

Examples of the materials of the upper electrodes 21 and lower electrodes 19 of the actuators 22a and 22b are (a) a material selected from the material group consisting of Pt, Sr, Ru, Cr, Mo, W, Ti, Ta, Al, Cu, and Ni, (b) a nitride containing at least one of the above materials, (c) a conductive oxide (e.g., SrRuO) containing at least one of the above materials, (d) a compound made of materials selected from the material group, and (e) a multilayer formed by stacking materials selected from (a) to (d).

Examples of the first insulating film 14 are a single layer made of SiN, a single layer made of SiO$_2$, a single layer made of Al$_2$O$_3$, a multilayer made of SiN/SiO$_2$, and a multilayer made of SiN/Al$_2$O$_3$.

Examples of the third insulating film 18 are a single layer made of SiN, a single layer made of SiO$_2$, a single layer made of Al$_2$O$_3$, a multilayer made of SiN/SiO$_2$, and a multilayer made of SiN/Al$_2$O$_3$.

An example of the fourth insulating film 23 is a single layer made of SiO$_2$.

The first electrode layer 13 and second electrode layer 27 of the variable capacitor 30 may be made of either the same material or different materials. The upper electrodes 21 and lower electrodes 19 of the actuators 22a and 22b may be made of either the same material or different materials. The first insulating film 14 and third insulating film 18 may be made of either the same material or different materials.

(3) Operation

Figure 5:
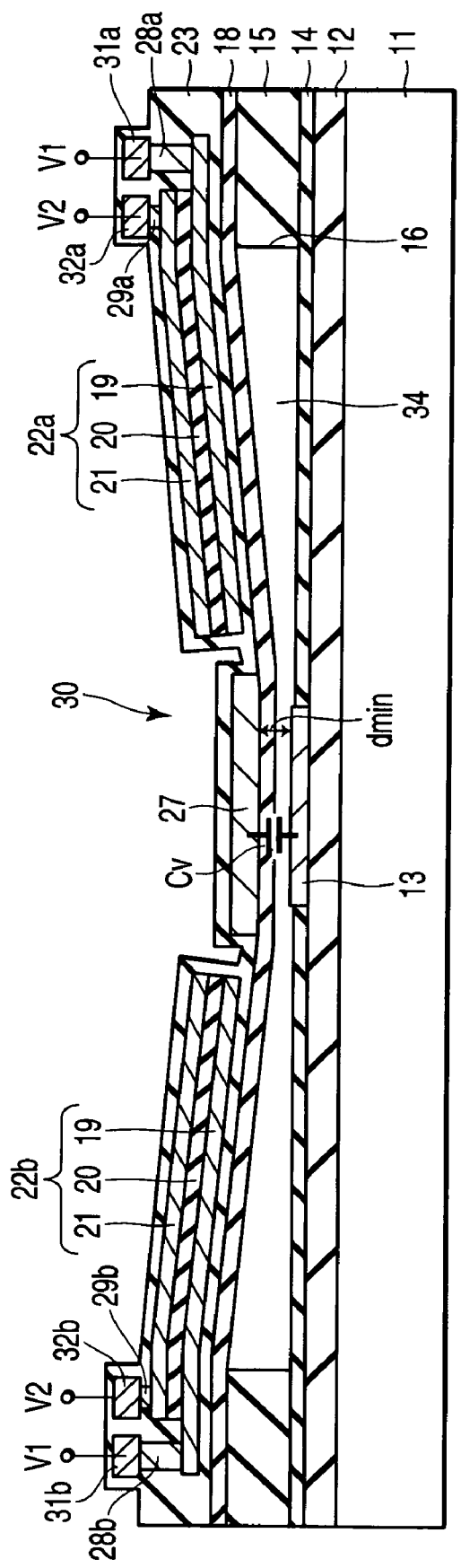
FIG. 5 is a sectional view showing the MEMS element when actuators shown in FIG. 2 move.
Figure 6:
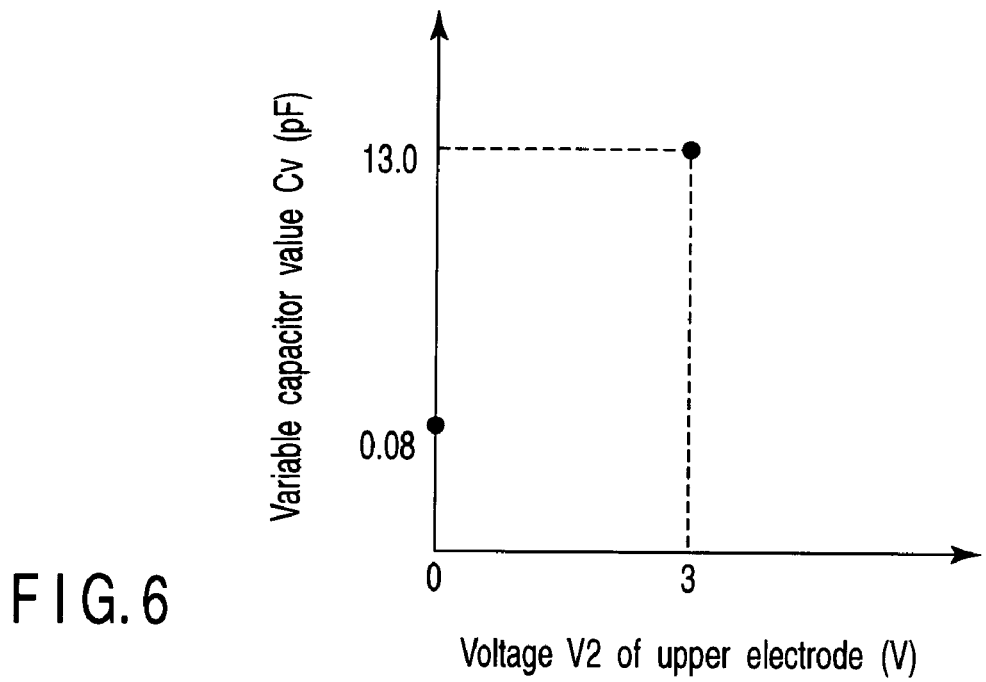
FIG. 6 is a graph showing a change in variable capacitance when the actuators according to the first embodiment of the present invention move.

FIG. 5 is a sectional view of the MEMS element when the actuators shown in FIG. 2 move. FIG. 6 is a graph showing a change in variable capacitance when the actuators according to the first embodiment of the present invention move. The MEMS element according to the first embodiment of the present invention functions as a variable capacitor in the following manner.

(Nonmoving State)

The nonmoving state of the actuators 22a and 22b will be described first with reference to FIG. 2.

When the voltages V1 and V2 of the lower electrodes 19 and upper electrodes 21 of the actuators 22a and 22b are, e.g., 0V, the actuators 22a and 22b do not move and remain in the state shown in FIG. 2. In the state shown in FIG. 2, the capacitance Cv of the variable capacitor 30 is minimized.

When a minimum capacitance Cvmin is obtained, the distance dmax between the first electrode layer 13 and the second electrode layer 27 is given by (deposition thickness T1 of first insulating film 14)+(distance X1 between first insulating film 14 and third insulating film 18 in region where first electrode layer 13 exists)+(deposition thickness T3 of third insulating film 18).

In the state shown in FIG. 2, the distance X1 between the first insulating film 14 and the third insulating film 18 in the region where the first electrode layer 13 exists is almost, e.g., (distance X2)−(thickness of first electrode layer 13). The distance X2 is the distance between the first insulating film 14 and the third insulating film 18 in the region where the first electrode layer 13 does not exist. In other words, the distance X2 equals the depth of the trench 16 in the region where the first electrode layer 13 does not exist or the deposition thickness T2 of the second insulating film 15.

More specifically, the distance X2 is, e.g., about 0.5 to 3.0 µm. The thickness of the first electrode layer 13 is, e.g., about 250 nm. The deposition thickness T1 of the first insulating film 14 is, e.g., about 10 nm to 1 µm, and for example, 200 nm. The deposition thickness T3 of the third insulating film 18 is, e.g., about 10 nm to 1 µm, and for example, 200 nm.

The deposition thicknesses T1 and T3 of the first insulating film 14 and third insulating film 18 may be almost the same. Alternatively, the deposition thickness T1 may be larger or smaller than the deposition thickness T3.

(Moving State)

The moving state of the actuators 22a and 22b will be described next with reference to FIG. 5.

The voltage V1 of the lower electrodes 19 of the actuators 22a and 22b is set to, e.g., the ground potential (0V). The voltage V2 of the upper electrodes 21 is increased from 0V to, e.g., 3V. At this time, the actuators 22a and 22b move and are set in the state shown in FIG. 5. More specifically, the piezoelectric layers 20 are distorted in the horizontal direction. The ends of the actuators 22a and 22b on the sides of the variable capacitor 30 move downward. Accordingly, the distance between the first electrode layer 13 and the second electrode layer 27 of the variable capacitor 30 shortens. When the actuators 22a and 22b move and are set in the state shown in FIG. 5 in which the first insulating film 14 and third insulating film 18 are in contact, the capacitance Cv of the variable capacitor 30 is maximized.

When a maximum capacitance Cvmax is obtained, the distance dmin between the first electrode layer 13 and the second electrode layer 27 is given by (deposition thickness T1 of first insulating film 14)+(deposition thickness T3 of third insulating film 18).

As described above, the actuators 22a and 22b are moved by adjusting the voltages V1 and V2 applied to the lower electrodes 19 and upper electrodes 21 of the actuators 22a and 22b. As a result, the distance between the first electrode layer 13 and the second electrode layer 27 changes. Accordingly, the capacitance Cv of the variable capacitor 30 can be changed. In other words, the capacitance Cv of the variable capacitor 30 can be changed by the values of the applied voltages V1 and V2 of the actuators 22a and 22b.

For example, as shown in FIG. 6, the voltage V1 of the lower electrodes 19 of the actuators 22a and 22b is set to ground potential (0V). The voltage V2 of the upper electrodes 21 is changed from 0V to 3V. At this time, the capacitance Cv of the variable capacitor 30 changes from 0.08 pF to 13.00 pF. In this case, the electrode size of the variable capacitor 30 is 100 µm, and the distance X1 between the first electrode layer 13 and second electrode layer 27 in the nonmoving state is 1 µm.

The ratio of the maximum capacitance Cvmax to the minimum capacitance Cvmin is preferably high. The capacitance ratio is preferably 20 or more in an annealing state at, e.g., about −45° C. to 125° C. When the variable capacitor 30 is changed in the above-described way, a capacitance ratio of, e.g., 150 or more can be ensured. The capacitance ratio of the variable capacitor 30 can freely be changed in accordance with the use form.

(4) Manufacturing Method

FIGS. 7 to 13 are sectional views showing steps in manufacturing the MEMS element according to the first embodiment of the present invention. The method of manufacturing the MEMS element according to the first embodiment will be described below.

Figure 7:
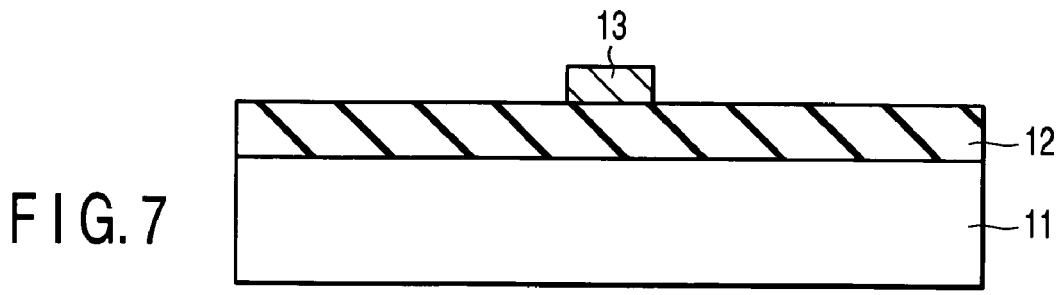
FIGS. 7 to 13 are sectional views showing steps in manufacturing the MEMS element according to the first embodiment of the present invention.

First, as shown in FIG. 7, the thermal oxide film 12 having a thickness of, e.g., about 1.3 µm is formed on the semiconductor substrate (e.g., a silicon substrate) 11 having a thickness of, e.g., about 750 µm. A conductive layer serving as the first electrode layer 13 is deposited on the thermal oxide film 12 and patterned. With this process, the first electrode layer 13 of the variable capacitor 30 is formed.

Figure 8:
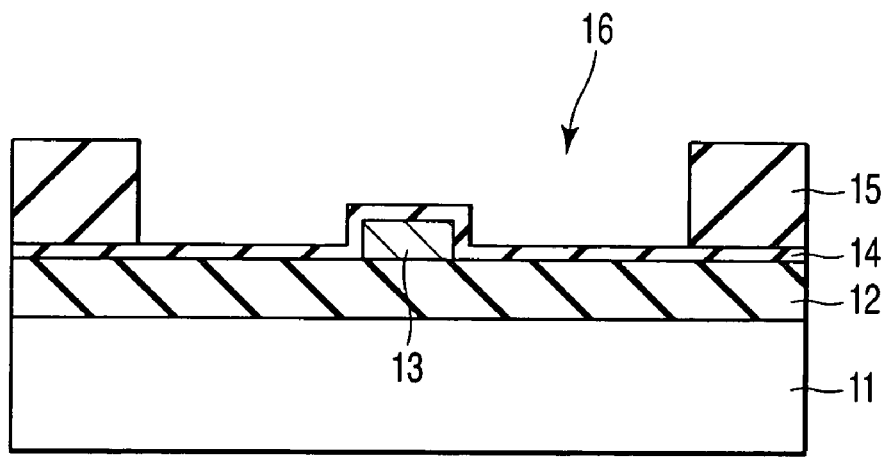

As shown in FIG. 8, the first insulating film 14 is deposited on the first electrode layer 13 and thermal oxide film 12. The second insulating film 15 is deposited on the first insulating film 14 and fabricated by, e.g., deep RIE (Reactive Ion Etching). With this process, the deep trench 16 which exposes part of the first insulating film 14 is formed.

Figure 9:
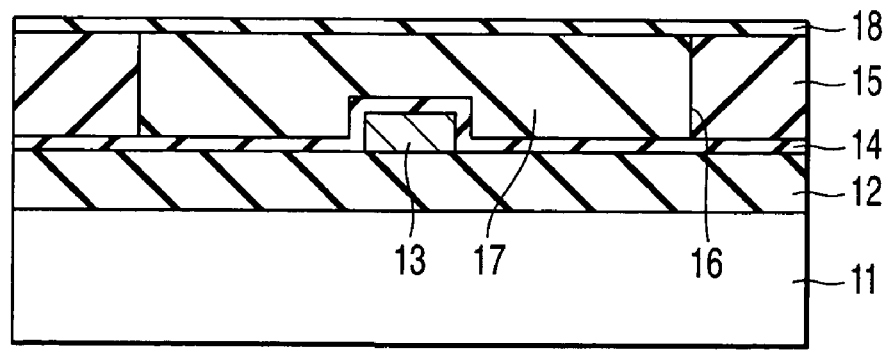

As shown in FIG. 9, the sacrificial layer 17 is deposited on the first insulating film 14 and second insulating film 15. Examples of the material of the sacrificial layer 17 are polysilicon, amorphous silicon, a resist, and an organic material. A material having a high etching selectivity with respect to the first insulating film 14, second insulating film 15, and third insulating film 18 is preferably used. After that, the sacrificial layer 17 is planarized by, e.g., CMP (Chemical Mechanical Polishing) or etch back until the second insulating film 15 is exposed. With this process, the trench 16 is filled with the sacrificial layer 17. Next, the third insulating film 18 is formed on the sacrificial layer 17 and second insulating film 15 by, e.g., CVD (Chemical Vapor Deposition).

Figure 10:
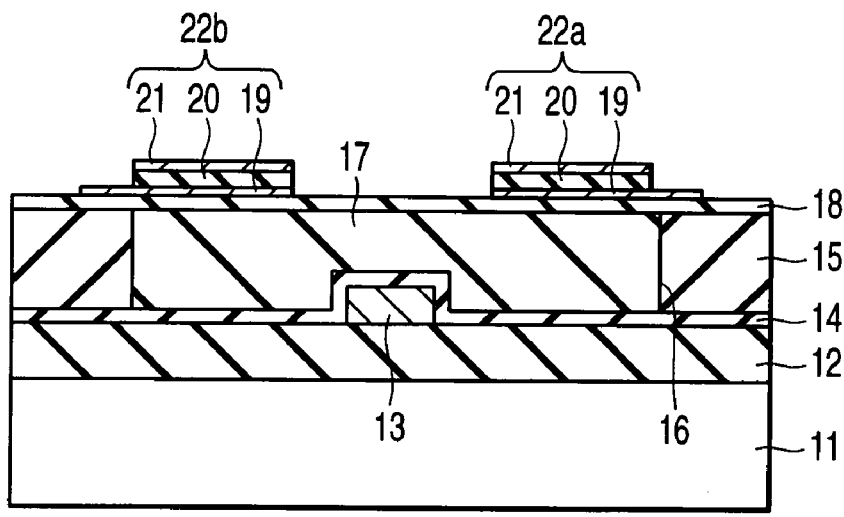

As shown in FIG. 10, the lower electrode 19, piezoelectric layer 20, and upper electrode 21 are deposited sequentially on the third insulating film 18 by, e.g., sputtering. The upper electrode 21 and piezoelectric layer 20 are patterned such that the lower electrode 19 is partially exposed. In addition, the upper electrode 21, piezoelectric layer 20, and lower electrode 19 are patterned. In this way, the piezoelectric actuators 22a and 22b each including the lower electrode 19, piezoelectric layer 20, and upper electrode 21 are formed.

Figure 11:
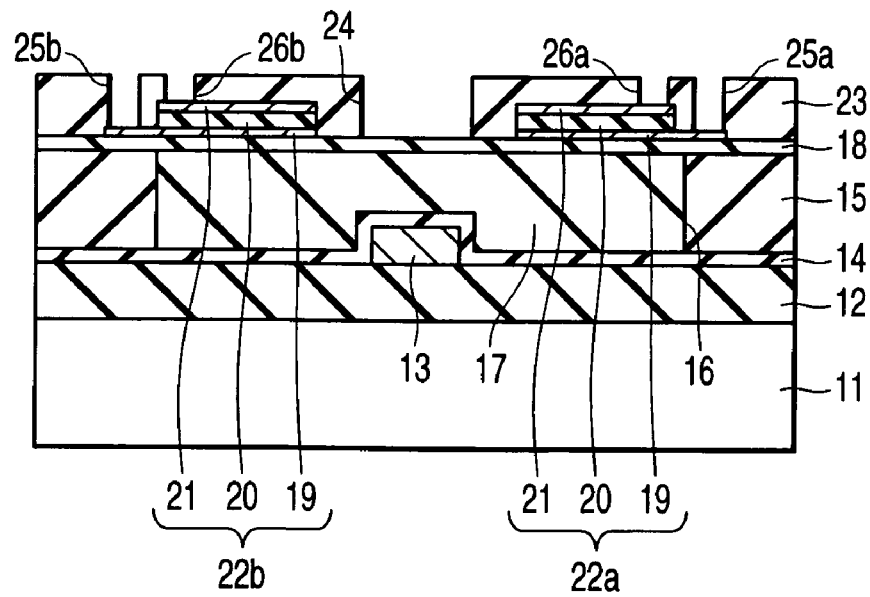

As shown in FIG. 11, the fourth insulating film 23 is deposited on the actuators 22a and 22b and third insulating film 18. An interconnection trench 24 and first to fourth contact holes 25a, 25b, 26a, and 26b are formed in the fourth insulating film 23. The interconnection trench 24 exposes part of the third insulating film 18. The first and second contact holes 25a and 25b expose part of the lower electrodes 19. The third and fourth contact holes 26a and 26b expose part of the upper electrodes 21.

Figure 12:
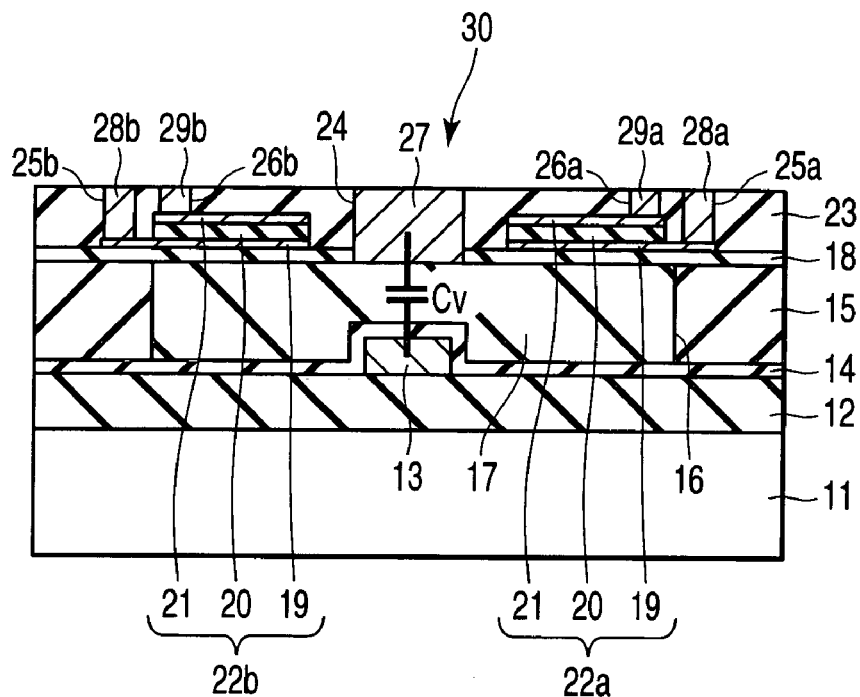

As shown in FIG. 12, the interconnection trench 24 and first to fourth contact holes 25a, 25b, 26a, and 26b are filled with a conductive material so that the second electrode layer 27 and the first to fourth contacts 28a, 28b, 29a, and 29b are formed.

Figure 13:
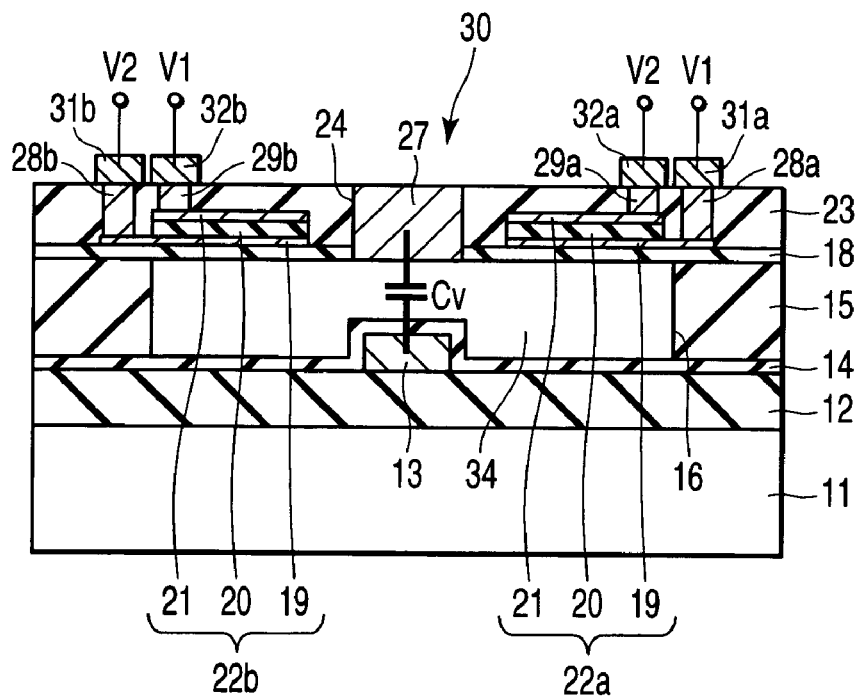

As shown in FIG. 13, the interconnection layers 31a, 31b, 32a, and 32b connected to the contacts 28a, 28b, 29a, and 29b are formed. Next, an opening portion (opening portion 33 in FIG. 3) which exposes part of the sacrificial layer 17 is formed. The sacrificial layer 17 is removed through this opening portion to form the cavity 34. Removal of the sacrificial layer 17 can be done by either dry etching or wet etching as far as it is isotropic etching, and for example, by CDE (Chemical Dry Etching). In the above-described way, the piezoelectric MEMS element is formed.

The above-described method is merely an example of the method of manufacturing the MEMS element according to the first embodiment. The present invention is not limited to this, and various changes and modifications can be done.

In the steps shown in FIGS. 8 and 9, after the trench 16 is formed in the insulating film 15, the sacrificial layer 17 is buried in the trench 16. However, the present invention is not limited to this. For example, the sacrificial layer 17 may be deposited on the insulating film 14 and patterned first. Then, the insulating film 15 may be buried around the sacrificial layer 17.

The actuators 22a and 22b need not always be formed directly on the third insulating film 18. An insulating layer may be formed on the third insulating film 18, as shown in FIG. 2.

In the steps shown in FIGS. 11 and 12, after the interconnection trench 24 is formed in the insulating film 23, the interconnection trench 24 is filled with a conductive material to form the second electrode layer 27 of the variable capacitor 30. However, the present invention is not limited to this. For example, a conductive material may be deposited on the third insulating film 18 and patterned first. Then, the insulating film 23 may be buried around the conductive material to form the second electrode layer 27 of the variable capacitor 30. When this method is employed, the second electrode layer 27 has, e.g., the structure shown in FIG. 2.

In the steps shown in FIGS. 11 and 12, the second electrode layer 27 and the contacts 28a, 28b, 29a, and 29b of the variable capacitor 30 are formed simultaneously by using the same material. However, they can also be formed in different steps by using different materials, as a matter of course.

As described above, according to the first embodiment, in the actuators 22a and 22b using the piezoelectric layers 20, the piezoelectric layers 20 are almost flat. For this reason, even when the voltages V1 and V2 are applied to the lower electrodes 19 and upper electrodes 21, the piezoelectric layers 20 can be prevented from stretching nonuniformly or causing a decrease in horizontal stretch amount. In addition, when the actuators 22a and 22b move, any crack generation at the step portions of the piezoelectric layers 20 can be suppressed. Hence, the yield can be increased. As a result, the reliability of the MEMS element can be increased.

[1-2] Second Embodiment

A second embodiment is a modification to the first embodiment. A MOS transistor (e.g., a CMOS transistor) is formed on the same substrate as that of a variable capacitor. Such an embedded structure of a MEMS element and a MOS transistor is used in, e.g., a low-noise amplifier.

(1) Structure

Figure 14:
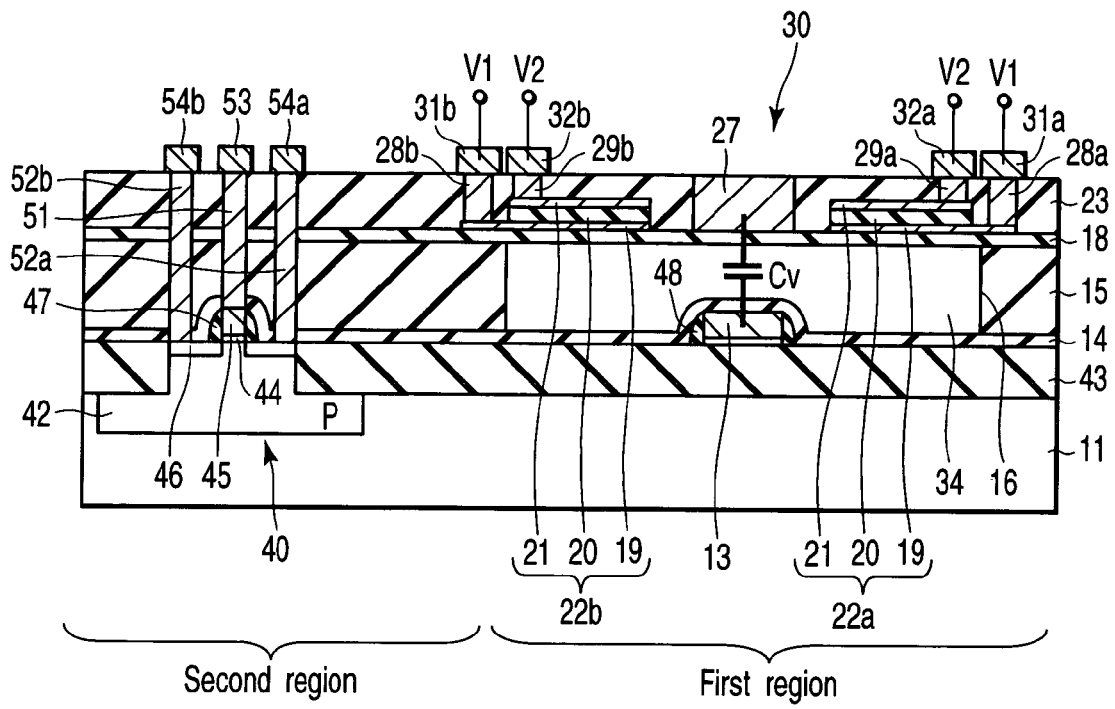
FIG. 14 is a sectional view showing a semiconductor device according to a second embodiment of the present invention.

FIG. 14 is a sectional view of a semiconductor device according to the second embodiment of the present invention. The semiconductor device according to the second embodiment will be described below.

As shown in FIG. 14, the second embodiment is mainly different from the first embodiment in that a MOS transistor 40 is formed on a semiconductor substrate (e.g., a silicon substrate) 11 on which a first electrode layer 13 of a variable capacitor 30 is formed. This structure will be described below in detail.

An element isolation region 43 having an STI (Shallow Trench Isolation) structure having a depth of, e.g., 500 nm is formed in the semiconductor substrate 11. There exist a first region where the MEMS element functioning as the variable capacitor 30 is formed and a second region where the MOS transistor 40 is formed.

In the second region, a P-well 42 is formed in the surface of the semiconductor substrate 11. A gate insulating film 44 is formed on the P-well 42, and a gate electrode 45 is formed on the gate insulating film 44. The gate length of the gate electrode 45 is, e.g., about 0.6 µm or less. Source and drain diffusion layers 46 are formed in the P-well 42 on both sides of the gate electrode 45. A sidewall layer 47 is formed on the side surface of the gate electrode 45.

On the other hand, in the first region, the first electrode layer 13 of the variable capacitor 30 is formed on the element isolation region 43. A sidewall layer 48 is formed on the side surfaces of the first electrode layer 13. Since the element isolation region 43 made of, e.g., an oxide film is present under the first electrode layer 13, no film corresponding to the gate insulating film 44 is formed under the first electrode layer 13. However, an insulating film can also be formed between the first electrode layer 13 and the element isolation region 43.

In the embedded structure of the MEMS element and MOS transistor, the first electrode layer 13 of the variable capacitor 30 and the gate electrode 45 of the MOS transistor 40 can be made of the same material.

(2) Manufacturing Method

Figure 15:
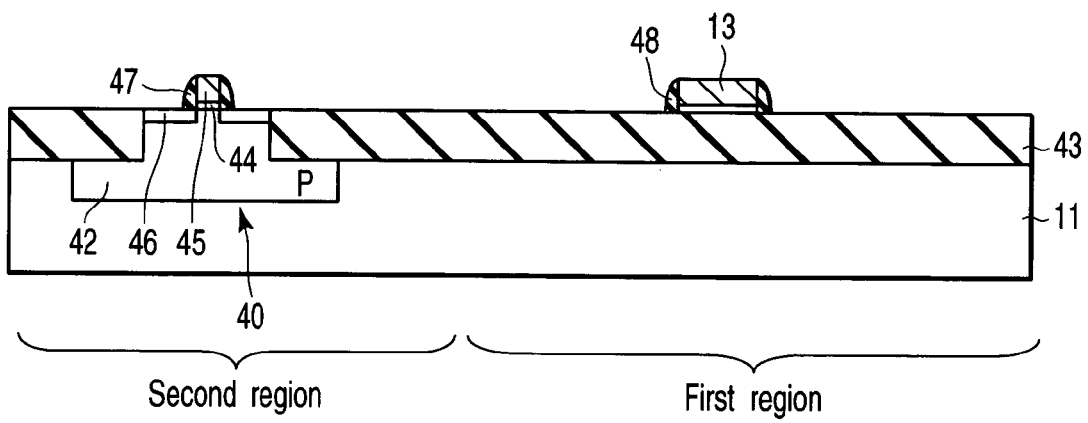
FIGS. 15 to 17 are sectional views showing steps in manufacturing the semiconductor device according to the second embodiment of the present invention.
Figure 16:
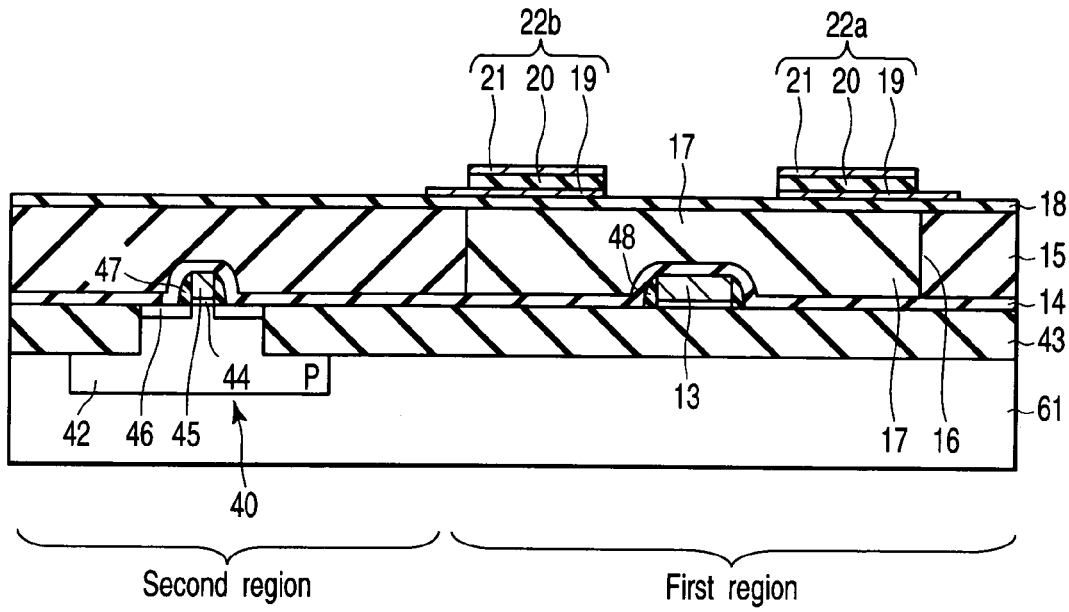
Figure 17:
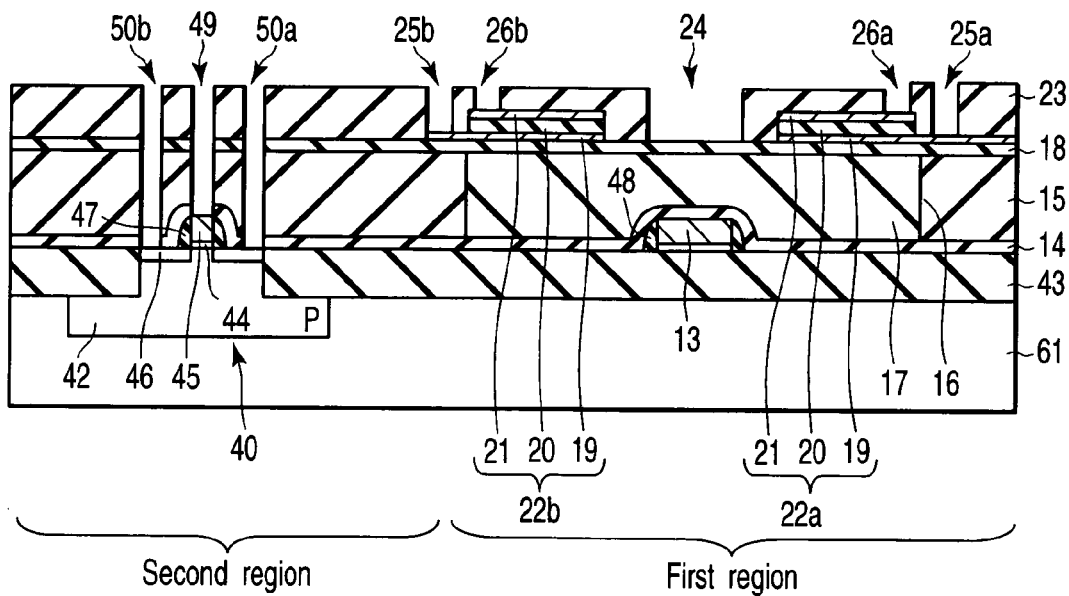

FIGS. 15 to 17 are sectional views showing steps in manufacturing the semiconductor device according to the second embodiment of the present invention. The method of manufacturing the semiconductor device according to the second embodiment will be described below.

First, as shown in FIG. 15, the P-well 42 is formed in the surface of the semiconductor substrate (e.g., a silicon substrate) 11 in the second region. The element isolation region 43 having an STI structure made of, e.g., an oxide film is formed in the semiconductor substrate 11. To ensure a region to form the MOS transistor 40, the element isolation region 43 is not present at part of the second region.

The first electrode layer 13 of the variable capacitor 30 is formed on the semiconductor substrate 11 in the first region. The gate insulating film 44 is formed on the semiconductor substrate 11 in the second region, and then, the gate electrode 45 is formed on the gate insulating film 44. The first electrode layer 13 and the gate electrode 45 can be formed either simultaneously by using the same material or separately by using different materials.

In the second region, the source and drain diffusion layers 46 are formed in the semiconductor substrate 11 on both sides of the gate electrode 45. The sidewall layer 47 is formed on the side surface of the gate electrode 45. The sidewall layer 48 is formed on the side surface of the first electrode layer 13. The sidewall layer 48 made of the same material as the sidewall layer 47 may be formed on the side surface of the first electrode layer 13. Formation of the sidewall layer 48 may be omitted. In the above-described way, the MOS transistor 40 is formed on the semiconductor substrate 11 in the second region.

As shown in FIG. 16, a first insulating film 14 and a second insulating film 15 are deposited. A trench 16 is formed in the second insulating film 15 in the first region. A sacrificial layer 17 is formed in the trench 16. A third insulating film 18 is formed on the sacrificial layer 17 and second insulating film 15. Actuators 22a and 22b each including a lower electrode 19, piezoelectric layer 20, and upper electrode 21 are formed on the third insulating film 18 in the first region.

As shown in FIG. 17, a fourth insulating film 23 is deposited on the actuators 22a and 22b and third insulating film 18. An interconnection trench 24 and first to seventh contact holes 25a, 25b, 26a, 26b, 49, 50a, and 50b are formed. The interconnection trench 24 exposes part of the third insulating film 18. The first and second contact holes 25a and 25b expose part of the lower electrodes 19. The third and fourth contact holes 26a and 26b expose part of the upper electrodes 21. The fifth contact hole 49 exposes the gate electrode 45.

The sixth and seventh contact holes 50a and 50b expose the source and drain diffusion layers 46.

As shown in FIG. 14, the interconnection trench 24 and the first to seventh contact holes 25a, 25b, 26a, 26b, 49, 50a, and 50b are filled with a conductive material. With this process, a second electrode layer 27 of the variable capacitor 30 and first to seventh contacts 28a, 28b, 29a, 29b, 51, 52a, and 52b are formed. In addition, interconnection layers 31a, 31b, 32a, 32b, 53, 54a, and 54b connected to the contacts 28a, 28b, 29a, 29b, 51, 52a, and 52b are formed. After that, an opening portion (corresponding to the opening portion 33 in FIG. 3) which exposes part of the sacrificial layer 17 is formed. The sacrificial layer 17 is removed through this opening portion to form a cavity 34 in the first region. In the above-described way, a semiconductor device in which a piezoelectric MEMS element and a MOS transistor are embedded is formed.

As described above, according to the second embodiment, the same effect as that of the first embodiment can be obtained. In addition, the MOS transistor 40 and variable capacitor 30 can be formed on the same substrate. Since the first electrode layer 13 of the variable capacitor 30 and the gate electrode 45 of the MOS transistor 40 can be formed simultaneously by using the same material, the manufacturing process can be simplified.

[1-3] Third Embodiment

A third embodiment is a modification to the second embodiment. An N-well which surrounds a P-well is formed in a MOS transistor formation region.

Figure 18:
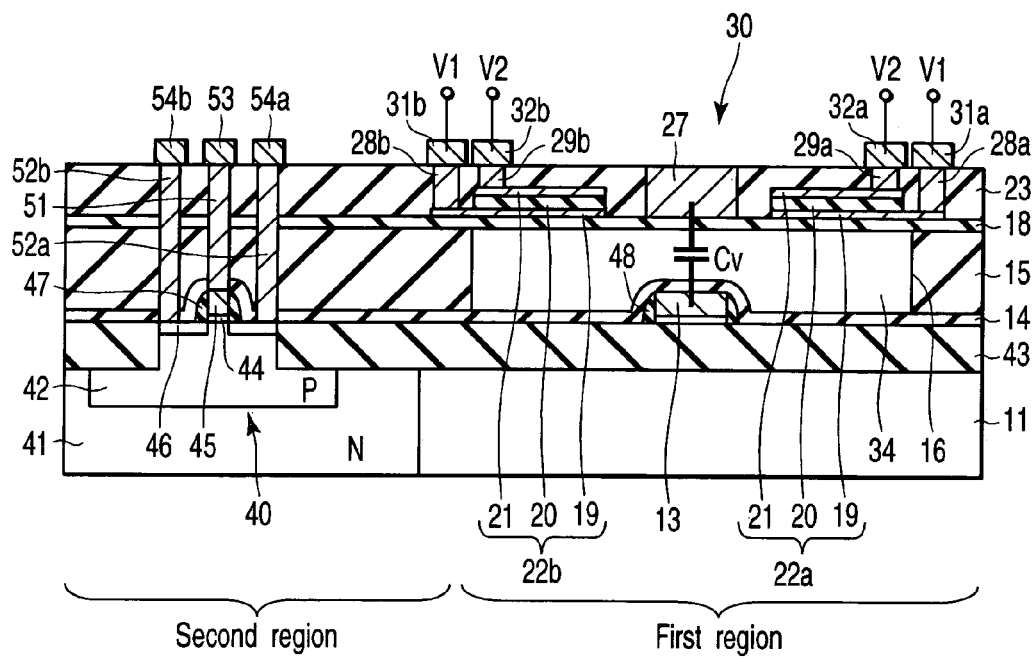
FIG. 18 is a sectional view showing a semiconductor device according to a third embodiment of the present invention.

FIG. 18 is a sectional view of a semiconductor device according to the third embodiment of the present invention. The semiconductor device according to the third embodiment will be described below.

As shown in FIG. 18, the third embodiment is different from the second embodiment in that an N-well 41 having a conductivity type different from that of a P-well 42 is formed at a position deeper than the P-well 42 in the second region, and the N-well 41 surrounds the P-well 42.

As described above, according to the third embodiment, the same effect as that of the second embodiment can be obtained. In addition, since the P-well 42 is surrounded by the N-well 41, substrate noise generated by the operation of a MOS transistor 40 can be suppressed from entering a variable capacitor 30.

[1-4] Fourth Embodiment

A fourth embodiment is a modification to the second embodiment. The lower electrode of a variable capacitor also functions as the gate electrode of a MOS transistor.

Figure 19:
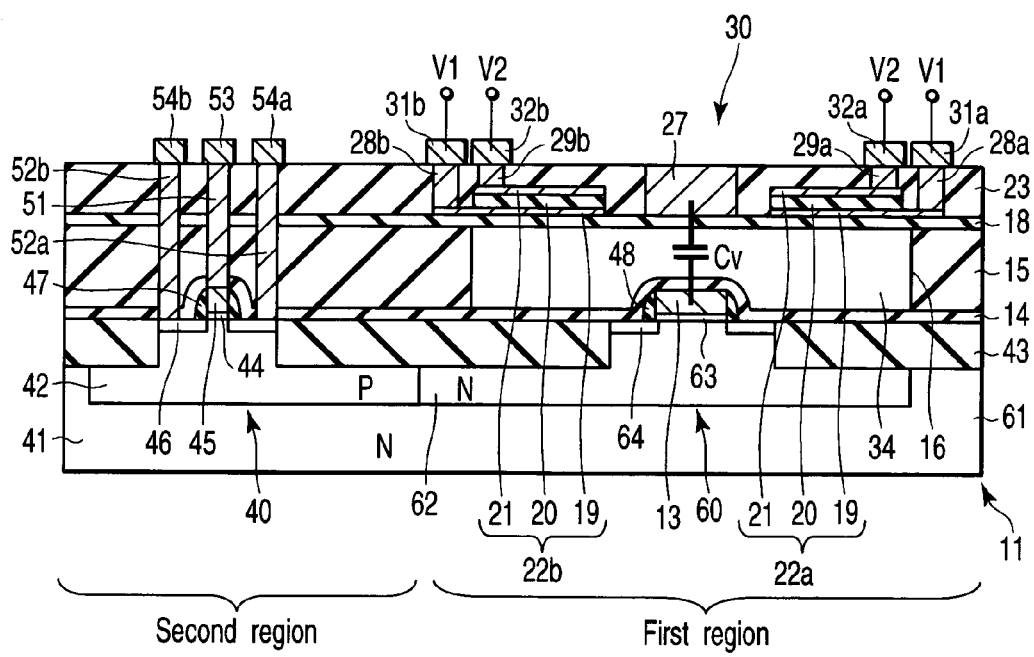
FIG. 19 is a sectional view showing a semiconductor device according to a fourth embodiment of the present invention.

FIG. 19 is a sectional view of a semiconductor device according to the fourth embodiment of the present invention. The semiconductor device according to the fourth embodiment will be described below.

As shown in FIG. 19, the fourth embodiment is different from the second embodiment in that a first electrode layer 13 of a variable capacitor 30 has the same structure as that of a MOS transistor 40 and also functions as the gate electrode of a MOS transistor 60. This structure will be described below in detail.

An N-well 62 is formed in a semiconductor substrate 11 in a first region. A P-well 42 is formed in the semiconductor substrate 11 in a second region. An N-well 61 is formed in the semiconductor substrate 11 at a position deeper than the N-well 62 and P-well 42.

A gate insulating film 63 is formed on the N-well 62, and the first electrode layer 13 of the variable capacitor 30, which functions as a gate electrode, is formed on the gate insulating film 63. Source and drain diffusion layers 64 are formed in the N-well 62 on both sides of the first electrode layer 13. A sidewall layer 48 is formed on the side surface of the first electrode layer 13.

In the fourth embodiment, when actuators 22a and 22b move, and a second electrode layer 27 of the variable capacitor 30 approaches the first electrode layer 13, the conductivity type of the N-well 62 under the first electrode layer 13 is inverted so that a current flows between the source and drain diffusion layers 64. That is, the first electrode layer 13 functions as a gate electrode.

As described above, according to the fourth embodiment, the same effect as that of the second embodiment can be obtained. In addition, the following effect can also be obtained.

In the fourth embodiment, the first electrode layer 13 of the variable capacitor 30 functions as the gate electrode of the MOS transistor 60. For this reason, even when the gate insulating film 63 of the MOS transistor 60 is thin, and the breakdown voltage of the gate insulating film 63 is low, the effective capacitance decreases because a capacitance Cv corresponding to the variable capacitor 30 is connected in series with the gate electrode (first electrode layer 13). This state is equivalent to a structure having a thick gate insulating film 63. Hence, the breakdown voltage of the gate insulating film 63 increases. The MOS transistor 60 functions as a high-voltage element and can therefore process a high-voltage signal which cannot be processed by the MOS transistor 40 formed on the same substrate.

[1-5] Fifth Embodiment

In a fifth embodiment, the second embodiment is applied to a VCO (Voltage Controlled Oscillator) circuit.

Figure 20:
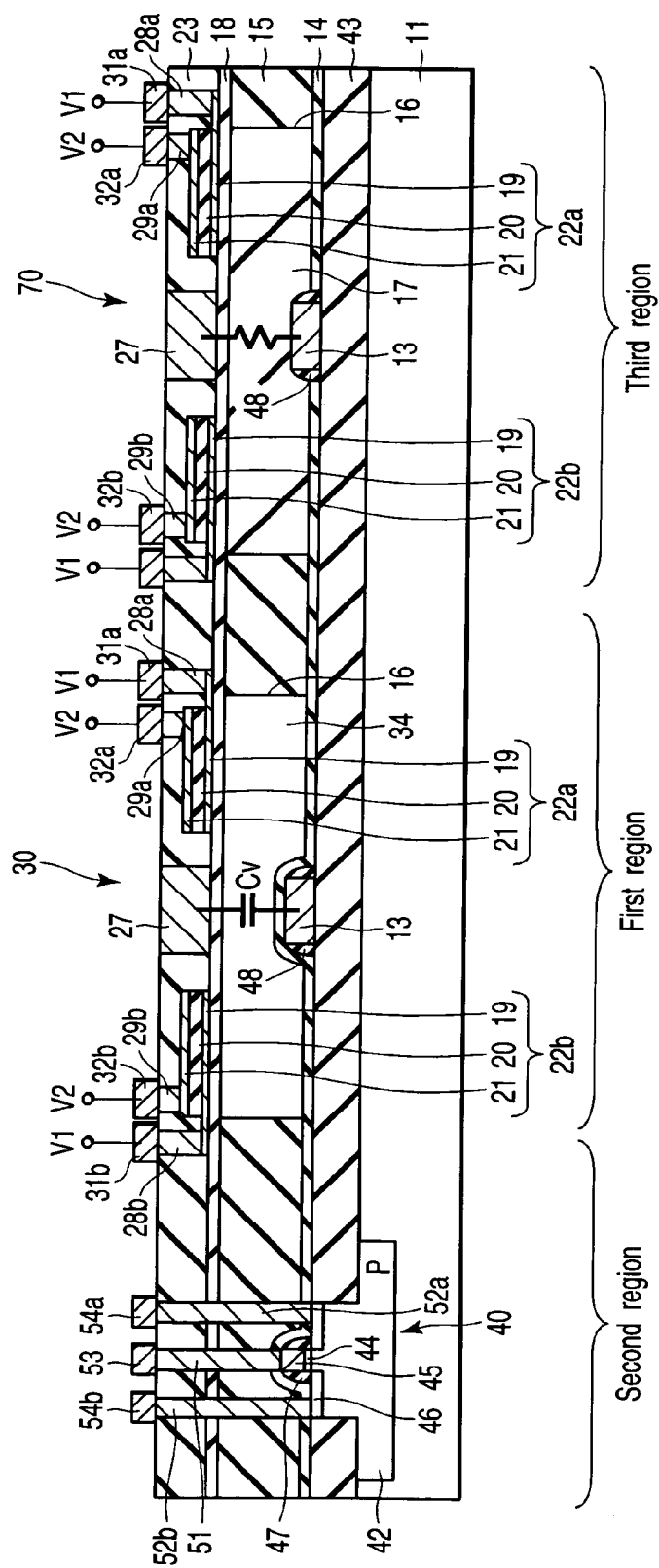
FIG. 20 is a sectional view showing a semiconductor device according to a fifth embodiment of the present invention.
Figure 21:
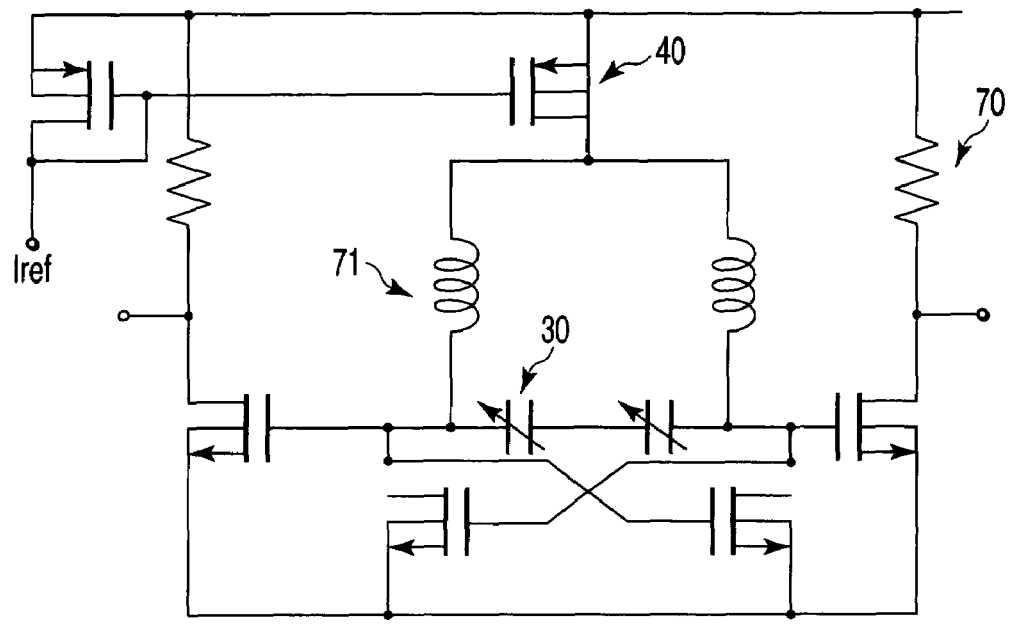
FIG. 21 is a circuit diagram showing a VCO circuit according to the fifth embodiment of the present invention.

FIG. 20 is a sectional view of a semiconductor device according to the fifth embodiment of the present invention. FIG. 21 is a circuit diagram of a VCO circuit according to the fifth embodiment of the present invention. The semiconductor device according to the fifth embodiment will be described below.

As shown in FIG. 20, in the fifth embodiment, a variable capacitor 30, MOS transistor 40, and resistor 70 which are present in the VCO circuit shown in FIG. 21 are formed on the same substrate. More specifically, the variable capacitor 30 is formed in a first region, the MOS transistor 40 is formed in a second region, and the resistor 70 is formed in a third region on a single semiconductor substrate 11.

The first and third regions have almost the same structure. In the first region, a cavity 34 is formed such that actuators 22a and 22b can move. In the third region, a sacrificial layer 17 remains. The resistor 70 in the third region functions as a resistive element because the sacrificial layer 17 made of an insulating material is present between a first electrode layer 13 and a second electrode layer 27.

As described above, according to the fifth embodiment, the same effect as that of the second embodiment can be obtained. In addition, the variable capacitor 30, MOS transistor 40, and resistor 70 included in a VCO circuit can be formed on the same substrate.

[1-6] Sixth Embodiment

In an application such as a high-frequency (RF) circuit or antenna, the parasitic component (e.g., a parasitic resistance, parasitic capacitance, and parasitic inductance except a capacitance necessary in a design) needs to be small, i.e., a component having a high Q value (quality factor) is necessary. An electronic device which requires such an application is mainly used for a mobile device (e.g., a cellular phone or PDA) and must have low power consumption.

In the sixth embodiment, a variable capacitor of a MEMS element is used in an apparatus which transmits/receives a signal of such an application.

Figure 22:
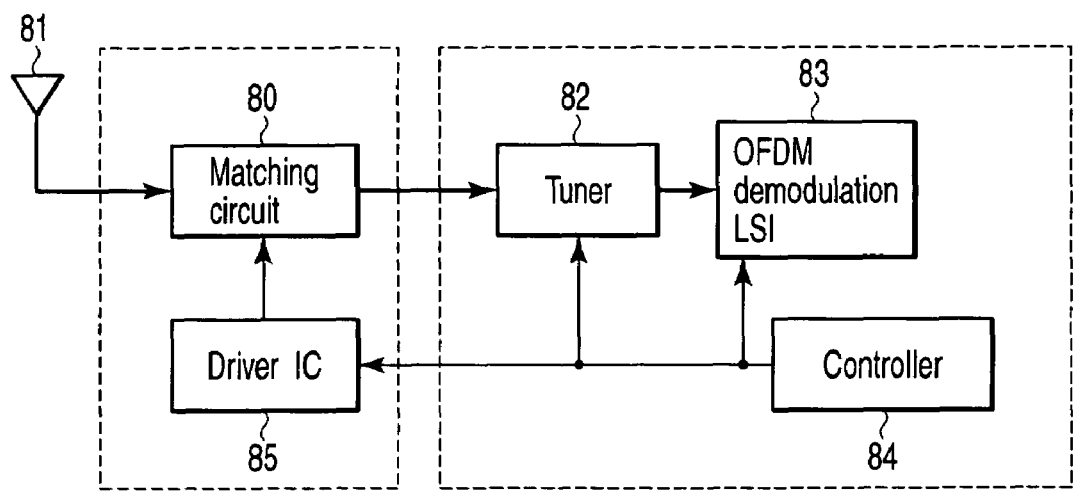
FIG. 22 is a block diagram showing a transmitting/receiving apparatus according to a sixth embodiment of the present invention.
Figure 23:
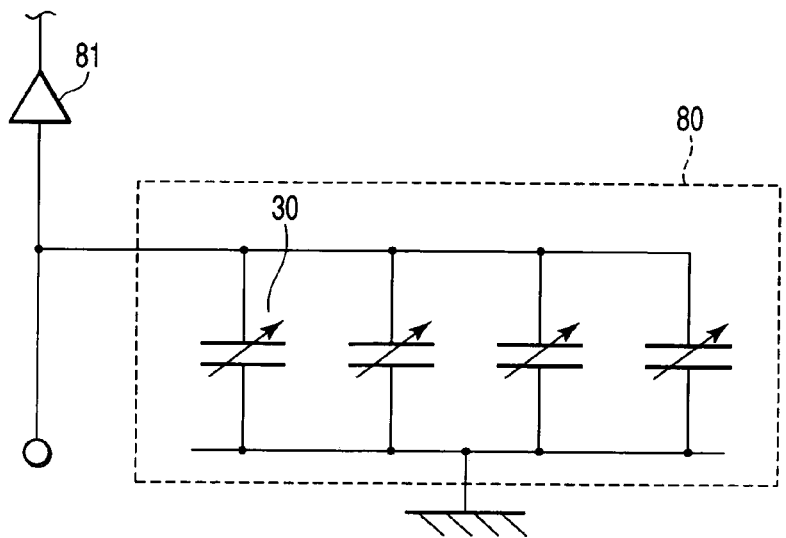
FIG. 23 is a circuit diagram showing the matching circuit of the transmitting/receiving apparatus according to the sixth embodiment of the present invention.
Figure 24:
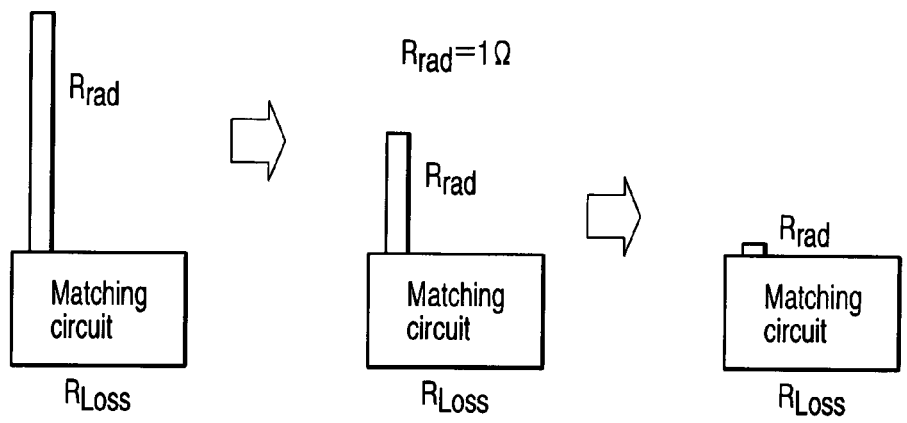
FIG. 24 is an explanatory view of the parasitic resistance of a variable capacitor according to the sixth embodiment of the present invention.

FIG. 22 is a block diagram of a transmitting/receiving apparatus according to the sixth embodiment of the present invention. FIG. 23 is a circuit diagram of the matching circuit of the transmitting/receiving apparatus according to the sixth embodiment of the present invention. FIG. 24 is an explanatory view of the parasitic resistance of the variable capacitor according to the sixth embodiment of the present invention. The transmitting/receiving apparatus according to the sixth embodiment will be described below.

As shown in FIG. 22, the transmitting/receiving apparatus according to the sixth embodiment includes a matching circuit 80, antenna 81 for, e.g., a mobile TV, tuner 82, OFDM (Orthogonal Frequency Division Multiplex) demodulation LSI 83, controller 84, and driver IC 85.

As shown in FIG. 23, the matching circuit 80 includes a plurality of variable capacitors 30 of MEMS elements. The plurality of variable capacitors 30 are connected in parallel. One terminal of each variable capacitor 30 is connected to the antenna 81. The other terminal of each variable capacitor 30 is connected to ground. The matching circuit 80 is preferably arranged at a position closer to the tuner 82 than the tip of the antenna 81.

The driver IC 85 includes, e.g., a MOS transistor. The driver IC 85 can be formed on the same substrate as that of the variable capacitors 30 included in the matching circuit 80. For example, the variable capacitors 30 included in the matching circuit 80 can be formed in the first region in the second embodiment or the like, and a MOS transistor 40 included in the driver IC 85 can be formed in the second region.

A MOS transistor included in the tuner 82, a MOS transistor included in the OFDM demodulation LSI 83, and a MOS transistor included in the controller 84 can also be formed on the same substrate as the variable capacitors 30 included in the matching circuit 80.

In this transmitting/receiving apparatus, the variable capacitors 30 of the matching circuit 80 are changed by the driver IC 85 to receive a signal from the antenna 81. The signal received by the matching circuit 80 is tuned by the tuner 82 and demodulated by the OFDM demodulation LSI 83. The driver IC 85, tuner 82, and OFDM demodulation LSI 83 are controlled by the controller 84.

As described above, according to the sixth embodiment, the same effect as that of the first embodiment can be obtained. In addition, the following effect can also be obtained.

When the matching circuit 80 uses, e.g., a GaAs switch or PIN diode, resistance Rrad of the antenna 81 is about 5Ω. For this reason, the loss of signal is large, and the efficiently is low.

In the sixth embodiment, since the matching circuit 80 uses the variable capacitors 30 formed from MEMS elements, the parasitic resistance Rrad of the variable capacitors 30 can be reduced to about 1Ω. Since a signal of a high-frequency circuit or antenna can be transmitted/received while suppressing the loss, the efficiency can be increased to 40% or more. In addition, since the parasitic resistance Rrad of the variable capacitors 30 can be reduced, the length of the antenna 81 itself can be shortened (FIG. 24).

[1-7] Seventh Embodiment

In a seventh embodiment, the first embodiment is applied to a filter circuit.

Figure 25:
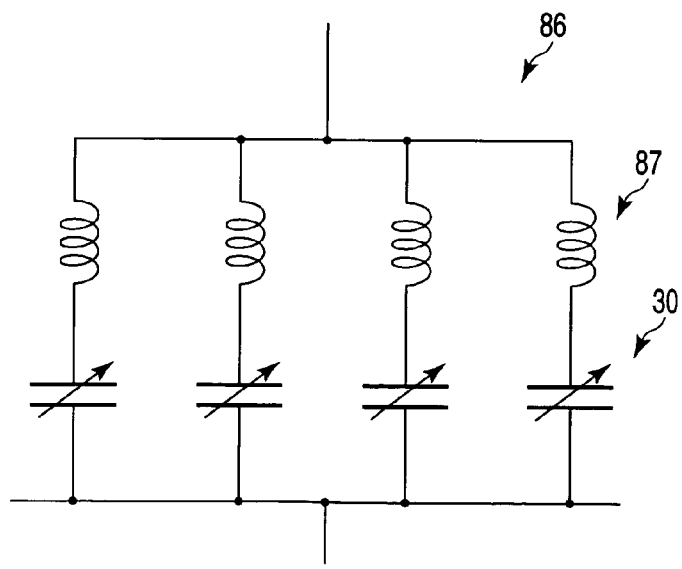
FIG. 25 is a circuit diagram showing a filter circuit according to a seventh embodiment of the present invention.

FIG. 25 is a circuit diagram of a filter circuit according to the seventh embodiment of the present invention. The filter circuit according to the seventh embodiment will be described below.

As shown in FIG. 25, in the seventh embodiment, a filter circuit 86 is formed by using variable capacitors 30 according to the first embodiment. In the filter circuit 86, each variable capacitor 30 is connected in series with an inductor 87 to form a unit, and the units are connected in parallel.

The filter circuit 86 functions as a filter by changing the variable capacitors 30 to pass only a desired signal.

That is, a signal having a high frequency (high-frequency signal) does not pass through the filter circuit 86 because of the inductance component. For this reason, the filter circuit 86 basically functions as a low-pass filter which passes a signal having a low frequency (low-frequency signal). However, passage of a low-frequency signal can also be inhibited by changing the capacitance of the variable capacitors 30. More specifically, when the capacitance of the variable capacitors 30 is decreased, passage of a low-frequency signal can be inhibited. Only when the capacitance of the variable capacitors 30 is increased, the filter can pass only a signal having a certain frequency. As described above, passage of only a signal having a desired frequency is permitted by changing the capacitance of the variable capacitors 30.

In the filter circuit 86, the parallelly connected inductors 87 can have either the same or different inductances.

As described above, according to the seventh embodiment, the same effect as that of the first embodiment can be obtained. In addition, since a MEMS element has a low resistance, signal attenuation can be suppressed by forming the filter circuit 86 by using the variable capacitors 30 formed from MEMS elements.

[1-8] Eighth Embodiment

An eighth embodiment is a modification to the first embodiment. Two first electrode layers (upper electrode layers) are formed in a variable capacitor, and the second electrode layer (lower electrode layer) of the variable capacitor is set in a floating state.

Figure 26:
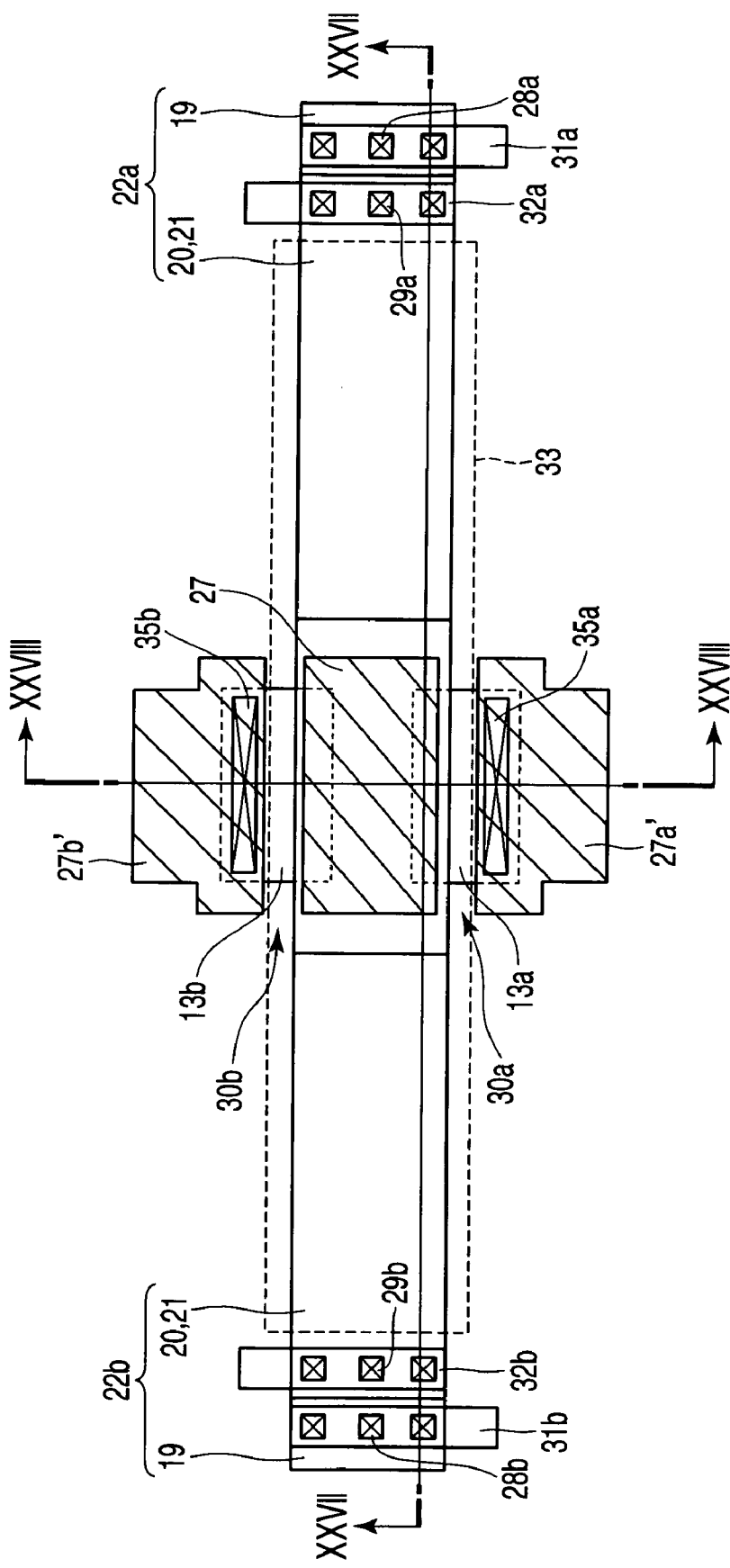
FIG. 26 is a plan view showing a MEMS element according to an eighth embodiment of the present invention.
Figure 27:
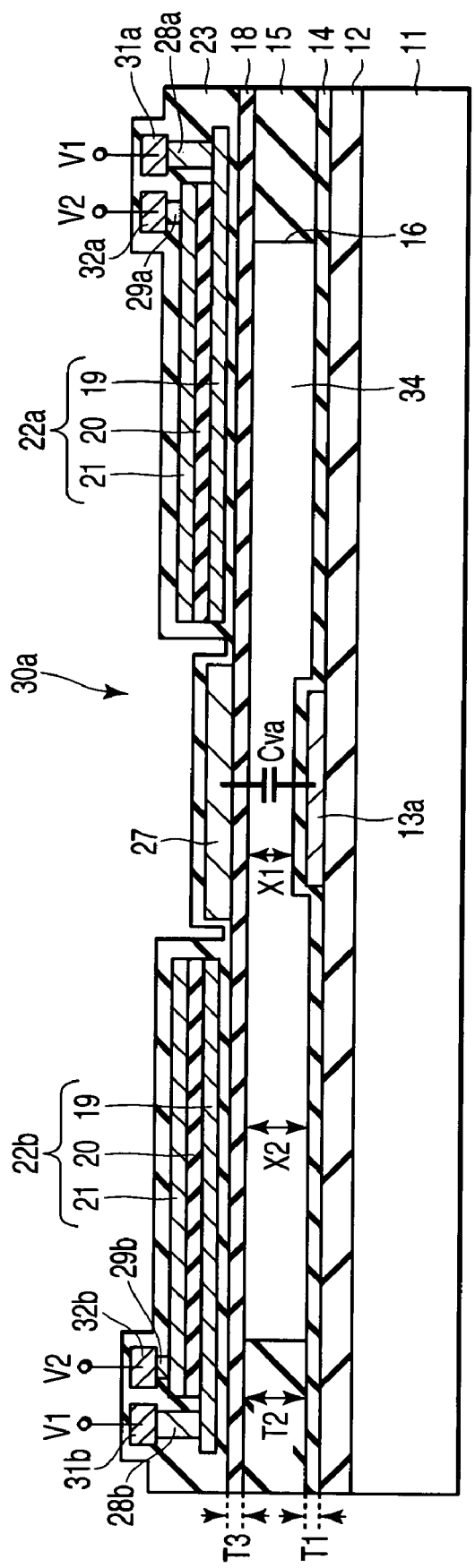
FIG. 27 is a sectional view showing the MEMS element taken along a line XXVII-XXVII in FIG. 26.
Figure 28:
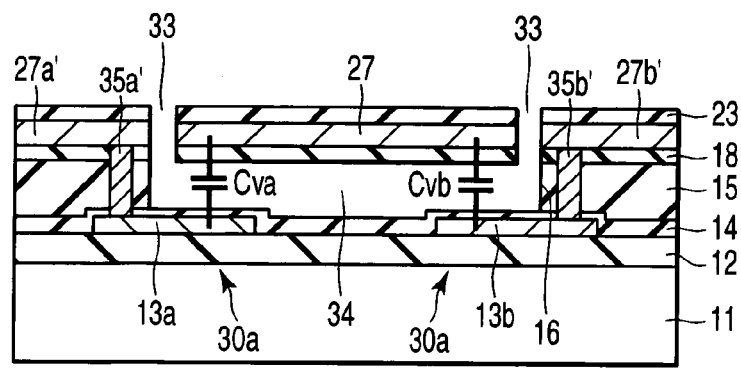
FIG. 28 is a sectional view showing the MEMS element taken along a line XXVIII-XXVIII in FIG. 26.

FIG. 26 is a plan view of a MEMS element according to the eighth embodiment of the present invention. FIG. 27 is a sectional view of the MEMS element taken along a line XXVII-XXVII in FIG. 26. FIG. 28 is a sectional view of the MEMS element taken along a line XXVIII-XXVIII in FIG. 26. The MEMS element according to the eighth embodiment will be described below.

As shown in FIGS. 26 to 28, the eighth embodiment is different from the first embodiment in that a first electrode layer functioning as the lower electrode of a variable capacitor 30 is separated into two first electrode layers 13a and 13b, and a second electrode layer 27 functioning as the upper electrode of the variable capacitor 30 is in a floating state.

In this case, a variable capacitor 30a (capacitance Cva) includes the first electrode layer 13a and second electrode layer 27. A variable capacitor 30b (capacitance Cvb) includes the first electrode layer 13b and second electrode layer 27. The variable capacitors 30a and 30b are connected in series. For this reason, a variable capacitance Cv of the entire MEMS element is given by $$1/Cv = 1/Cva + 1/Cvb \quad (1)$$

A semiconductor substrate 11 is preferably connected to ground. One of the first electrode layers 13a and 13b is preferably connected to ground. The resistivity of the semiconductor substrate 11 is preferably 500Ω·cm or more.

As described above, according to the eighth embodiment, the same effect as that of the first embodiment can be obtained. In addition, the following effect can also be obtained.

In the eighth embodiment, the first electrode layers 13a and 13b functioning as the lower electrode of the variable capacitor 30 are separately formed. The second electrode layer 27 functioning as the upper electrode of the variable capacitor 30 is in the floating state. For this reason, since a signal can be supplied between the first electrode layers 13a and 13b, the parasitic resistance can be reduced. The first electrode layers 13a and 13b can be formed independently of actuators 22a and 22b. Hence, even when only the first electrode layers 13a and 13b are formed thick to reduce the parasitic resistance, any influence on the variable capacitor 30 can be prevented.

[1-9] Ninth Embodiment

A ninth embodiment is a modification to the first embodiment. The upper electrode of a variable capacitor and the lower electrode of an actuator are formed from a common structure.

Figure 29:
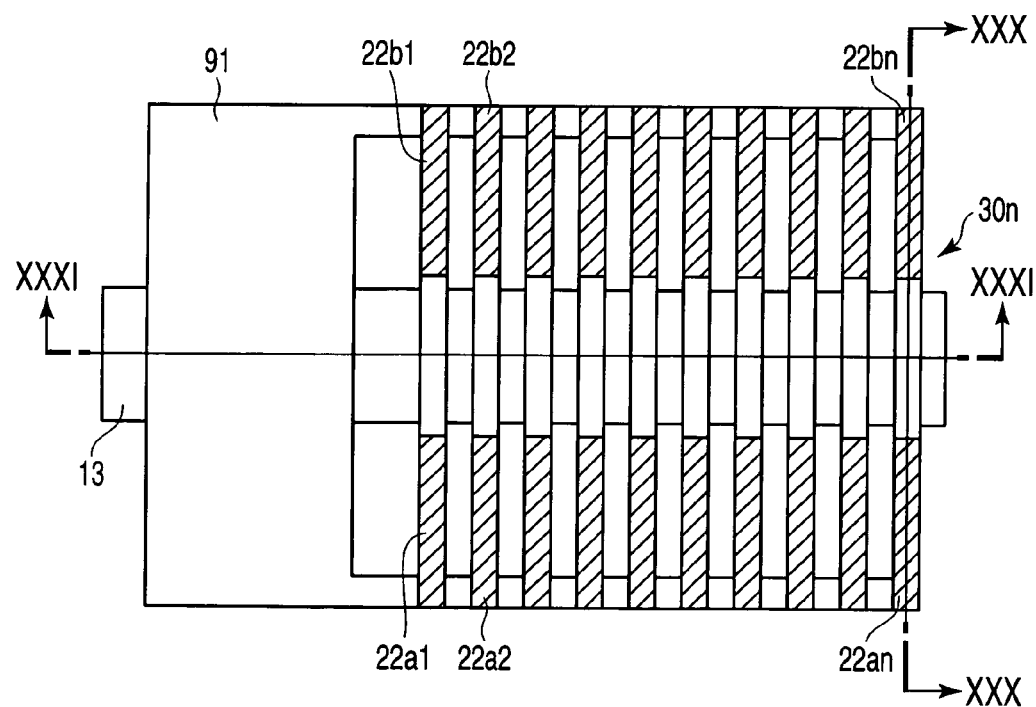
FIG. 29 is a plan view showing a MEMS element according to a ninth embodiment of the present invention.
Figure 30A:
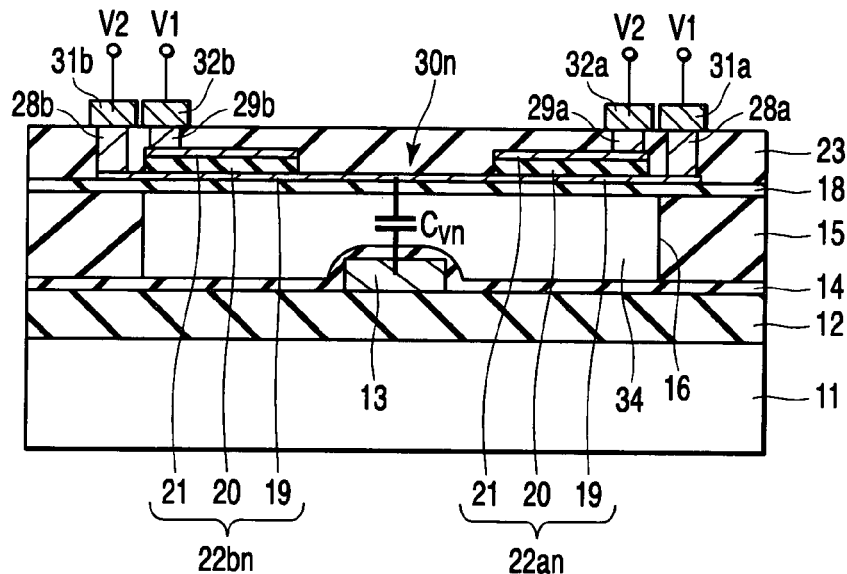
FIGS. 30A and 30B are sectional views showing the MEMS element taken along a line XXX-XXX in FIG. 29.
Figure 30B:
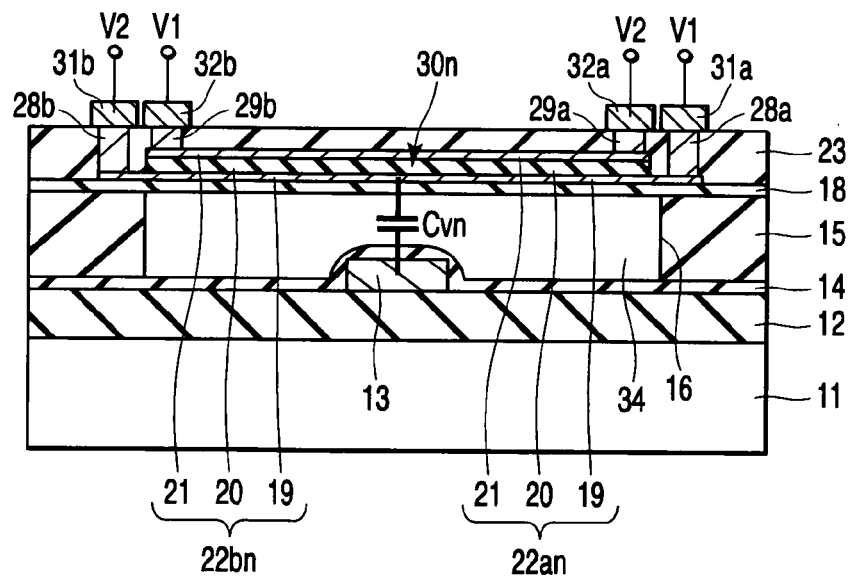
Figure 31:
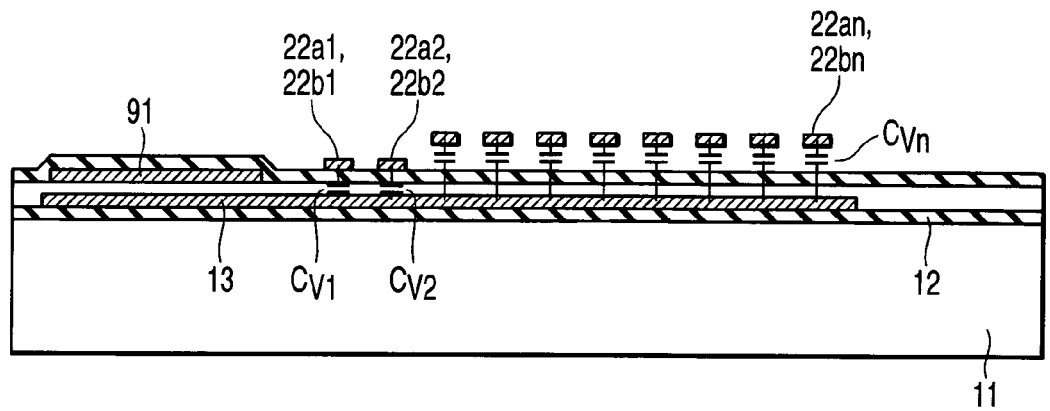
FIG. 31 is a partial sectional view showing the MEMS element taken along a line XXXI-XXXI in FIG. 29.
Figure 32:
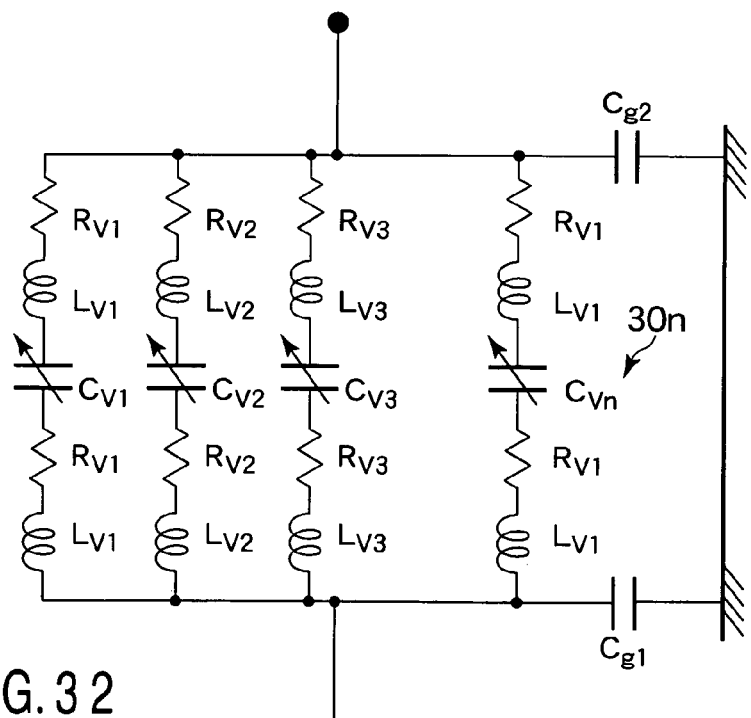
FIG. 32 is a schematic equivalent circuit diagram showing the MEMS element according to the ninth embodiment of the present invention.

FIG. 29 is a plan view of a MEMS element according to the ninth embodiment of the present invention. FIGS. 30A and 30B are sectional views of the MEMS element taken along a line XXX-XXX in FIG. 29. FIG. 31 is a partial sectional view of the MEMS element taken along a line XXXI-XXXI in FIG. 29. FIG. 32 is a schematic equivalent circuit diagram of the MEMS element according to the ninth embodiment of the present invention. The MEMS element according to the ninth embodiment will be described below.

As shown in FIGS. 29 to 31, the ninth embodiment is different from the first embodiment in that (a) the upper electrode of a variable capacitor 30n (n=1, 2, 3, . . . ) and a lower electrode 19 of actuators 22an and 22bn are formed from a common structure, and (b) a plurality of variable capacitors 30n are connected in parallel. This embodiment need always have structure (b). Only structure (a) suffices.

In point (a), when the distance between the lower electrode 19 of the actuators 22an and 22bn and a first electrode layer 13 of the variable capacitor 30n changes, the capacitance Cvn of the variable capacitor 30n changes. Ground potential is applied to the lower electrode 19 of the actuators 22an and 22bn.

As shown in FIG. 30A, the actuators 22an and 22bn may have separate piezoelectric layers 20 and upper electrodes 21, and only the lower electrode 19 may be common. Alternatively, as shown in FIG. 30B, the nth actuators 22an and 22bn may have a common three-layered structure including the lower electrode 19, piezoelectric layer 20, and upper electrode 21.

In point (b), the plurality of actuators 22an and 22bn are laid out in parallel. The terminals of the actuators 22an and 22bn are connected through an interconnection layer 91 so that the plurality of variable capacitors 30n are connected in parallel. Hence, the variable capacitance Cv of the entire MEMS element is given by $$Cv = Cv1 + Cv2 + Cv3 + \ldots + Cvn \quad (2)$$

As shown in FIG. 31, movement of the plurality of actuators 22an and 22bn can be controlled every n lines. For this reason, only capacitances Cv1 and Cv2 of some actuators 22a1, 22b1, 22a2, and 22b2 can be changed.

FIG. 32 is a schematic equivalent circuit diagram showing the above-described MEMS element. As shown in FIG. 32, for example, a parasitic resistance Rvn and a parasitic inductance Lvn of leads are present at the two terminals of the variable capacitor 30n. Parasitic capacitances Cg1 and Cg2 are present between the variable capacitor 30n and the substrate.

As described above, according to the ninth embodiment, the same effect as that of the first embodiment can be obtained. In addition, the following effect can also be obtained.

Since the upper electrode of a variable capacitor 30 and the lower electrode 19 of actuators 22a and 22b are formed from a common structure, the area of the MEMS element, the component size, and the cost can be reduced.

When the plurality of variable capacitors 30 are connected in parallel, and the areas of the electrode layers 13 and 19 and the distance between them are appropriately set and combined, desired capacitances Cv1, Cv2, . . . , Cvn can be obtained. Even when the capacitances Cv1, Cv2, . . . , Cvn vary, the individual capacitance variations can be absorbed in the entire MEMS element. Hence, the variation in entire capacitance Cv can be reduced.

[1-10] Tenth Embodiment

In the above-described embodiments, the capacitance Cv of the variable capacitor 30 is determined by the potential difference |V2−V1| applied to the actuators 22a and 22b. Simultaneously, the capacitance Cv is affected by manufacturing variations in the piezoelectric material and actuator structure. More specifically, the capacitance Cv is affected by manufacturing variations in the piezoelectric constant ($d_{31}$), Young's modulus, and film thickness. Hence, to implement the desired capacitance Cv, the voltages V1 and V2 applied are preferably trimmed on the basis of measurement of the effect of the manufacturing variations.

In the tenth embodiment, an example of a trimming system to implement such trimming will be described. In the trimming system according to the tenth embodiment a trimming value which changes for each chip is stored in a fuse ROM.

(1) Chip Structure

Figure 33:
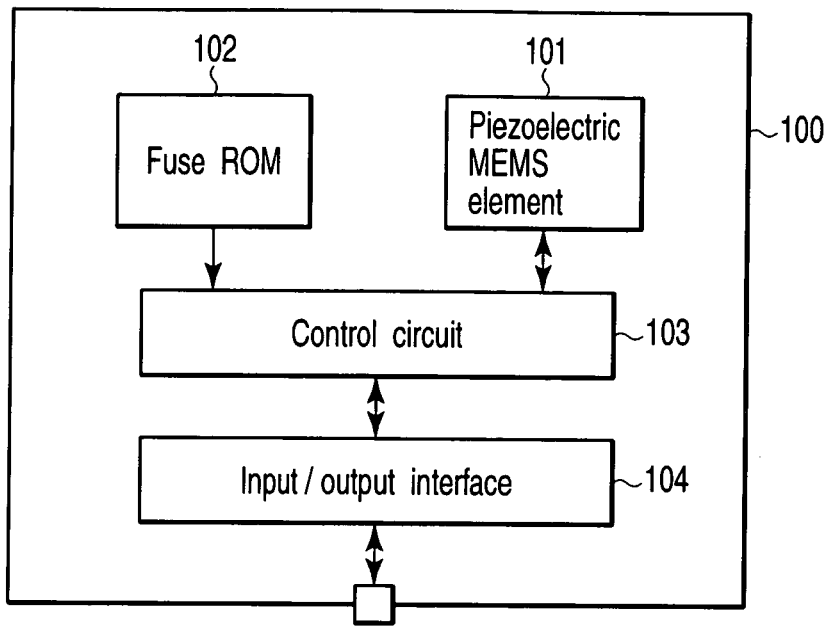
FIG. 33 is a block diagram showing a semiconductor chip according to a tenth embodiment of the present invention.

FIG. 33 is a block diagram of a semiconductor chip according to the tenth embodiment of the present invention. The structure of the semiconductor chip according to the tenth embodiment will be described below.

As shown in FIG. 33, a chip 100 includes a piezoelectric MEMS element 101, fuse ROM 102, control circuit 103, and input/output interface 104.

The piezoelectric MEMS element 101 is a MEMS element having the structure of, e.g., the first embodiment. The fuse ROM 102 is used as a memory to store trimming data of the piezoelectric MEMS element 101.

(2) Test Step

Figure 34:
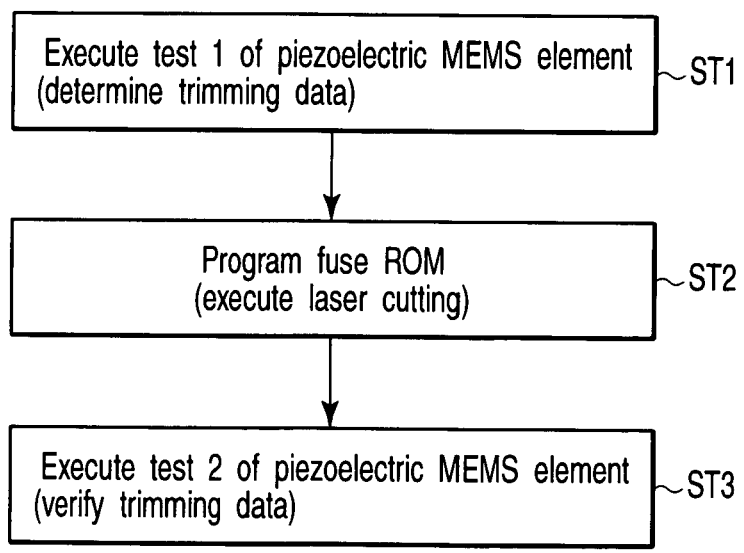
FIG. 34 is a flowchart showing the test step of a trimming system according to the tenth embodiment.

FIG. 34 is a flowchart of the test step of the trimming system according to the tenth embodiment. The flow of the test step of the trimming system will be described below.

First, the manufacturing variation of the piezoelectric MEMS element 101 is measured, and trimming data is determined (ST1). At this time, voltages V1 and V2 applied to actuators 22a and 22b are set to predetermined values, and the capacitance Cv of a variable capacitor 30 at that time is monitored.

Next, the interconnection of the fuse ROM 102 is cut by using, e.g., a laser apparatus, thereby writing the trimming data in the fuse ROM 102 (ST2).

The capacitance Cv of the variable capacitor 30 is monitored by using the trimming data, and it is verified whether trimming has been done normally (ST3).

As described above, according to the tenth embodiment, the same effect as that of the first embodiment can be obtained. In addition, the following effect can also be obtained.

When the values of the applied voltages V1 and V2 are trimmed in consideration of the manufacturing variation of the actuators 22a and 22b, and the trimming data is programmed in the fuse ROM 102, the desired capacitance Cv can be implemented.

Since the trimming data is written in the fuse ROM 102 in the same chip 100, test steps ST1 to ST3 of the trimming system can be executed in a short time.

[1-11] Eleventh Embodiment

The eleventh embodiment is a modification to the tenth embodiment. In place of a fuse ROM, a ferroelectric memory is used as a memory to store trimming data.

(1) Chip Structure

Figure 35:
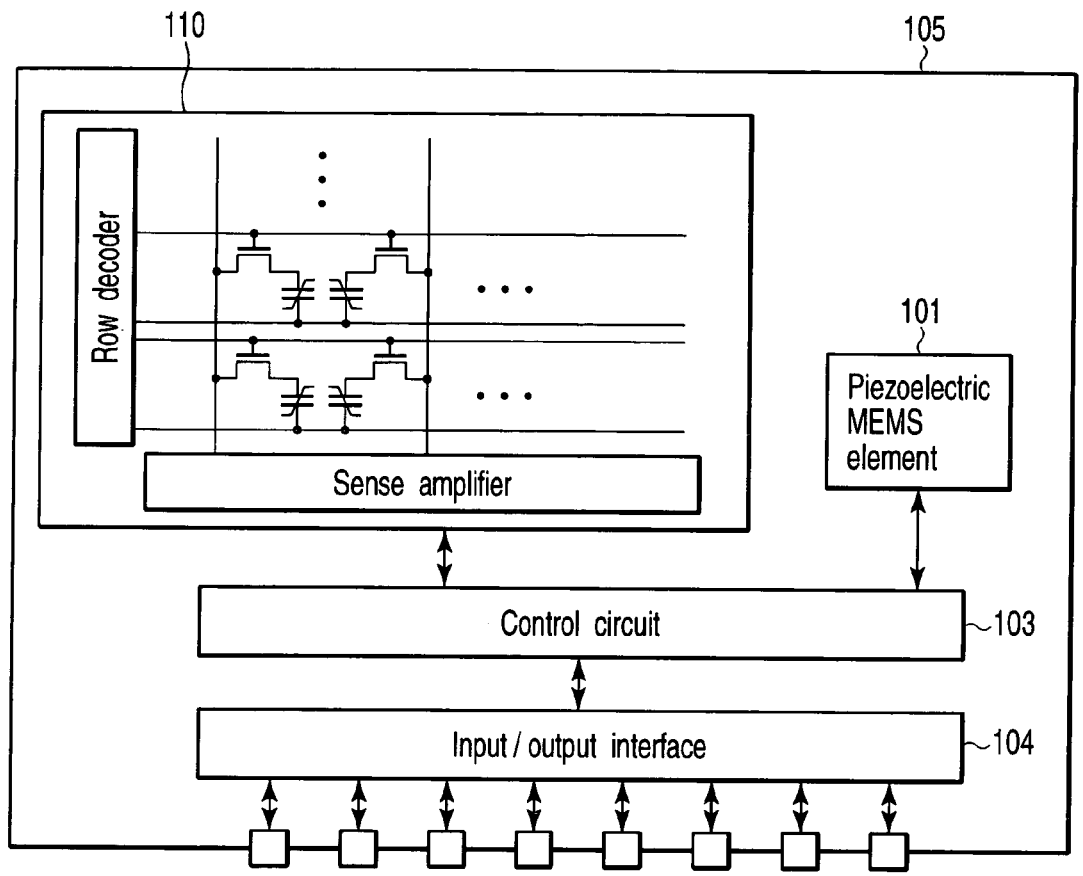
FIG. 35 is a block diagram showing a semiconductor chip according to an eleventh embodiment of the present invention.

FIG. 35 is a block diagram showing a semiconductor chip according to the eleventh embodiment of the present invention. The structure of the semiconductor chip according to the eleventh embodiment will be described below.

As shown in FIG. 35, the eleventh embodiment is different from the tenth embodiment in that a ferroelectric memory 110 is used in place of a fuse ROM to store the trimming data of a piezoelectric MEMS element 101. The ferroelectric memory 110 can also be used to store data except the trimming data, and for example, a program.

(2) Test Step

Figure 36:
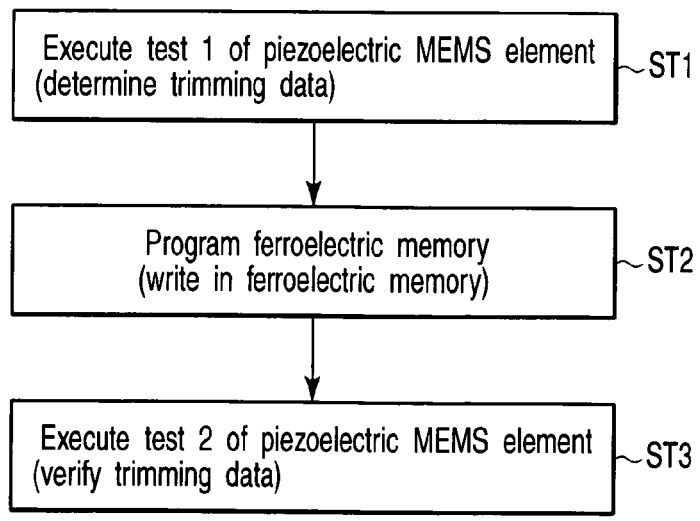
FIG. 36 is a flowchart showing the test step of a trimming system according to the eleventh embodiment.

FIG. 36 is a flowchart of the test step of the trimming system according to the eleventh embodiment. The flow of the test step of the trimming system will be described below.

First, the manufacturing variation of the piezoelectric MEMS element 101 is measured, and trimming data is determined (ST1). At this time, voltages V1 and V2 to be applied to actuators 22a and 22b are set to predetermined values, and the capacitance Cv of a variable capacitor 30 at that time is monitored.

Next, the trimming data is written in the ferroelectric memory 110 (ST2).

The capacitance Cv of the variable capacitor 30 is monitored by using the trimming data, and it is verified whether trimming has been done normally (ST3).

(3) Structure

Figure 37:
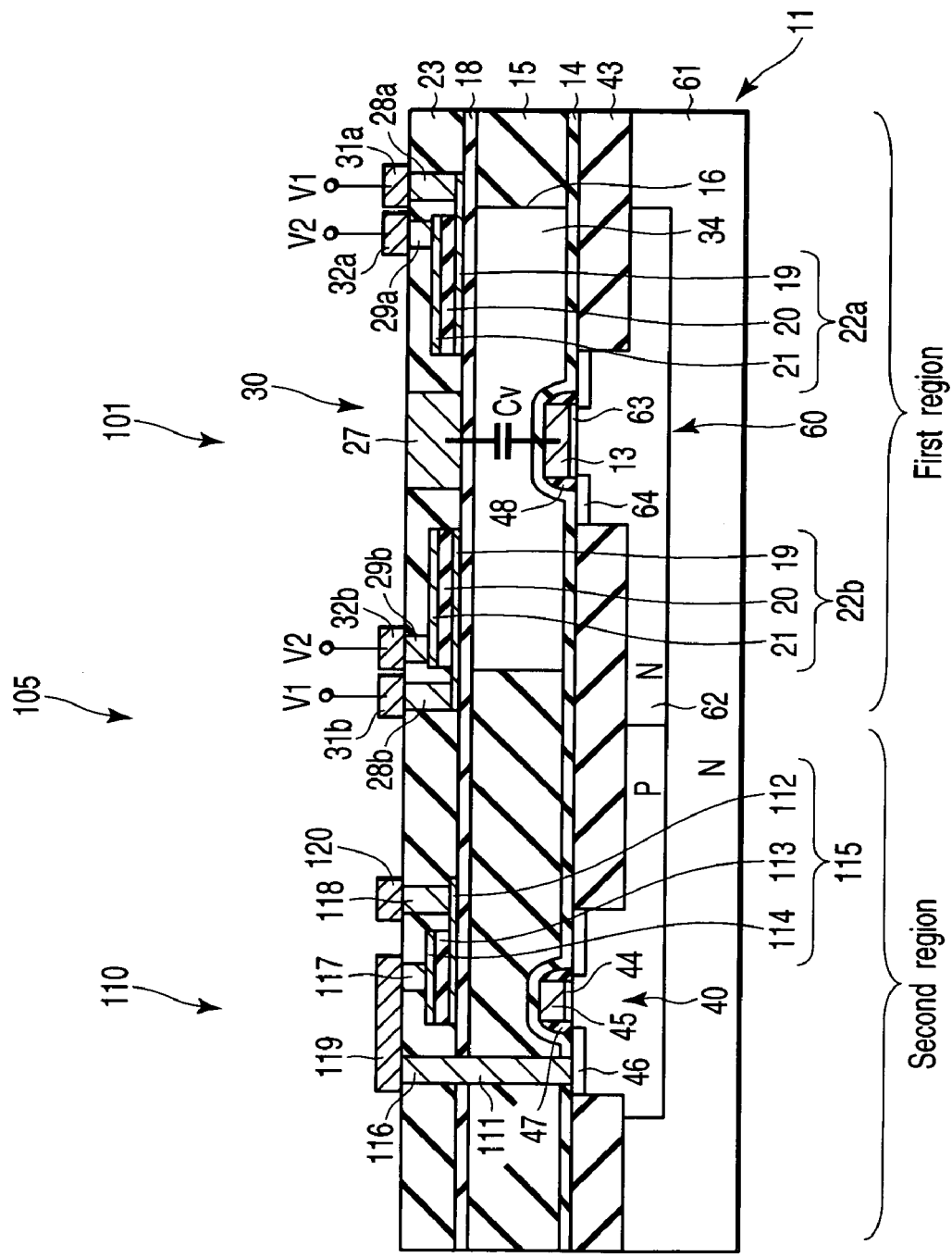
FIG. 37 is a sectional view showing a semiconductor device according to the eleventh embodiment of the present invention.
Figure 38:
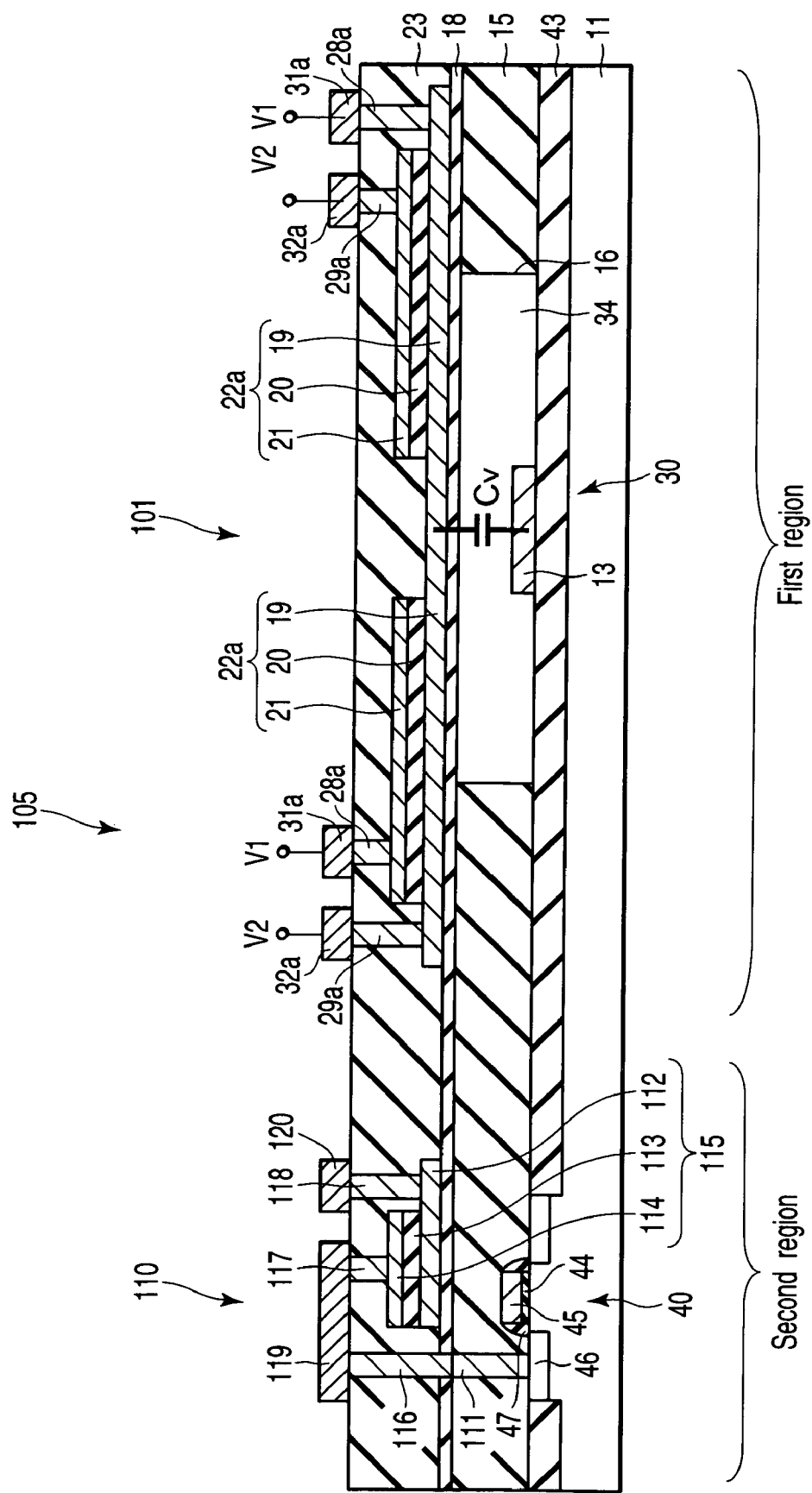
FIG. 38 is a sectional view showing a modification of the semiconductor device according to the eleventh embodiment of the present invention.

FIG. 37 is a sectional view of a semiconductor device according to the eleventh embodiment of the present invention. FIG. 38 is a sectional view of a modification of the semiconductor device according to the eleventh embodiment of the present invention. The structure of the semiconductor device according to the eleventh embodiment will be described below.

As shown in FIG. 37, in a semiconductor chip 105 according to the eleventh embodiment, the piezoelectric MEMS element 101 and ferroelectric memory 110 are embedded on a single semiconductor substrate (e.g., a silicon substrate) 11.

The structure according to the fourth embodiment shown in FIG. 19 is applied to the piezoelectric MEMS element 101 in a first region.

The ferroelectric memory 110 in a second region includes a MOS transistor 40 and a ferroelectric capacitor 115. The MOS transistor 40 has a gate electrode 45 which is formed on a gate insulating film 44 formed on the semiconductor substrate 11, and source and drain diffusion layers 46 which are formed in the semiconductor substrate 11 on both sides of the gate electrode 45. The ferroelectric capacitor 115 has an upper electrode 114, a lower electrode 112, and a ferroelectric film 113 sandwiched between the upper electrode 114 and the lower electrode 112. The upper electrode 114 of the ferroelectric capacitor 115 is connected to the source or drain diffusion layer 46 through contacts 117, 116, 111, and 119. The lower electrode 112 is connected to an interconnection 120 through a contact 118.

In the semiconductor device according to the eleventh embodiment, piezoelectric layers 20 of the actuators 22a and 22b and the ferroelectric film 113 of the ferroelectric capacitor 115 are formed simultaneously by using the same material. The ferroelectric film 113 can be used for two purposes because the ferroelectric material has piezoelectric properties. As the ferroelectric film 113, for example, PZT is used. PZT has a large piezoelectric constant (d31, d32, and d33) and can suitably be used as the material of the piezoelectric layers 20 of the actuators 22a and 22b. The composition ratio of Zr and Ti of PZT is preferably 20:80 to 50:50. However, a material having piezoelectric properties is not always a ferroelectric material. For example, AlN is not a ferroelectric material although it has piezoelectric properties.

Lower electrodes 19 of the actuators 22a and 22b and the lower electrode 112 of the ferroelectric capacitor 115 may be formed simultaneously by using the same material. Upper electrodes 21 of the actuators 22a and 22b and the upper electrode 114 of the ferroelectric capacitor 115 may be formed simultaneously by using the same material.

A first electrode layer 13 of the variable capacitor 30 and the gate electrode 45 of the MOS transistor 40 may be formed simultaneously by using the same material.

Contacts 28a, 28b, and 118 may be formed simultaneously by using the same material. Contacts 29a, 29b, and 117 may be formed simultaneously by using the same material.

Interconnections 31a, 31b, 32a, 32b, 119, and 120 may be formed simultaneously by using the same material.

As described above, when the constituent elements are formed simultaneously by using the same material, the number of processes can be decreased, and the cost can be reduced.

As described above, according to the eleventh embodiment, the same effect as that of the tenth embodiment can be obtained. In addition, the following effect can also be obtained.

In the tenth embodiment, a dedicated laser apparatus is necessary for programming the fuse ROM 102. In addition, the test process and test time may be prolonged by laser cutting. As a result, the chip cost may increase.

In the eleventh embodiment, the ferroelectric memory 110 is used in place of the fuse ROM 102. Accordingly, the nonvolatile memory to store the trimming data of the piezoelectric MEMS element 101 can be made inexpensive. In addition, since no laser cutting is performed, the test cost can also be reduced.

In the eleventh embodiment, the piezoelectric layers 20 of the actuators 22a and 22b and the ferroelectric film 113 of the ferroelectric capacitor 115 are formed by the same film formation process. For this reason, the number of processes can be reduced, and the cost can be reduced.

When a nonvolatile memory such as an EEPROM is employed in place of the fuse ROM 102, the laser cutting step can be omitted. However, to embed an EEPROM on a MEMS element, the number of masks increases, and the process becomes complex. Hence, a nonvolatile memory such as the ferroelectric memory 110 is more preferably used than a nonvolatile memory such as an EEPROM.

Various changes and modifications can be made for the eleventh embodiment, as will be described below.

(a) The structure of the MEMS element in the first region is not limited to the structure of the fourth embodiment shown in FIG. 19, and various changes and modifications can be done. For example, as shown in FIG. 38, the upper electrode of the variable capacitor 30 and the lower electrodes 19 of the actuators 22a and 22b may be formed from a common structure. An insulating film 14 on the first electrode layer 13 of the variable capacitor 30 may be omitted. In addition, the first electrode layer 13 need not always function as the gate electrode of a transistor 60.

(b) When an automatic test circuit is arranged in the chip 105, the whole test step can be executed automatically.

(c) Since the number of bits of trimming data to be stored in the ferroelectric memory 110 is not so large, the memory cell size may be large to some extent. Hence, a 2T2C ferroelectric memory having a large read margin may be employed. Alternatively, to increase the number of read times, a nondestructive ferroelectric memory may be employed. Conversely, the capacity of the ferroelectric memory to be embedded may be increased to store data except trimming data. If embedding of a MEMS element and an LSI progresses in the future, it will be possible to execute more advanced information processing. The ferroelectric memory may be used to store the program data of such an LSI.

[2] Switch

The twelfth and thirteenth embodiments of the present invention point to structures in which a piezoelectric MEMS element functions as a contact switch.

[2-1] Twelfth Embodiment

A twelfth embodiment points to an example of a switch MEMS element having a doubly-supported-beam structure.

(1) Structure

Figure 39:
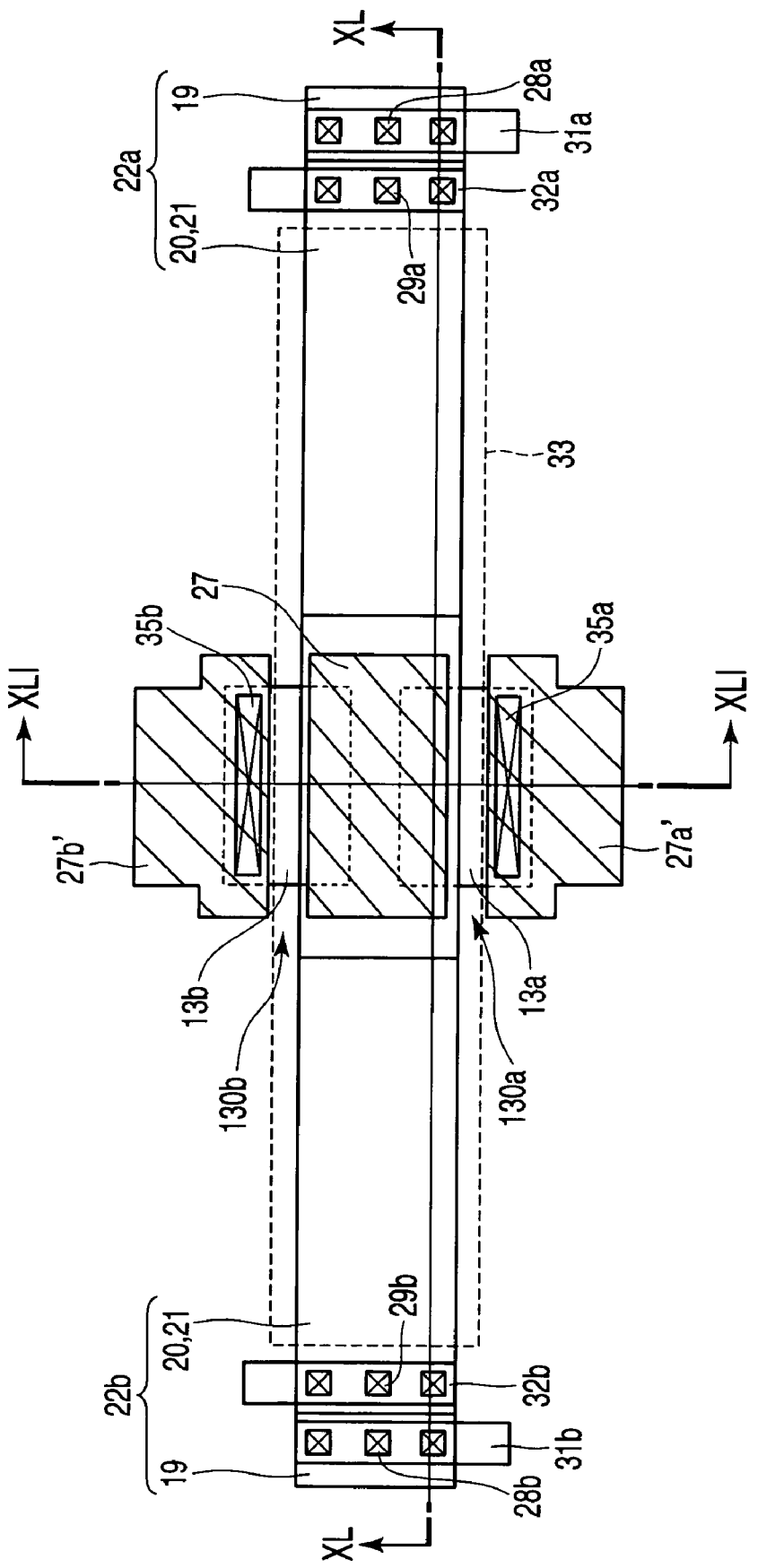
FIG. 39 is a plan view showing a MEMS element according to a twelfth embodiment of the present invention.
Figure 40:
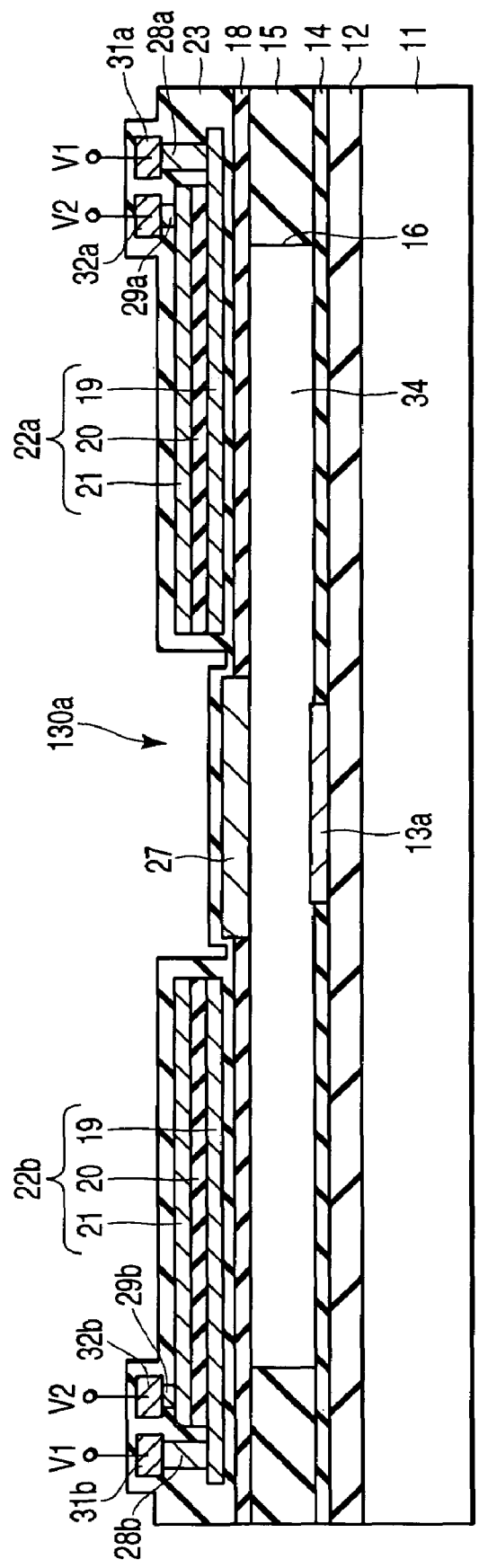
FIG. 40 is a sectional view showing the MEMS element taken along a line XL-XL in FIG. 39.
Figure 41:
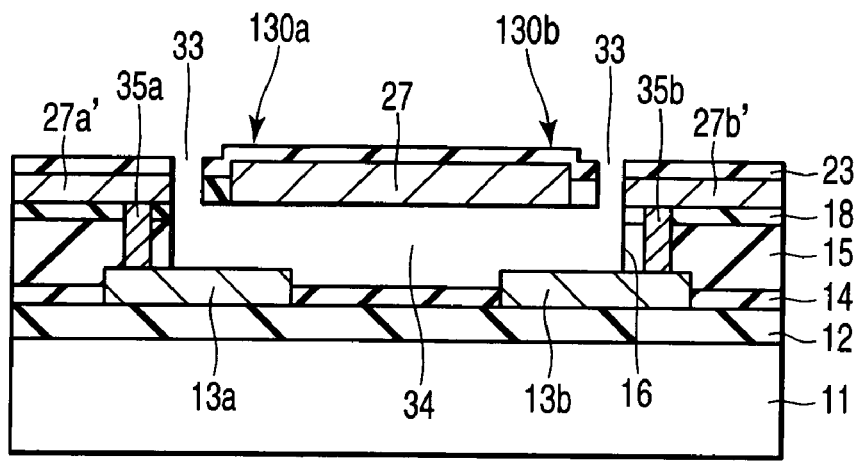
FIG. 41 is a sectional view showing the MEMS element taken along a line XLI-XLI in FIG. 39.

FIG. 39 is a plan view of a MEMS element according to the twelfth embodiment of the present invention. FIG. 40 is a sectional view of the MEMS element taken along a line XL-XL in FIG. 39. FIG. 41 is a sectional view showing the MEMS element taken along a line XLI-XLI in FIG. 39. The structure of the MEMS element according to the twelfth embodiment will be described below.

As shown in FIGS. 39 to 41, in the MEMS element according to the twelfth embodiment, first and second electrode layers 13a, 13b, and 27 function as switches 130a and 130b. The twelfth embodiment is different from the MEMS element functioning as the variable capacitor 30 in the first embodiment in that the upper surfaces of the first electrode layers 13a and 13b are exposed from a first insulating film 14, and the lower surface of the second electrode layer 27 is exposed from a third insulating film 18. With this structure, when the switches 130a and 130b move, the first and second electrode layers 13a, 13b, and 27 come into direct contact with each other and are electrically connected.

(2) Operation

Figure 42:
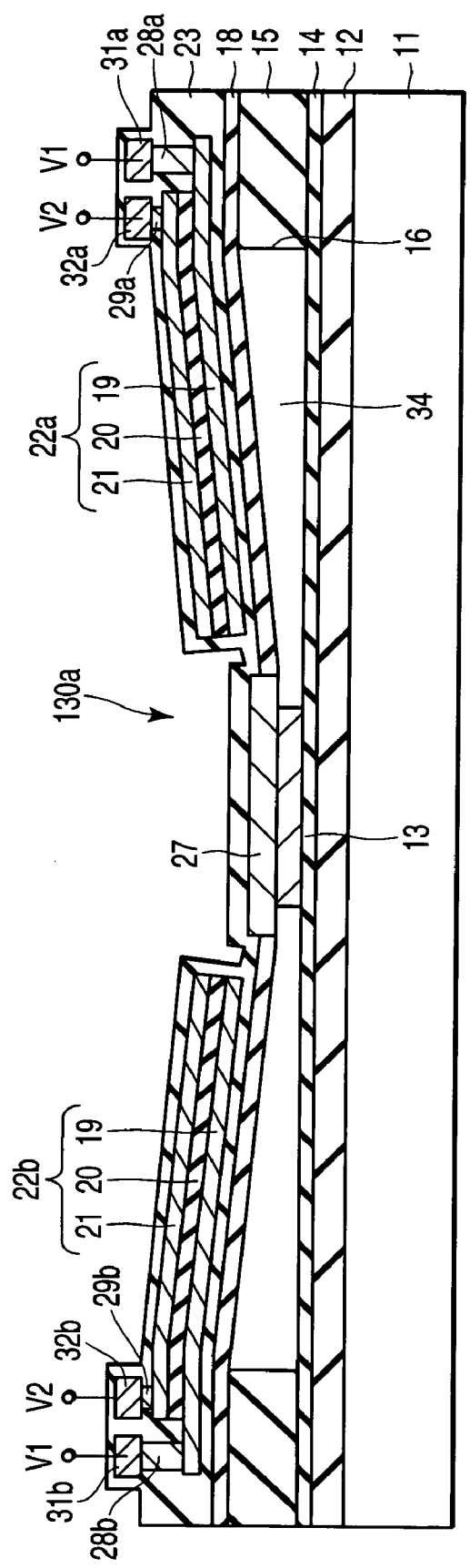
FIG. 42 is a sectional view showing the MEMS element when actuators shown in FIG. 40 move.

FIG. 42 is a sectional view of the MEMS element when actuators shown in FIG. 40 move. The MEMS element according to the twelfth embodiment functions as a switch, as will be described below.

(Nonmoving State)

The nonmoving state of actuators 22a and 22b will be described first with reference to FIG. 40.

When both voltages V1 and V2 of lower electrodes 19 and upper electrodes 21 of the actuators 22a and 22b are 0V, the actuators 22a and 22b do not move. Since the switches 130a and 130b are in a noncontact state, they are turned off.

(Moving State)

The moving state of the actuators 22a and 22b will be described next with reference to FIG. 42.

The voltage V1 of the lower electrodes 19 of the actuators 22a and 22b is set to, e.g., ground potential (0V). The voltage V2 of the upper electrodes 21 is set to, e.g., 3V. At this time, the actuators 22a and 22b move. More specifically, piezoelectric layers 20 are distorted in the horizontal direction. The ends of the actuators 22a and 22b on the sides of the switches 130a and 130b move downward. Accordingly, first electrode layers 13 and the second electrode layer 27 of the switches 130a and 130b come into contact with each other. As a result, the switches 130a and 130b are turned on.

(4) Manufacturing Method

FIGS. 43 to 47 are sectional views showing steps in manufacturing the MEMS element according to the twelfth embodiment of the present invention. The method of manufacturing the MEMS element according to the twelfth embodiment will be described below.

Figure 43:
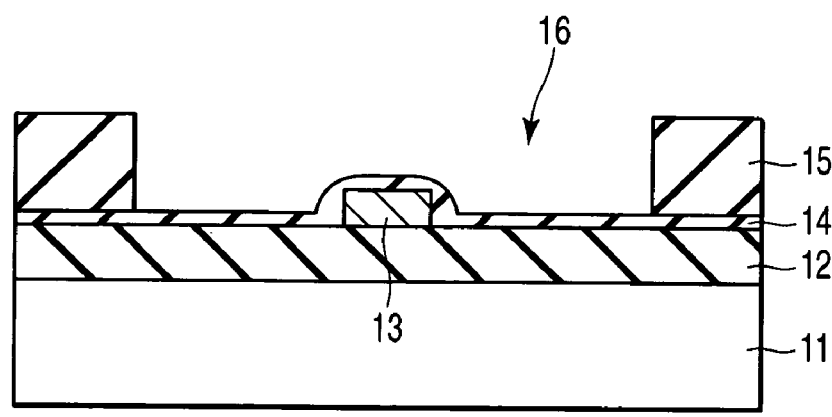
FIGS. 43 to 47 are sectional views showing steps in manufacturing the MEMS element according to the twelfth embodiment of the present invention.

First, as shown in FIG. 43, a thermal oxide film 12 is formed on a semiconductor substrate (e.g., a silicon substrate) 11. The first electrode layer 13 of a switch 130 is formed on the thermal oxide film 12. The first insulating film 14 is deposited on the first electrode layer 13 and thermal oxide film 12. A second insulating film 15 is deposited on the first insulating film 14, and a trench 16 is formed.

Figure 44:
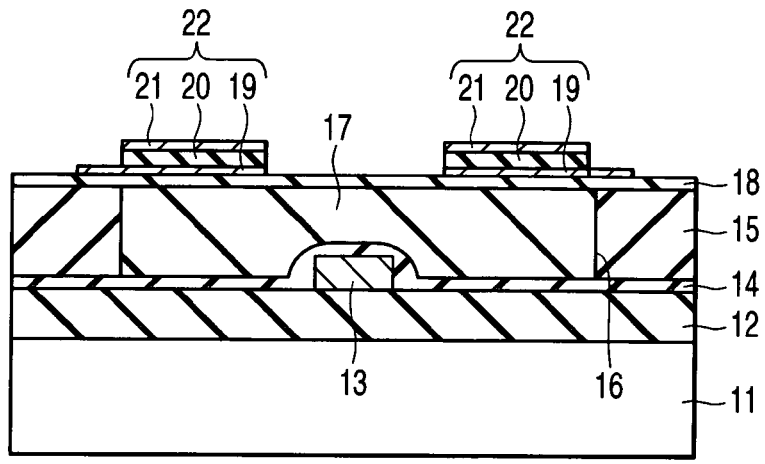

As shown in FIG. 44, a sacrificial layer 17 is deposited in the trench 16. A third insulating film 18 is formed on the sacrificial layer 17 and second insulating film 15. The piezoelectric actuators 22a and 22b each including the lower electrode 19, piezoelectric layer 20, and upper electrode 21 are formed on the third insulating film 18.

Figure 45:
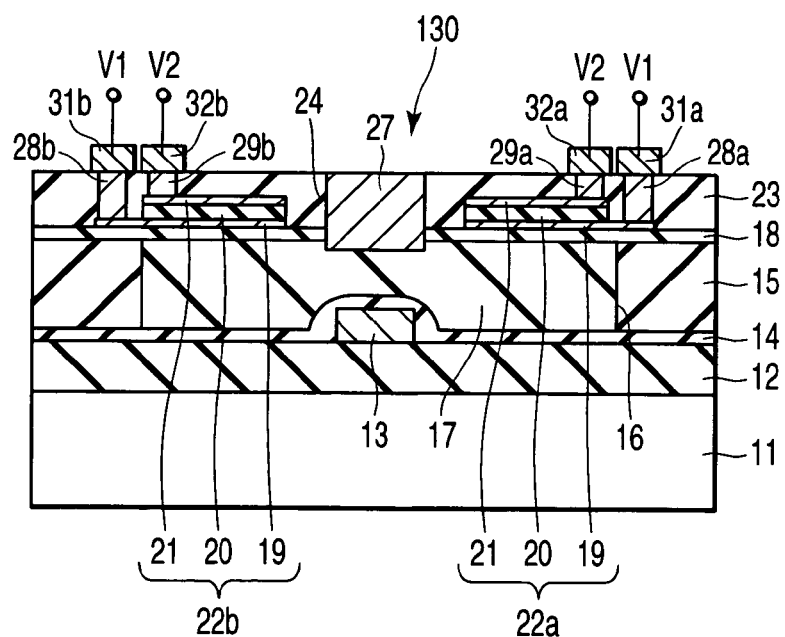

As shown in FIG. 45, a fourth insulating film 23 is deposited on the actuators 22a and 22b and third insulating film 18. The second electrode layer 27 of the switch 130 and first to fourth contacts 28a, 28b, 29a, and 29b are formed. Preferably, the lower surface of the second electrode layer 27 is flush with the lower surface of the third insulating film 18 or extends through the third insulating film 18. The lower surface of the second electrode layer 27 more preferably reaches the inside of the sacrificial layer 17. After that, interconnection layers 31a, 31b, 32a, and 32b connected to the contacts 28a, 28b, 29a, and 29b are formed.

Figure 46:
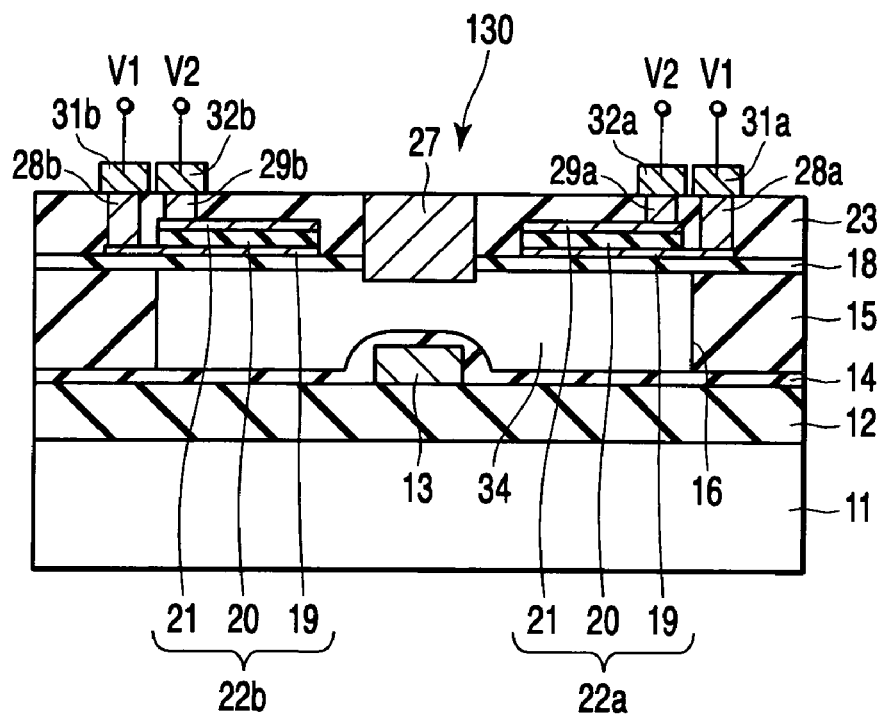

As shown in FIG. 46, an opening portion (opening portion 33 in FIG. 41) which exposes part of the sacrificial layer 17 is formed. The sacrificial layer 17 is removed through this opening portion to form a cavity 34.

Figure 47:
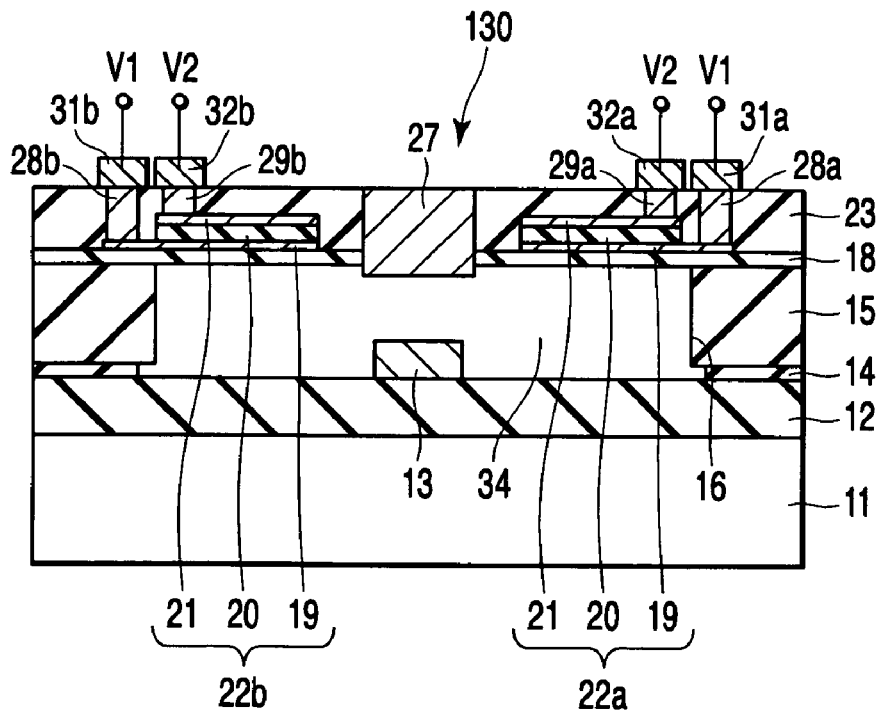

As shown in FIG. 47, the first insulating film 14 is partially removed to expose the upper surface of the first electrode layer 13 of the switch 130. In this way, the piezoelectric MEMS element functioning as the switch 130 is formed.

For the first insulating film 14, a material having a high etching selectivity (high etching rate) with respect to the materials of the first electrode layer 13 of the switch 130 and the second insulating film 15 is preferably used. For example, assume that the first electrode layer 13 is made of Al, and the second insulating film 15 is made of SiN or $SiO_2$. In this case, $Al_2O_3$, undoped SiGe, amorphous silicon, or $SiO_2$ heavily doped with at least one of phosphorus and boron can be used as the material of the first insulating film 14.

As described above, according to the twelfth embodiment, in the actuators 22a and 22b using the piezoelectric layers 20, the piezoelectric layers 20 are almost flat, as in the first embodiment. For this reason, even when the voltages V1 and V2 are applied to the lower electrodes 19 and upper electrodes 21 of the actuators 22a and 22b, the piezoelectric layers 20 can be prevented from stretching nonuniformly or causing a decrease in horizontal stretch amount. In addition, when the actuators 22a and 22b move, any crack generation at the step portions of the piezoelectric layers 20 can be suppressed. Hence, the yield can be increased. Furthermore, since the controllability of the actuators 22a and 22b increases, the controllability of the switch 130 can also be increased. As a result, the reliability of the MEMS element can be increased.

Various changes and modifications can be made for the switch MEMS element having a doubly-supported-beam structure according to the twelfth embodiment, as will be described below.

Figure 48:
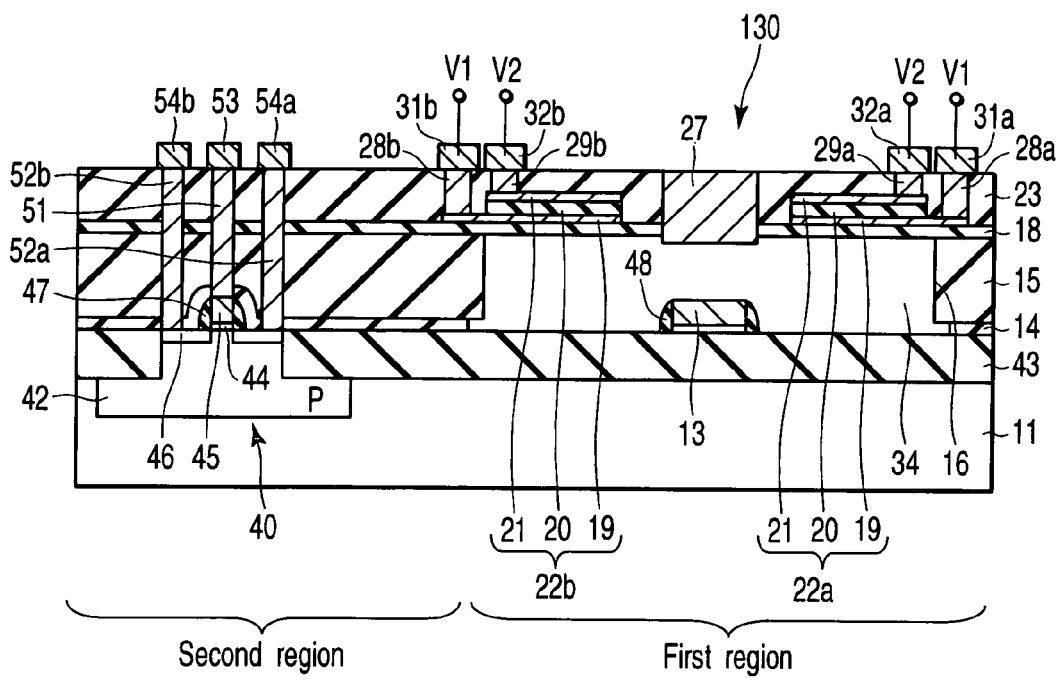
FIG. 48 is a sectional view showing an embedded structure of a MOS transistor and the MEMS element according to the twelfth embodiment of the present invention.

As shown in FIG. 48, a MOS transistor 40 may be formed on the same substrate 11 as the switch MEMS element. In this case, the first electrode layer 13 of the switch 130 and a gate electrode 45 of the MOS transistor 40 can be formed simultaneously by using the same material.

Figure 49:
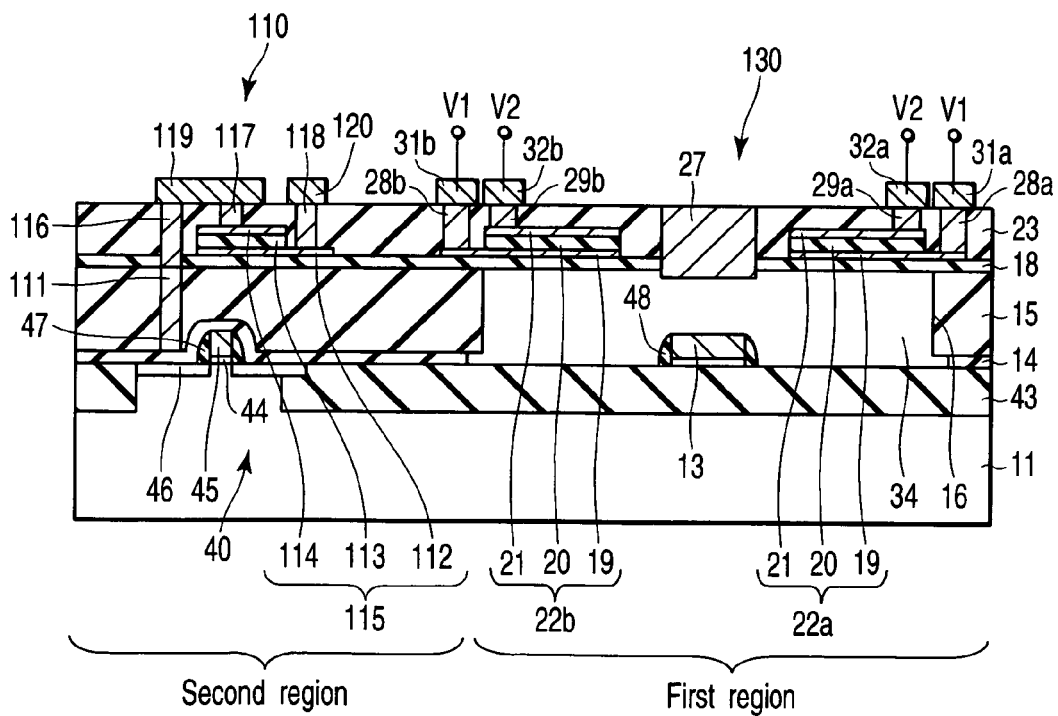
FIG. 49 is a sectional view showing an embedded structure of a ferroelectric memory and the MEMS element according to the twelfth embodiment of the present invention.

As shown in FIG. 49, a ferroelectric memory 110 may be formed on the same substrate 11 as the switch MEMS element. In this case, the first electrode layer 13 of the switch 130 and the gate electrode 45 of the MOS transistor 40 can be formed simultaneously by using the same material. In addition, the layers 19, 20, and 21 of actuators 22 and layers 112, 113, and 114 of a ferroelectric capacitor 115 can be formed simultaneously by using the same material.

In the switch 130, the two first electrode layers 13a and 13b need not always be formed in correspondence with one second electrode layer 27. For example, the first and second electrode layers of the switch may be formed in a one-to-one correspondence. Three or more first electrode layers may be formed in correspondence with one second electrode layer. Alternatively, two or more second electrode layers may be formed in correspondence with one first electrode layer.

[2-2] Thirteenth Embodiment

In a thirteenth embodiment, the twelfth embodiment is modified to a cantilever structure.

Figure 50:
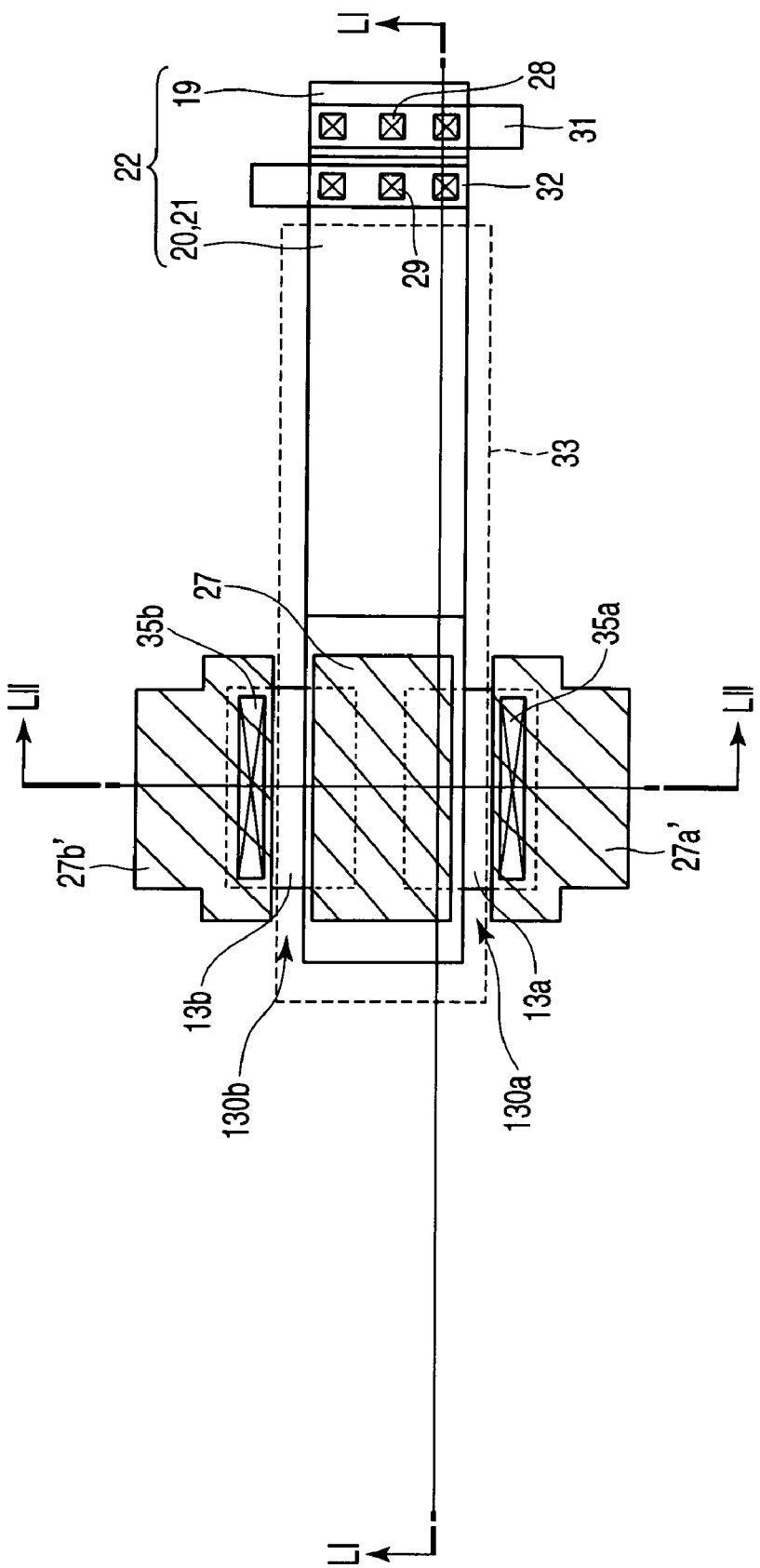
FIG. 50 is a plan view showing a MEMS element according to a thirteenth embodiment of the present invention.
Figure 51:
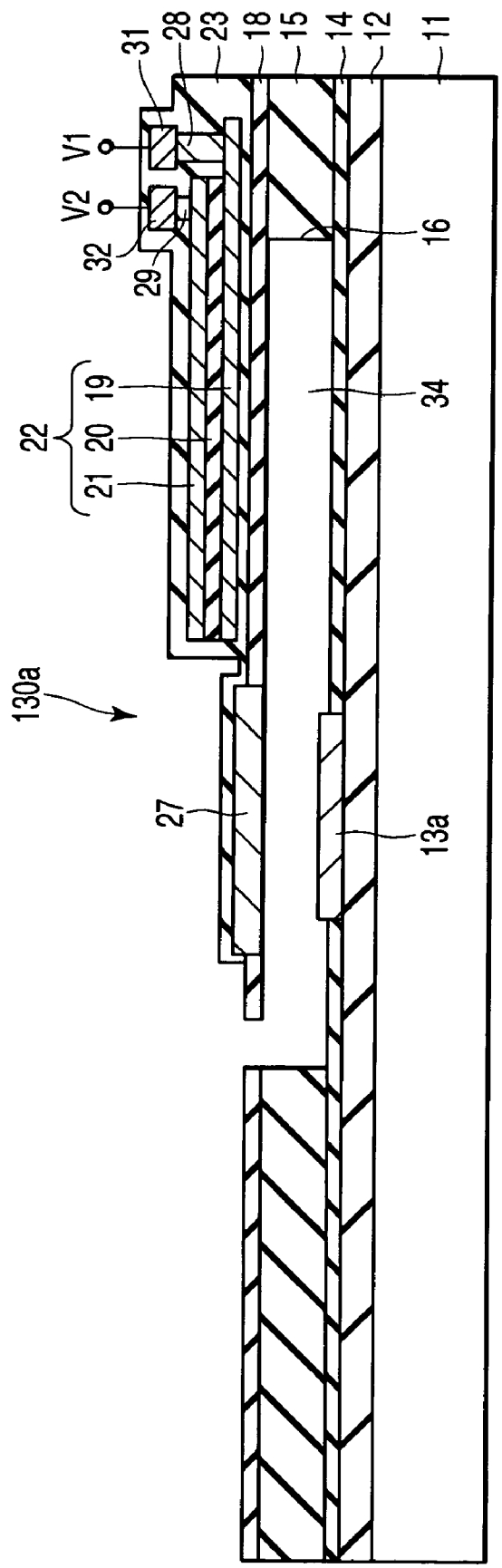
FIG. 51 is a sectional view showing the MEMS element taken along a line LI-LI in FIG. 50.

FIG. 50 is a plan view of a MEMS element according to the thirteenth embodiment of the present invention. FIG. 51 is a sectional view of the MEMS element taken along a line LI-LI in FIG. 50. FIG. 52 is a sectional view showing the MEMS element taken along a line LII-LII in FIG. 50. The MEMS element according to the thirteenth embodiment will be described below.

As shown in FIGS. 50 to 52, the thirteenth embodiment is different from the twelfth embodiment in that an actuator 22 is arranged on only one side of switches 130a and 130b.

As described above, according to the thirteenth embodiment, the same effect as that of the twelfth embodiment can be obtained. In addition, since the switch MEMS element has a cantilever structure, the MEMS element can be made compact.

Various changes and modifications can be made for the switch MEMS element having a cantilever structure according to the thirteenth embodiment, as will be described below.

Figure 53:
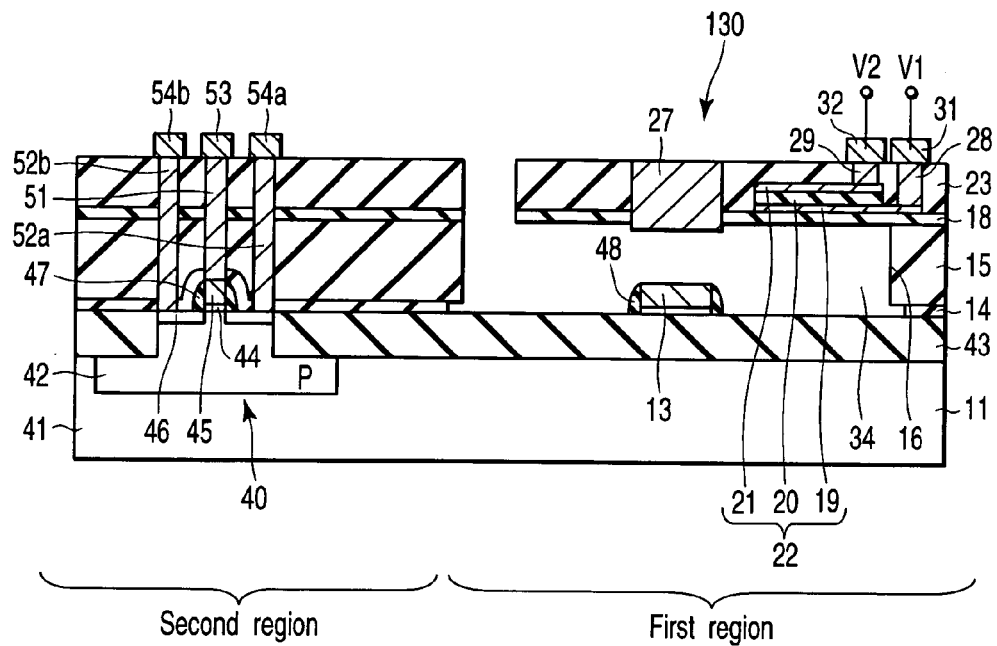
FIG. 53 is a sectional view showing an embedded structure of a MOS transistor and the MEMS element according to the thirteenth embodiment of the present invention.

As shown in FIG. 53, a MOS transistor 40 may be formed on the same substrate 11 as the switch MEMS element. In this case, a first electrode layer 13 of a switch 130 and a gate electrode 45 of the MOS transistor 40 can be formed simultaneously by using the same material.

Figure 54:
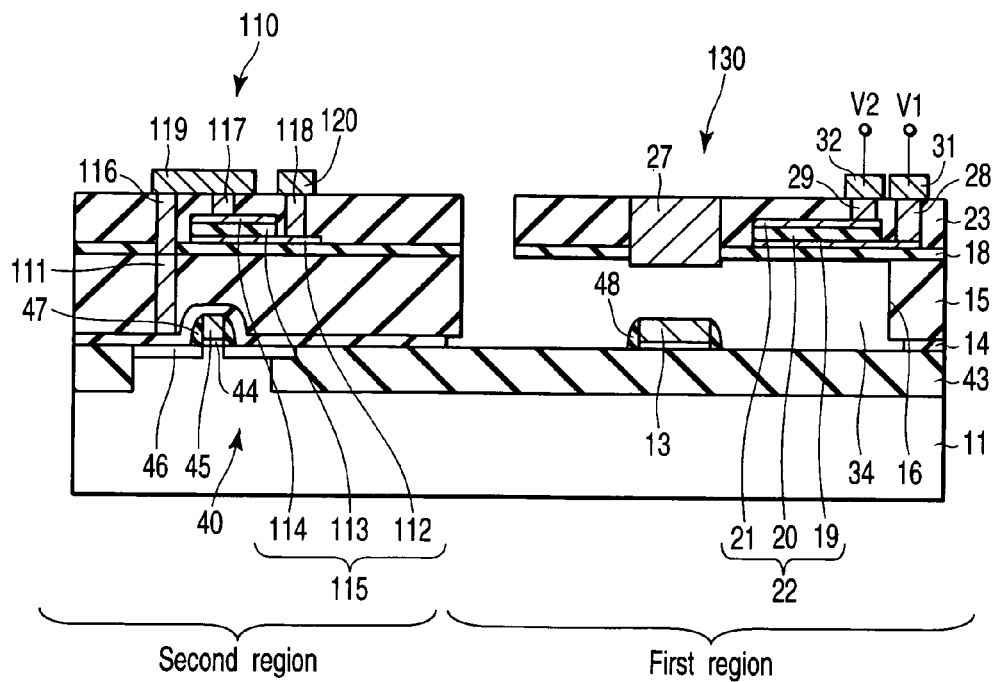
FIG. 54 is a sectional view showing an embedded structure of a ferroelectric memory and the MEMS element according to the thirteenth embodiment of the present invention.

As shown in FIG. 54, a ferroelectric memory 110 may be formed on the same substrate 11 as the switch MEMS element. In this case, the first electrode layer 13 of the switch 130 and the gate electrode 45 of the MOS transistor 40 can be formed simultaneously by using the same material. In addition, layers 19, 20, and 21 of the actuator 22 and layers 112, 113, and 114 of a ferroelectric capacitor 115 can be formed simultaneously by using the same material.

In the switch 130, two first electrode layers 13a and 13b need not always be formed in correspondence with one second electrode layer 27. For example, the first and second electrode layers of the switch may be formed in a one-to-one correspondence. Three or more first electrode layers may be formed in correspondence with one second electrode layer. Alternatively, two or more second electrode layers may be formed in correspondence with one first electrode layer.

[3] Mirror

A fourteenth embodiment of the present invention points to a structure in which a piezoelectric MEMS element functions as a mirror.

(1) Structure

Figure 55:
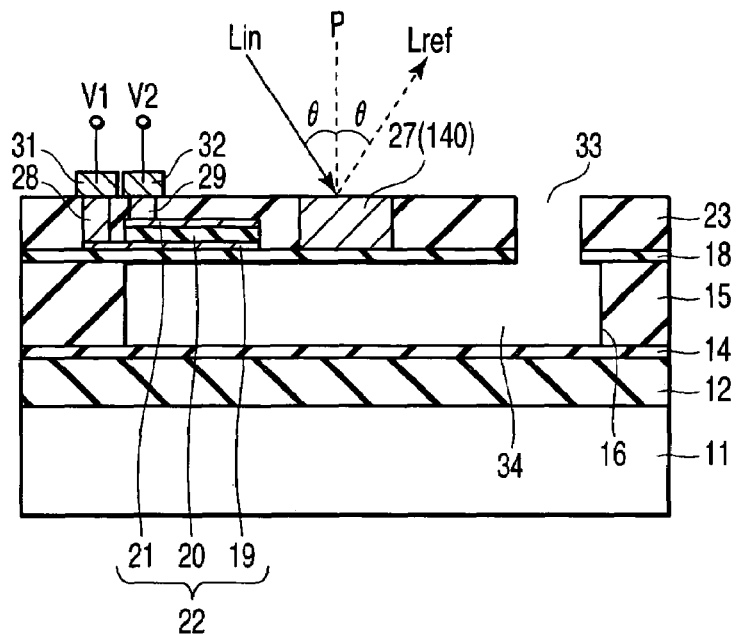
FIG. 55 is a sectional view showing a MEMS element according to a fourteenth embodiment of the present invention before movement.

FIG. 55 is a sectional view of a MEMS element according to the fourteenth embodiment of the present invention before movement. The structure of the MEMS element according to the fourteenth embodiment will be described below.

Figure 57:
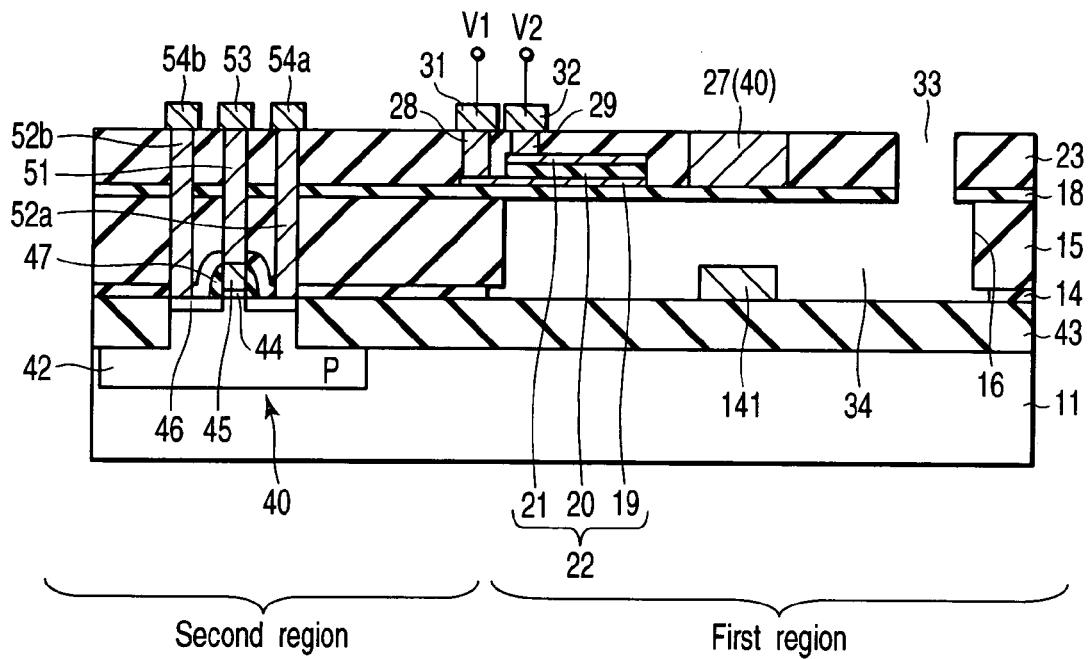
FIG. 57 is a sectional view showing an embedded structure of a MOS transistor and the MEMS element according to the fourteenth embodiment of the present invention.
Figure 58:
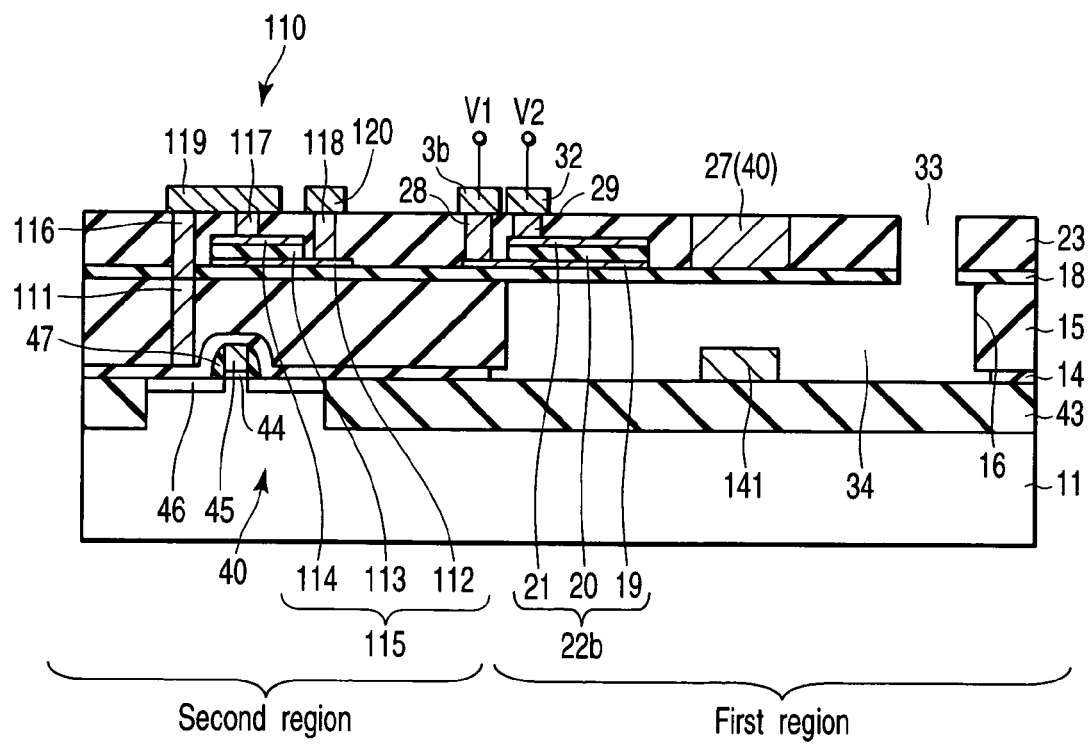
FIG. 58 is a sectional view showing an embedded structure of a ferroelectric memory and the MEMS element according to the fourteenth embodiment of the present invention.

As shown in FIG. 55, in the MEMS element according to the fourteenth embodiment, an electrode layer 27 formed above a cavity 34 functions as a mirror 140. The fourteenth embodiment is different from a MEMS element which functions as a variable capacitor or switch in that no first electrode layer 13 is formed on a thermal oxide film 12. However, even in the fourteenth embodiment, the first electrode layer 13 can be formed on the thermal oxide film 12 such that an interconnection 141 is formed on, e.g., an element isolation region 43 (FIGS. 57 and 58).

Examples of the material of the electrode layer 27 are Al, Cu, and W. If the electrode layer 27 should function as the mirror 140, Pt or Ag can also be used as the material. Pt or Ag can also be used as the material of the electrode layer 27 even when it will not be used as the mirror 140.

(2) Operation

Figure 56:
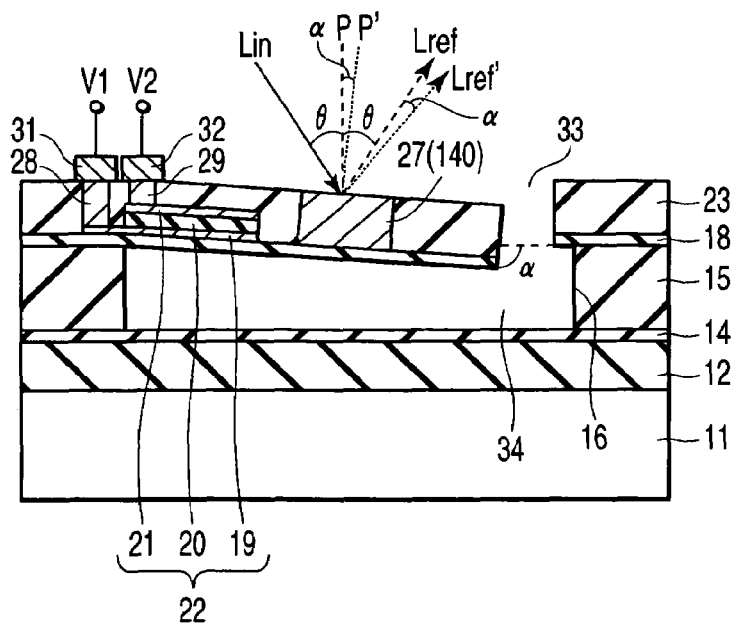
FIG. 56 is a sectional view showing the MEMS element according to the fourteenth embodiment of the present invention in a moving state.

FIG. 56 is a sectional view of the MEMS element according to the fourteenth embodiment of the present invention in a moving state. The MEMS element according to the fourteenth embodiment functions as a mirror in the following way.

(Nonmoving State)

The nonmoving state of an actuator 22 will be described first with reference to FIG. 55.

When both the voltages V1 and V2 of a lower electrode 19 and an upper electrode 21 of the actuator 22 are, e.g., 0V, the actuator 22 does not move, as shown in FIG. 55. In this state, when incident light Lin strikes the mirror 140 at an angle θ with respect to a perpendicular P to the surface of the mirror 140, reflected light Lref is reflected at the angle θ with respect to the perpendicular P.

(Moving State)

The moving state of the actuator 22 will be described next with reference to FIG. 56.

The voltage V1 of the lower electrode 19 of the actuator 22 is set to, e.g., ground potential (0V). The voltage V2 of the upper electrode 21 is set to, e.g., 3V. At this time, a piezoelectric layer 20 is distorted in the lateral direction. The end of the actuator 22 on the side of the mirror 140 moves downward. Accordingly, the actuator 22 tilts downward by an angle α. In this state, when light strikes the mirror 140 in the same direction as in FIG. 55, a perpendicular P' to the surface of the mirror 140 tilts by an angle α from the perpendicular P. For this reason, the angle of reflected light Lref' also tilts by α with respect to the angle of reflection of the reflected light Lref shown in FIG. 55. As described above, when the actuator 22 is moved, the angle of reflection of light incident on the mirror 140 can be changed.

As described above, according to the fourteenth embodiment, in the actuator 22 using the piezoelectric layer 20, the piezoelectric layer 20 is almost flat, as in the first embodiment. For this reason, even when the voltages V1 and V2 are applied to the lower electrode 19 and upper electrode 21 of the actuator 22, the piezoelectric layer 20 can be prevented from stretching nonuniformly or causing a decrease in horizontal stretch amount. In addition, when the actuator 22 moves, any crack generation at the step portion of the piezoelectric layer 20 can be suppressed. Hence, the yield can be increased. Furthermore, since the controllability of the actuator 22 increases, the controllability of the reflection angle of light by the mirror 140 can also be increased. As a result, the reliability of the MEMS element can be increased.

Various changes and modifications can be made for the mirror MEMS element according to the fourteenth embodiment, as will be described below.

As shown in FIG. 57, a MOS transistor 40 may be formed on the same substrate 11 as that of the mirror MEMS element.

As shown in FIG. 58, a ferroelectric memory 110 may be formed on the same substrate 11 as that of the mirror MEMS element. In this case, the layers 19, 20, and 21 of actuator 22 and layers 112, 113, and 114 of a ferroelectric capacitor 115 can be formed simultaneously by using the same material.

Referring to FIGS. 57 and 58, the interconnection 141 may be formed on the element isolation region 43 in the cavity 34 simultaneously with a gate electrode 45 of the MOS transistor 40 by using the same material. The interconnection 141 may be used as, e.g., the extraction interconnection layer of the upper electrode 21 or lower electrode 19 of the actuator 22. For example, the mirror 140 is used as the upper electrode of a variable capacitor, and the interconnection 141 is used as the lower electrode of the variable capacitor. In this way, the MEMS element may be used as a position sensor to sense on the basis of the capacitance of the variable capacitor whether the mirror 140 is directed to a desired position.

The MEMS element shown in FIG. 55 has a cantilever structure in which the actuator 22 is present on only one side of the mirror 140. However, a doubly-supported-beam structure in which the actuators 22 are present on both sides of the mirror 140 can also be formed. However, to simplify angle adjustment of the mirror 140, the cantilever structure is more preferably used than the doubly-supported-beam structure.

[4] Sensor

Fifteenth and sixteenth embodiments of the present invention point to structures in which a piezoelectric MEMS element functions as a sensor.

[4-1] Fifteenth Embodiment

A fifteenth embodiment points to an example of an inertial sensor (acceleration sensor).

(1) Structure

Figure 59:
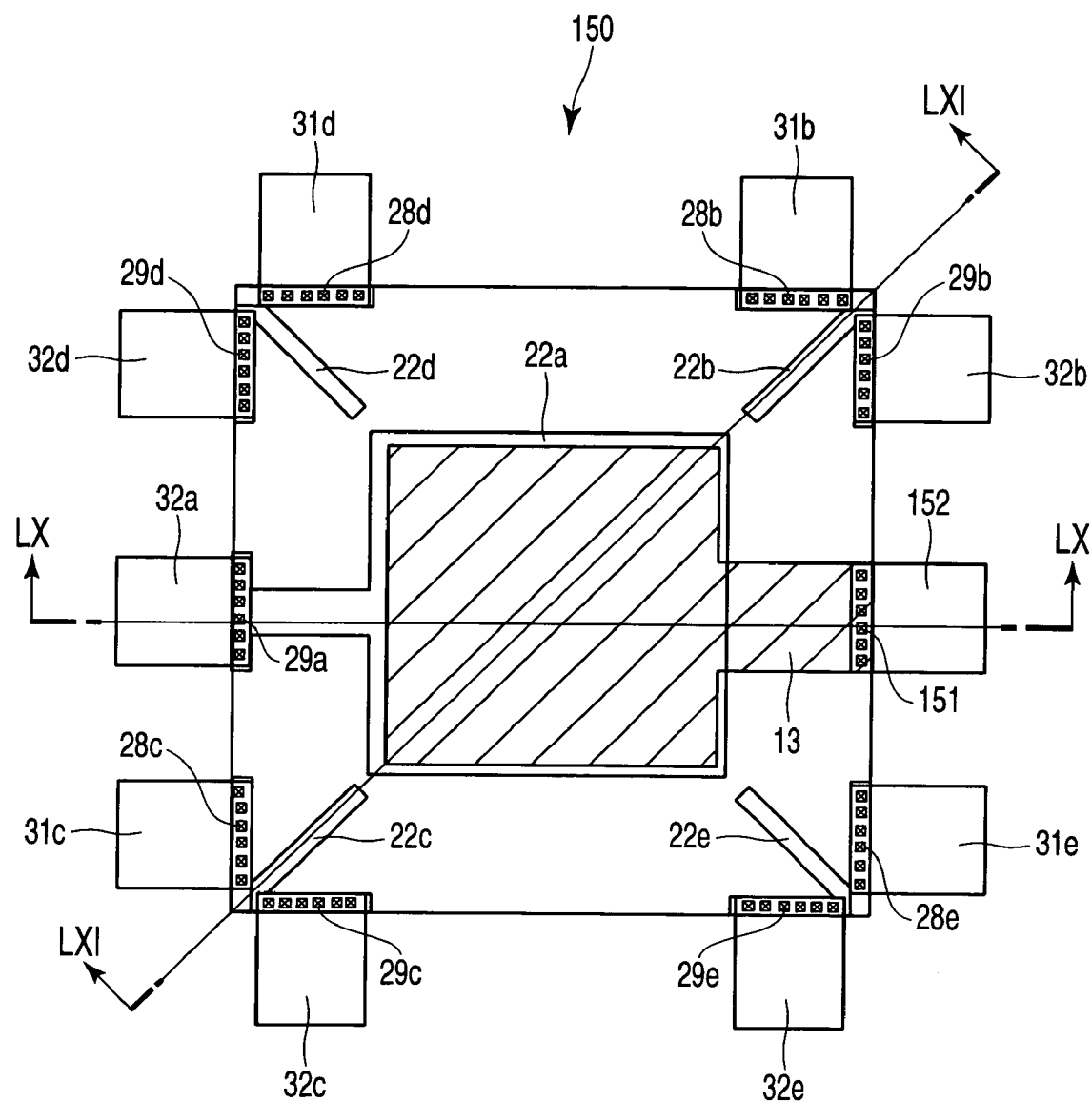
FIG. 59 is a plan view showing a MEMS element according to a fifteenth embodiment of the present invention.
Figure 61:
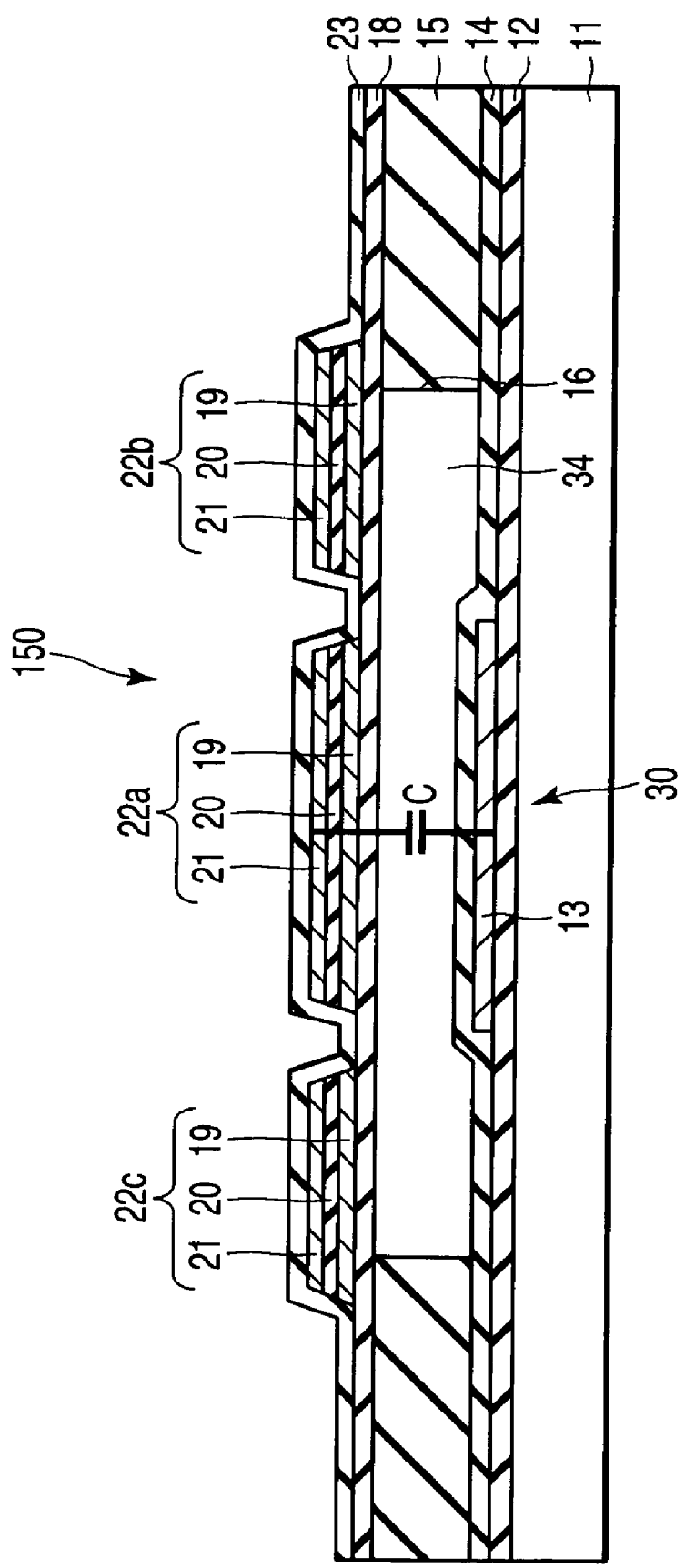
FIG. 61 is a sectional view showing the MEMS element taken along a line LXI-LXI in FIG. 59.

FIG. 59 is a plan view of a MEMS element according to the fifteenth embodiment of the present invention. FIG. 60 is a sectional view of the MEMS element taken along a line LX-LX in FIG. 59. FIG. 61 is a sectional view of the MEMS element taken along a line LXI-LXI in FIG. 59. The structure of the MEMS element according to the fifteenth embodiment will be described below.

As shown in FIGS. 59 to 61, a thermal oxide film 12 is formed on a semiconductor substrate (e.g., a silicon substrate) 11. A first electrode layer 13 of a variable capacitor 30 is formed on the thermal oxide film 12. A first insulating film 14 is formed on the first electrode layer 13 and thermal oxide film 12. A second insulating film 15 is formed on the first insulating film 14. A trench 16 which exposes part of the first insulating film 14 is formed in the second insulating film 15. A cavity 34 is present on the first electrode layer 13 such that actuators 22a, 22b, 22c, 22d, and 22e can move. A third insulating film 18 is formed on the cavity 34 and second insulating film 15.

The actuator 22a is formed on the third insulating film 18 to oppose the first electrode layer 13 of the variable capacitor 30. The long actuators 22b, 22c, 22d, and 22e are formed at the corners of the actuator 22a. Each of the actuators 22a, 22b, 22c, 22d, and 22e includes an upper electrode 21, lower electrode 19, and piezoelectric layer 20 sandwiched between the upper electrode 21 and the lower electrode 19. Of the upper electrode 21, lower electrode 19, and piezoelectric layer 20, at least the piezoelectric layer 20 is almost flat.

The upper electrode 21 of the actuator 22a at the center is connected to an interconnection layer 32a through a contact 29a. The upper electrodes 21 of the actuators 22b, 22c, 22d, and 22e at the corners are connected to interconnections 32b, 32c, 32d, and 32e through contacts 29b, 29c, 29d, and 29e, respectively. The lower electrodes 19 of the actuators 22b, 22c, 22d, and 22e at the corners are connected to interconnections 31b, 31c, 31d, and 31e through contacts 28b, 28c, 28d, and 28e, respectively.

(2) Operation

Figure 62A:
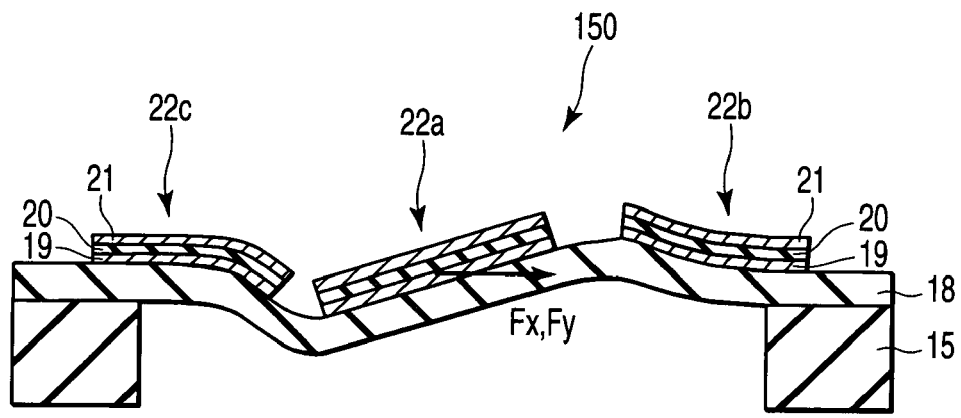
FIGS. 62A and 62B are sectional views showing a moving state of the MEMS element according to the fifteenth embodiment of the present invention.
Figure 62B:
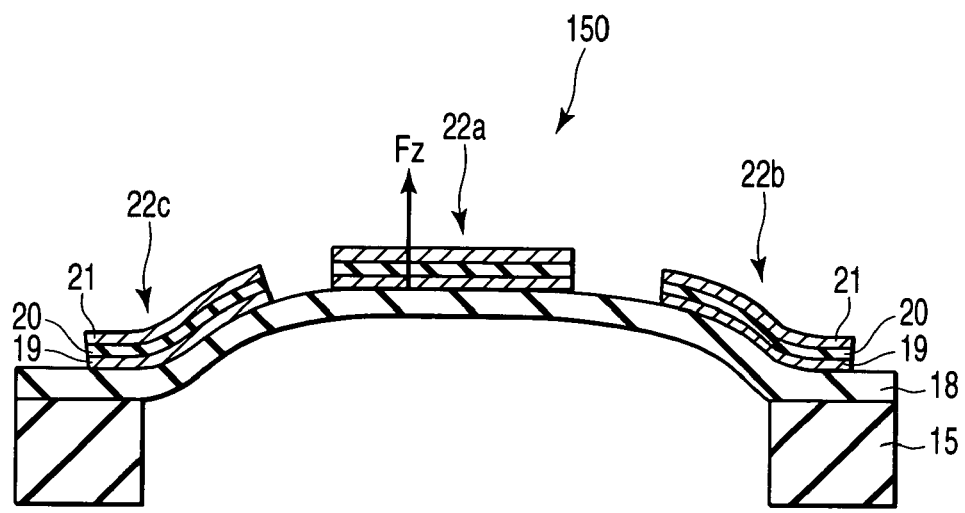

FIGS. 62A and 62B show a moving state of the MEMS element according to the fifteenth embodiment of the present invention. The MEMS element according to the fifteenth embodiment functions as an inertial sensor in the following way.

When an inertial force acts on an inertial sensor 150, the actuators 22a, 22b, 22c, 22d, and 22e move in accordance with the inertial force. At this time, the actuator 22a at the center also acts as a weight for the inertial force.

As shown in FIG. 62A, when inertial forces Fx and Fy in the X and Y directions act on the actuators 22a, 22b, 22c, 22d, and 22e, the actuators 22b, 22c, 22d, and 22e at the corners undulate and deform into a three-dimensional pattern. As a result, the voltages of the lower electrode 19 and upper electrode 21 of the piezoelectric layer 20 change in accordance with the distortion in the shapes of the actuators 22b, 22c, 22d, and 22e. The inertial forces Fx and Fy are sensed by sensing the changes in voltages.

As shown in FIG. 62B, when an inertial force Fz in the Z direction acts on the actuators 22a, 22b, 22c, 22d, and 22e, all the actuators 22b, 22c, 22d, and 22e at the corners deform into a convex (or concave) shape. As a result, all the actuators 22b, 22c, 22d, and 22e are distorted in the same direction (convex or concave shape), the voltages of the lower electrode 19 and piezoelectric layer 20 of the piezoelectric layer 20 exhibit predetermined changes. The inertial force Fz is sensed by sensing the changes in voltages.

The inertial force Fz in the Z direction can also be sensed in accordance with a change in capacitance C of the variable capacitor 30. More specifically, as shown in FIGS. 60 and 61, when the distance between the actuator 22a and the first electrode layer 13 changes, the capacitance C of the variable capacitor 30 changes. The inertial force Fz can also be sensed by sensing the change in capacitance C.

As described above, according to the fifteenth embodiment, in the actuators 22a, 22b, 22c, 22d, and 22e using the piezoelectric layers 20, the piezoelectric layers 20 are almost flat. For this reason, the piezoelectric layers 20 can be prevented from stretching nonuniformly or causing a decrease in horizontal stretch amount with respect to the inertial force. In addition, when the actuators 22a, 22b, 22c, 22d, and 22e move, any crack generation at the step portions of the piezoelectric layers 20 can be suppressed. Hence, the yield can be increased. In addition, since the reliability of the change in voltage due to the distortion of the piezoelectric layer 20 increases, the inertial force sensibility can also be increased. As a result, the reliability of the MEMS element can be increased.

Various changes and modifications can be made for the inertial sensor MEMS element according to the fifteenth embodiment, as will be described below.

Figure 63:
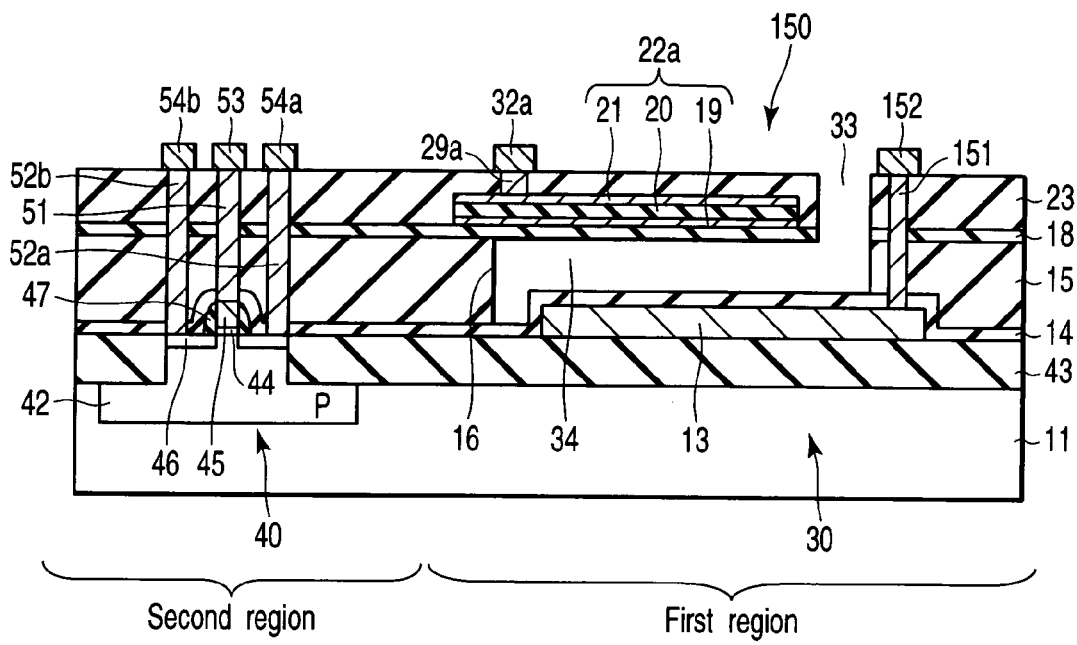
FIG. 63 is a sectional view showing an embedded structure of a MOS transistor and the MEMS element according to the fifteenth embodiment of the present invention.

As shown in FIG. 63, a MOS transistor 40 may be formed on the same substrate 11 as that of the inertial sensor MEMS element. In this case, the first electrode layer 13 of the variable capacitor 30 and a gate electrode 45 of the MOS transistor 40 can be formed simultaneously by using the same material.

Figure 64:
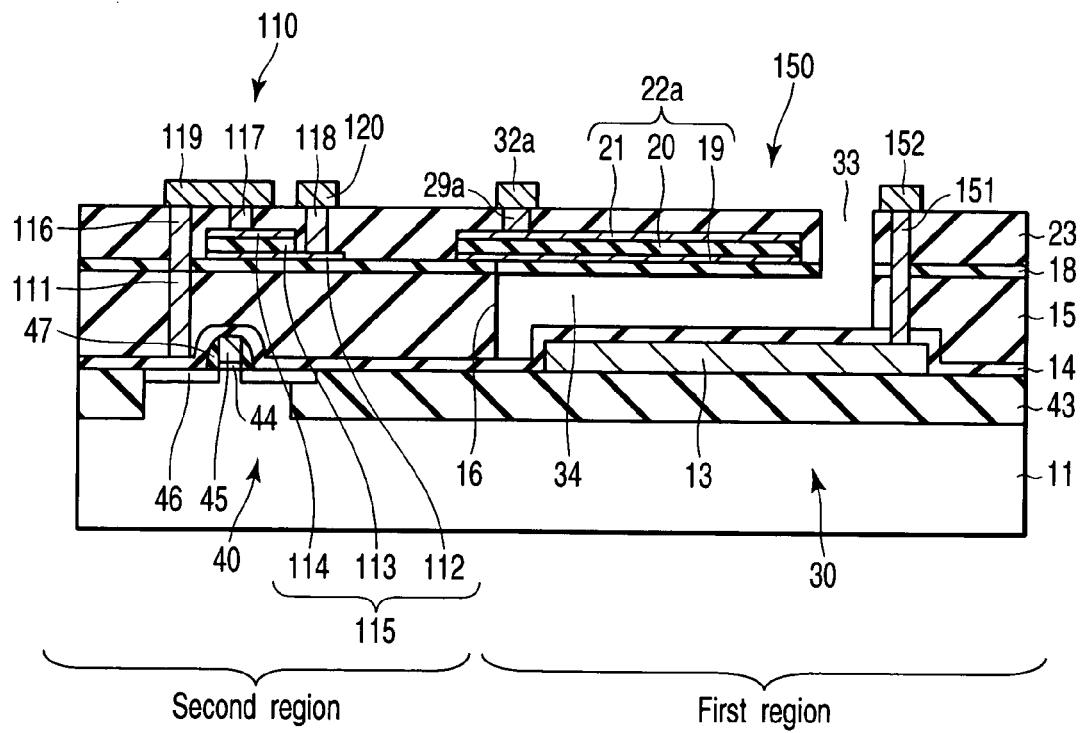
FIG. 64 is a sectional view showing an embedded structure of a ferroelectric memory and the MEMS element according to the fifteenth embodiment of the present invention.

As shown in FIG. 64, a ferroelectric memory 110 may be formed on the same substrate 11 as that of the inertial sensor MEMS element. In this case, the first electrode layer 13 of the variable capacitor 30 and the gate electrode 45 of the MOS transistor 40 can be formed simultaneously by using the same material. In addition, the layers 19, 20, and 21 of the actuators 22a, 22b, 22c, 22d, and 22e and layers 112, 113, and 114 of a ferroelectric capacitor 115 can be formed simultaneously by using the same material.

Figure 65:
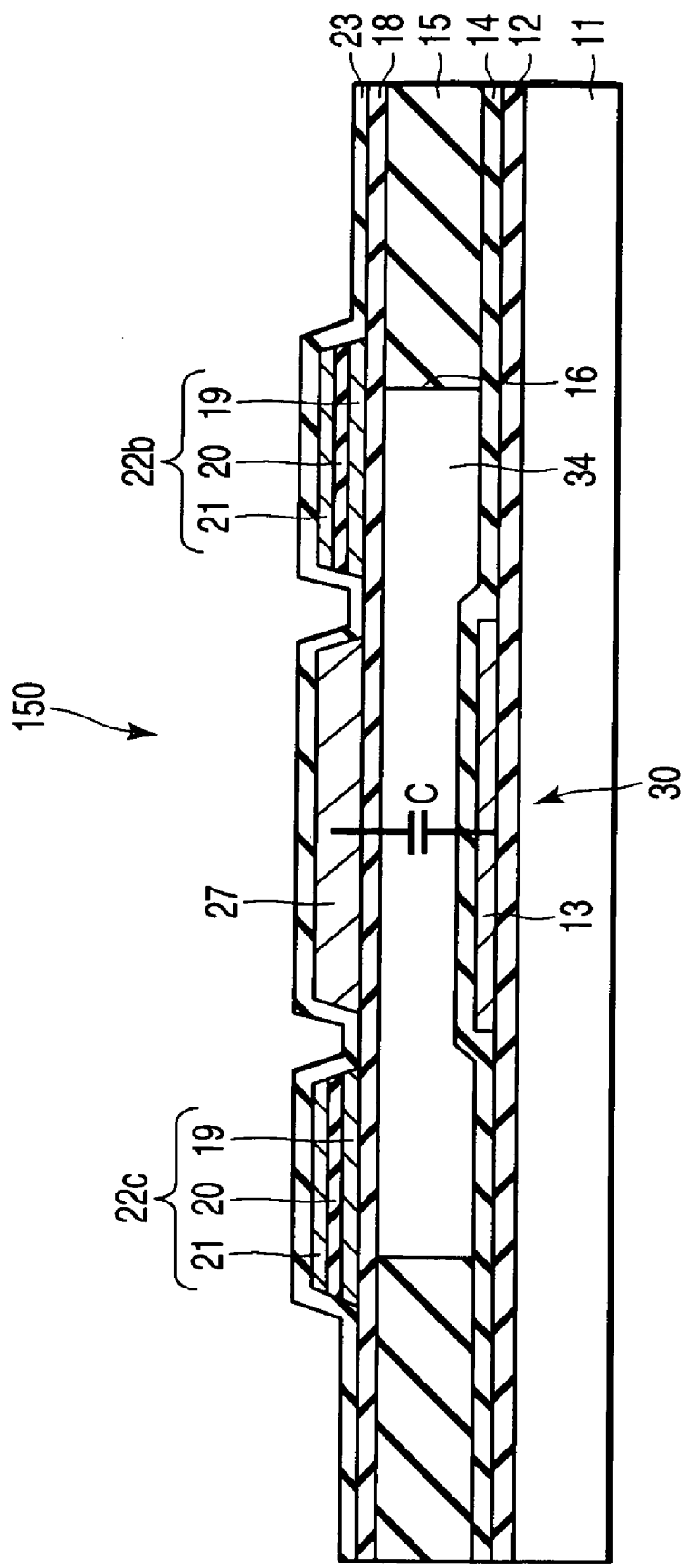
FIG. 65 is a sectional view showing a modification of the MEMS element according to the fifteenth embodiment of the present invention.

As shown in FIG. 65, the actuator 22a at the center may be changed to a second electrode layer 27 of the variable capacitor 30.

The positions of the actuators 22b, 22c, 22d, and 22e are not limited to the corners of the actuator 22a. They may be arranged at, e.g., the centers of the respective sides of the actuator 22a.

The shape of the actuator 22a is not limited to the square. It may be, e.g., a rectangle or circle. Similarly, the shape of each of the actuators 22b, 22c, 22d, and 22e is not limited to the long shape. It may be, e.g., a square or circle. However, the long shape is preferably used to increase the inertial force sensibility.

[4-2] Sixteenth Embodiment

A sixteenth embodiment points to an example of a pressure sensor.

Figure 66:
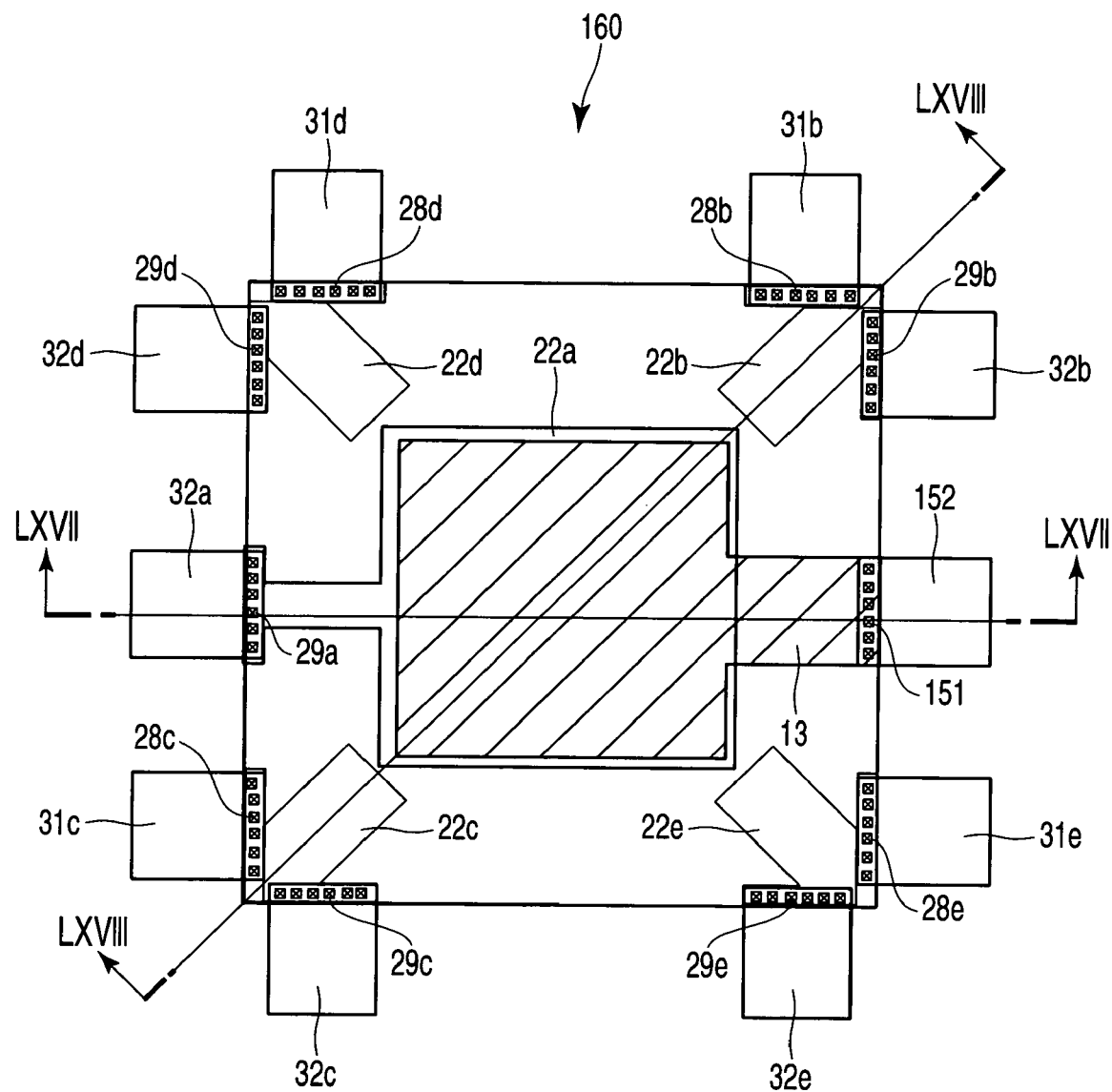
FIG. 66 is a plan view showing a MEMS element according to a sixteenth embodiment of the present invention.
Figure 67:
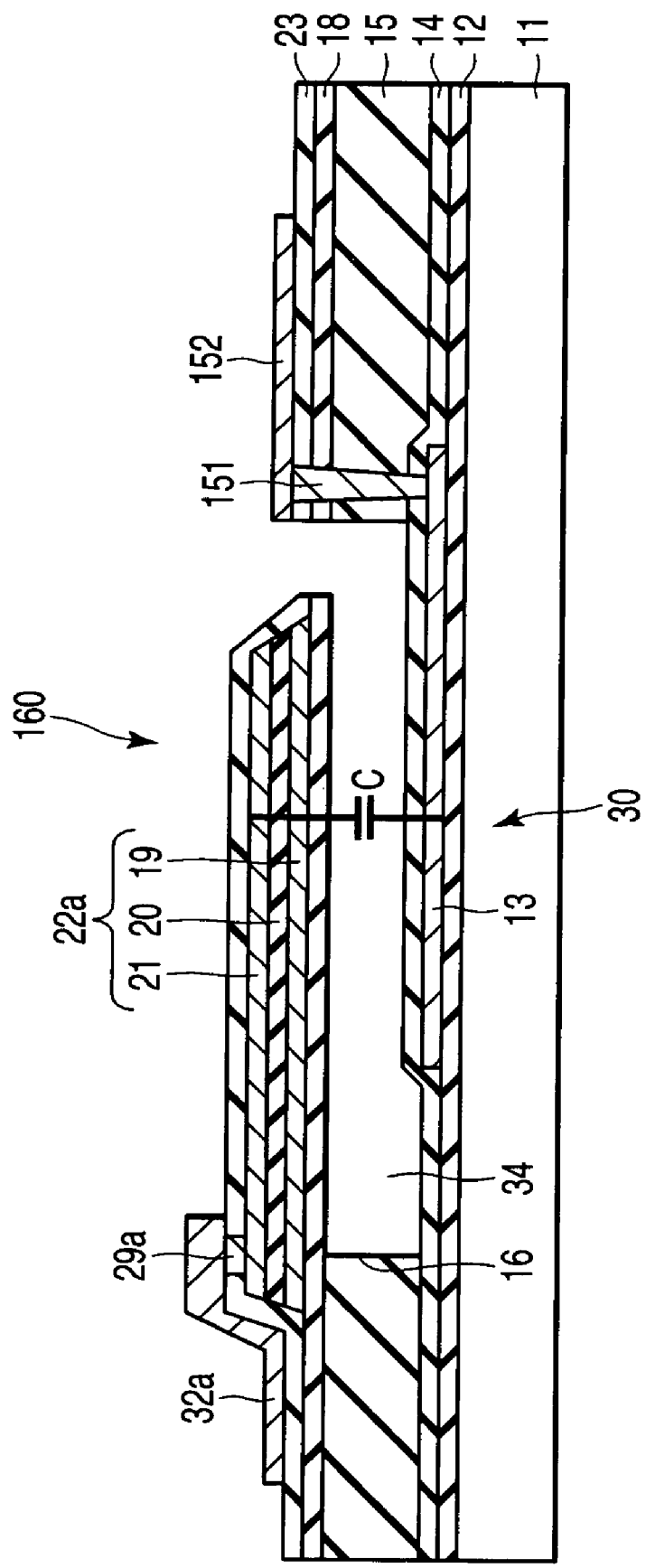
FIG. 67 is a sectional view showing the MEMS element taken along a line LXVII-LXVII in FIG. 66.
Figure 68:
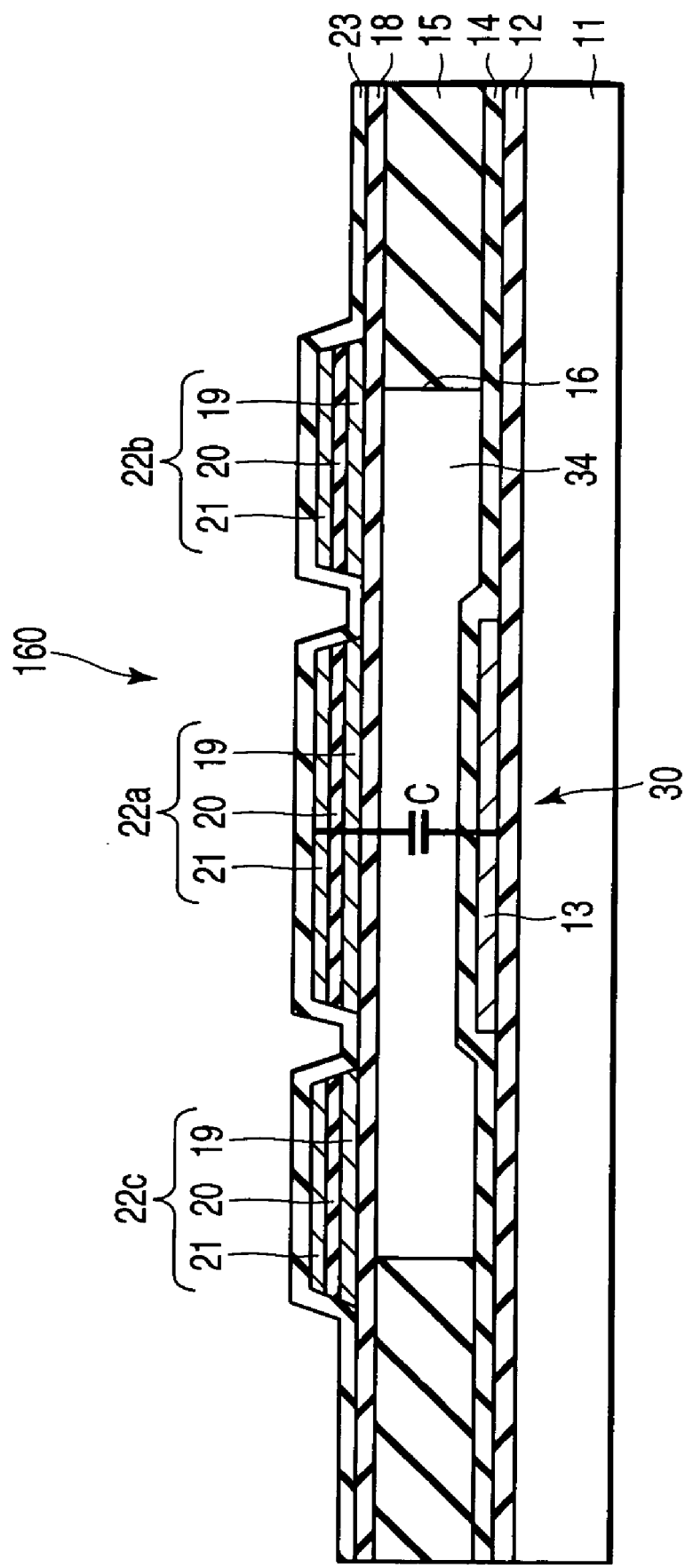
FIG. 68 is a sectional view showing the MEMS element taken along a line LXVIII-LXVIII in FIG. 66.

FIG. 66 is a plan view of a MEMS element according to the sixteenth embodiment of the present invention. FIG. 67 is a sectional view of the MEMS element taken along a line LXVII-LXVII in FIG. 66. FIG. 68 is a sectional view of the MEMS element taken along a line LXVIII-LXVIII in FIG. 66. The MEMS element according to the sixteenth embodiment will be described below.

As shown in FIGS. 66 to 68, the MEMS element according to the sixteenth embodiment functions as a pressure sensor 160. The structure of the pressure sensor 160 is almost the same as that of the above-described inertial sensor 150. Actuators 22b, 22c, 22d, and 22e at the corners may be thicker than those of the inertial sensor 150. The thinner the actuators 22b, 22c, 22d, and 22e are, the higher the sense accuracy of the sensor becomes. However, not so strict sense accuracy as the inertial sensor 150 is required of the pressure sensor 160.

The MEMS element according to the sixteenth embodiment functions as the pressure sensor 160 in accordance with the same mechanism as that of the inertial sensor 150. More specifically, when a pressure acts on the pressure sensor 160, the actuators 22a, 22b, 22c, 22d, and 22e move in accordance with the pressure. As a result, the voltages of a lower electrode 19 and an upper electrode 21 of a piezoelectric layer 20 change in accordance with the distortion of the actuators 22b, 22c, 22d, and 22e. The pressure is sensed by sensing the changes in voltages. In addition, when the distance between the actuator 22a and a first electrode layer 13 changes, a capacitance C of a variable capacitor 30 changes. The pressure can also be sensed by sensing the change in capacitance C.

As described above, according to the sixteenth embodiment, the same effect as that of the fifteenth embodiment can be obtained.

Various changes and modifications can be made for the pressure sensor MEMS element according to the sixteenth embodiment, as will be described below.

Figure 69:
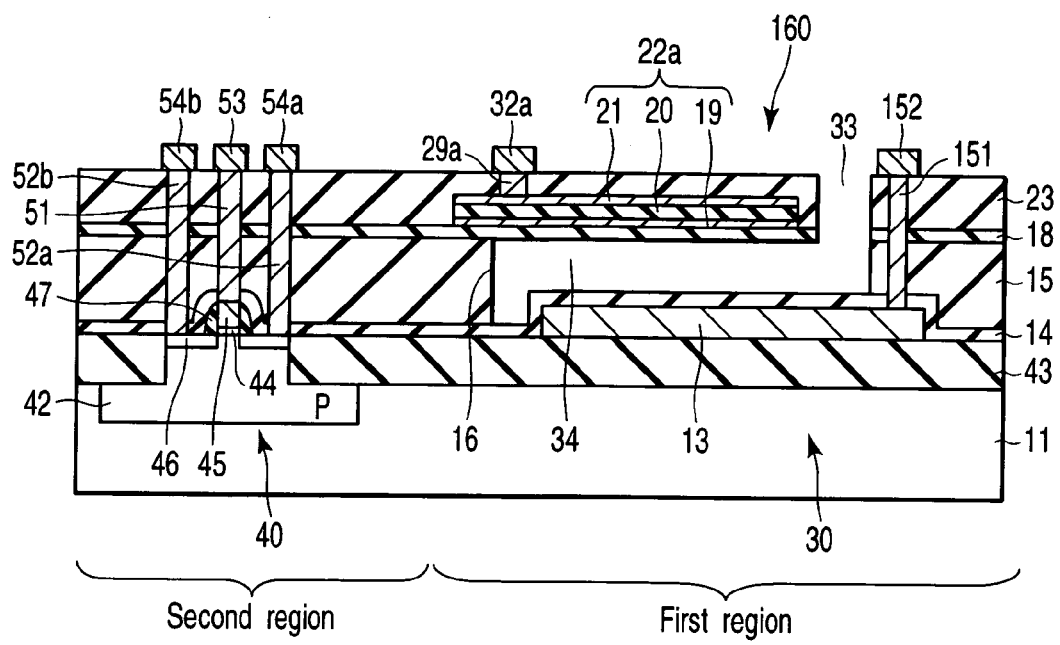
FIG. 69 is a sectional view showing an embedded structure of a MOS transistor and the MEMS element according to the sixteenth embodiment of the present invention.

As shown in FIG. 69, a MOS transistor 40 may be formed on the same substrate 11 as that of the pressure sensor MEMS element. In this case, a first electrode layer 13 of the variable capacitor 30 and a gate electrode 45 of the MOS transistor 40 can be formed simultaneously by using the same material.

Figure 70:
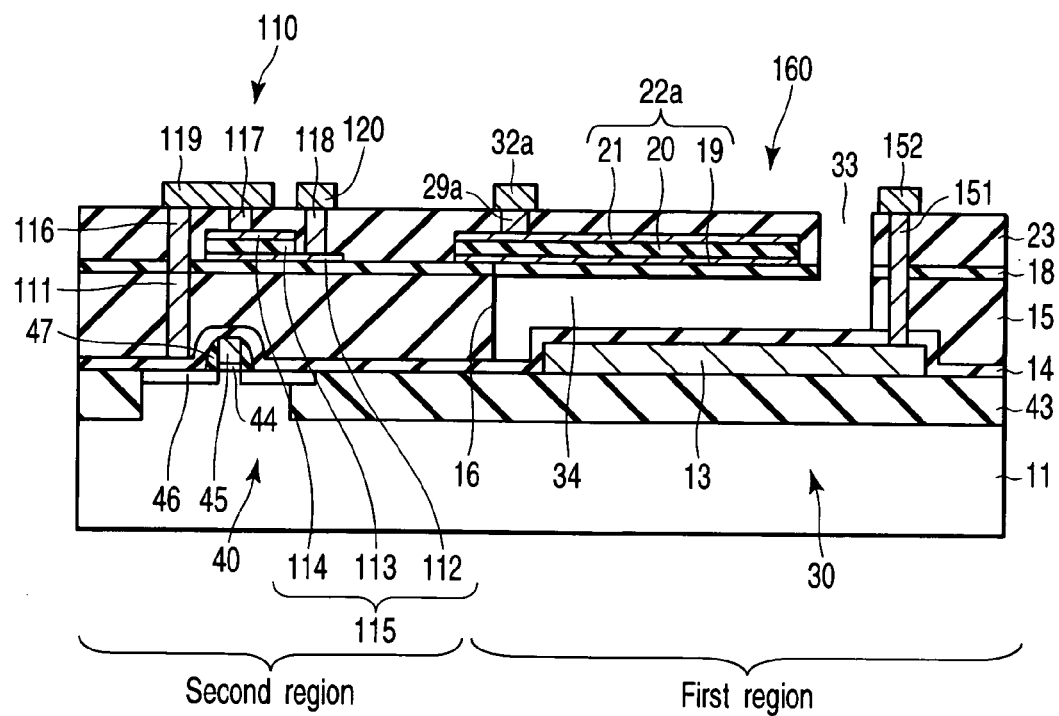
FIG. 70 is a sectional view showing an embedded structure of a ferroelectric memory and the MEMS element according to the sixteenth embodiment of the present invention.

As shown in FIG. 70, a ferroelectric memory 110 may be formed on the same substrate 11 as that of the pressure sensor MEMS element. In this case, the first electrode layer 13 of the variable capacitor 30 and the gate electrode 45 of the MOS transistor 40 can be formed simultaneously by using the same material. In addition, the layers 19, 20, and 21 of the actuators 22a, 22b, 22c, 22d, and 22e and layers 112, 113, and 114 of a ferroelectric capacitor 115 can be formed simultaneously by using the same material.

The actuator 22a at the center may be changed to a second electrode layer 27 of the variable capacitor 30 (FIG. 65).

The positions of the actuators 22b, 22c, 22d, and 22e are not limited to the corners of the actuator 22a. They may be arranged at, e.g., the centers of the respective sides of the actuator 22a.

The shape of the actuator 22a is not limited to the square. It may be, e.g., a rectangle or circle. Similarly, the shape of each of the actuators 22b, 22c, 22d, and 22e is not limited to the long shape. It may be, e.g., a square or circle.

[5] Ultrasonic Transducer

A seventeenth embodiment of the present invention points to a structure in which a piezoelectric MEMS element functions as an ultrasonic transducer.

(1) Structure

Figure 71:
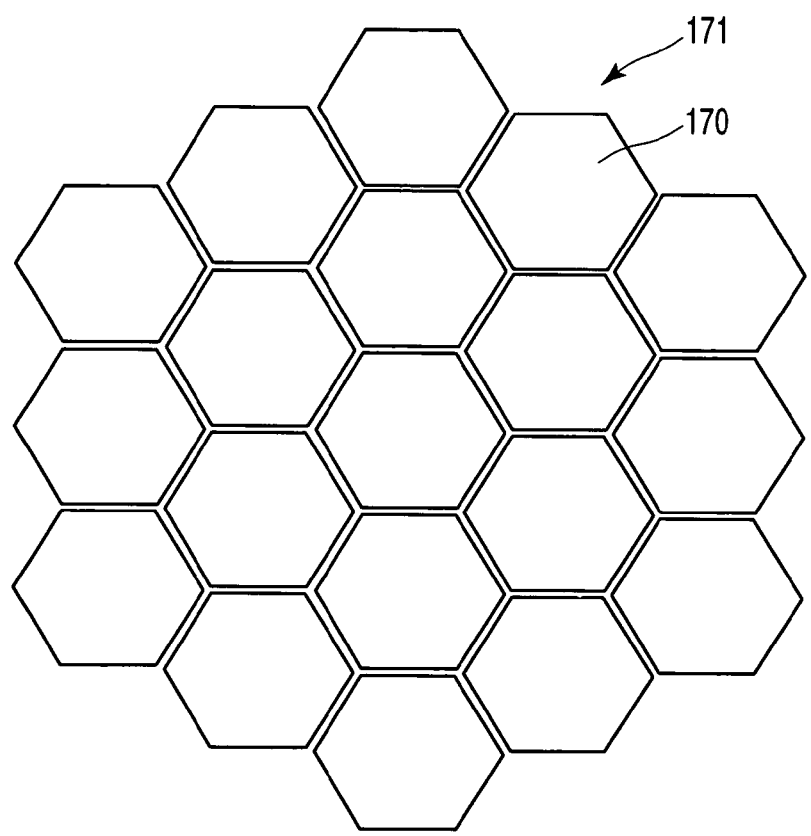
FIG. 71 is a plan view showing a MEMS element including a transducer array according to a seventeenth embodiment of the present invention.
Figure 72:
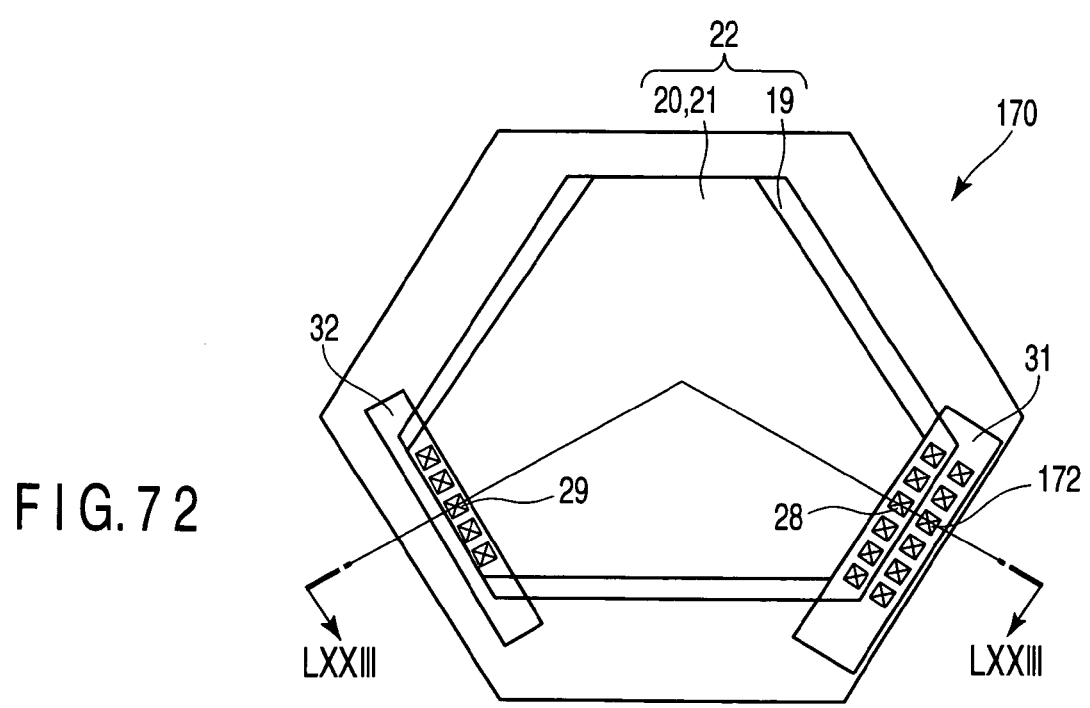
FIG. 72 is a plan view showing the MEMS element according to the seventeenth embodiment of the present invention.
Figure 73:
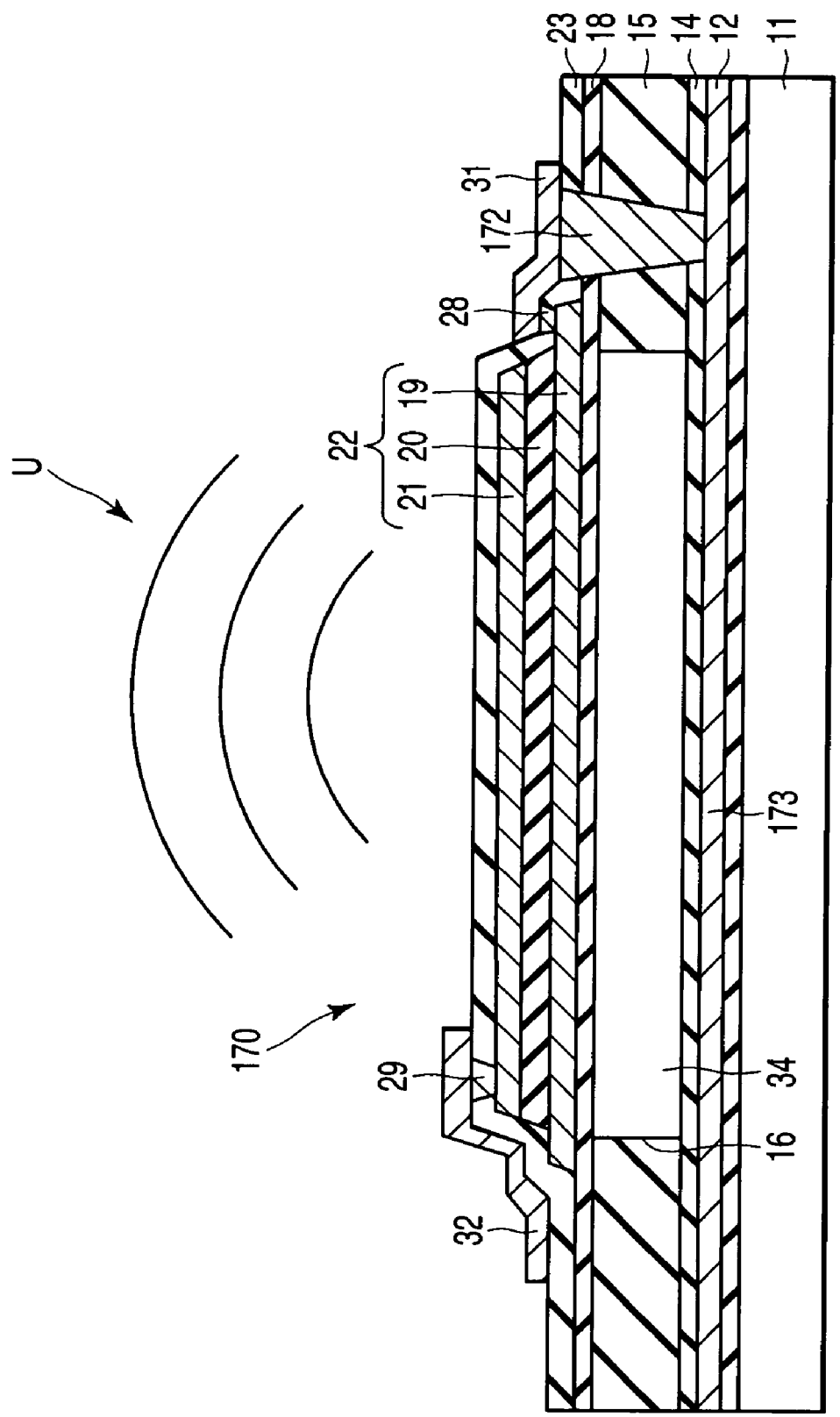
FIG. 73 is a sectional view showing the MEMS element taken along a line LXXIII-LXXIII in FIG. 72.

FIG. 71 is a plan view of a MEMS element including a transducer array according to the seventeenth embodiment of the present invention. FIG. 72 is a plan view of the MEMS element according to the seventeenth embodiment of the present invention. FIG. 73 is a sectional view of the MEMS element taken along a line LXXIII-LXXIII in FIG. 72. The structure of the MEMS element according to the seventeenth embodiment will be described below.

As shown in FIGS. 71 to 73, the MEMS element according to the seventeenth embodiment functions as an ultrasonic transducer 171.

As shown in FIG. 71, the transducer array 171 is formed by tightly arraying a plurality of ultrasonic transducers 170. Each ultrasonic transducer 170 has, e.g., a polygonal shape and, for example, a hexagonal shape in this case.

As shown in FIGS. 72 and 73, in each ultrasonic transducer 170, an actuator 22 is arranged across over a cavity 34 formed in an insulating film 15. The actuator 22 includes a lower electrode 19, an upper electrode 21, and a piezoelectric layer 20 sandwiched between the lower electrode 19 and the upper electrode 21. Of the three layers, at least the piezoelectric layer 20 is almost flat.

A thermal oxide film 12 is formed on a semiconductor substrate (e.g., a silicon substrate) 11. An interconnection layer 173 is formed on the thermal oxide film 12. A first insulating film 14 is formed on the interconnection layer 173. The second insulating film 15 is formed on the first insulating film 14. A trench 16 which exposes part of the first insulating film 14 is formed in the second insulating film 15. The cavity 34 is present so that actuator 22 can move. A third insulating film 18 is formed on the cavity 34 and second insulating film 15. The lower electrode 19 of the actuator 22 is connected to the interconnection layer 173 through a contact 28, interconnection layer 31, and contact 172. The upper electrode 21 of the actuator 22 is connected to an interconnection layer 32 through a contact 29.

(2) Operation

The MEMS element according to the seventeenth embodiment functions as the ultrasonic transducer 170 in the following manner.

When a pulse voltage is applied to the upper electrode 21 and lower electrode 19 of the actuator 22, the actuator 22 oscillates and generates an ultrasonic wave U. Hence, the electrical signal is converted into sound. On the other hand, oscillation (sound) reflected by a sample (not shown) is sensed by the actuator 22 and converted into an electrical signal by the piezoelectric layer 20. Hence, the sound is converted into an electrical signal. In this way, the actuator 22 converts an electrical signal and sound so that the MEMS element functions as the ultrasonic transducer 170.

As described above, according to the seventeenth embodiment, in the actuator 22 using the piezoelectric layer 20, at least the piezoelectric layer 20 is almost flat. For this reason, the piezoelectric layer 20 can be suppressed from vibrating nonuniformly with respect to oscillation. In addition, when the actuator 22 moves, any crack generation at the step portion of the piezoelectric layer 20 can be suppressed. Hence, the yield can be increased. As a result, the reliability of the MEMS element can be increased.

Various changes and modifications can be made for the MEMS element of the ultrasonic transducer 170 according to the seventeenth embodiment, as will be described below.

Figure 74:
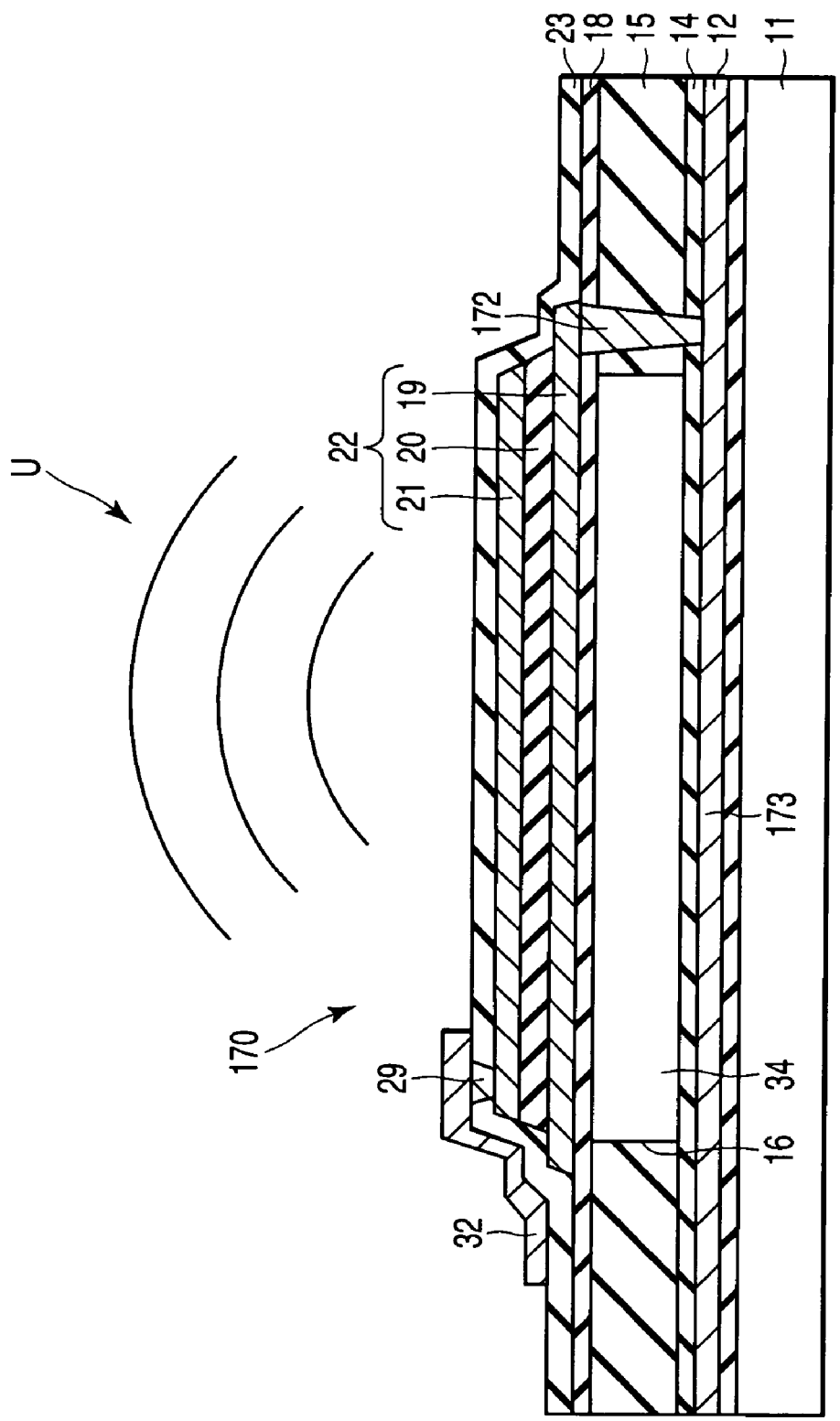
FIG. 74 is a sectional view showing a modification of the MEMS element according to the seventeenth embodiment of the present invention.

As shown in FIG. 74, the lower electrode 19 and interconnection layer 173 of the actuator 22 may be connected directly through the contact 172 without being extracted above and connected.

Figure 75:
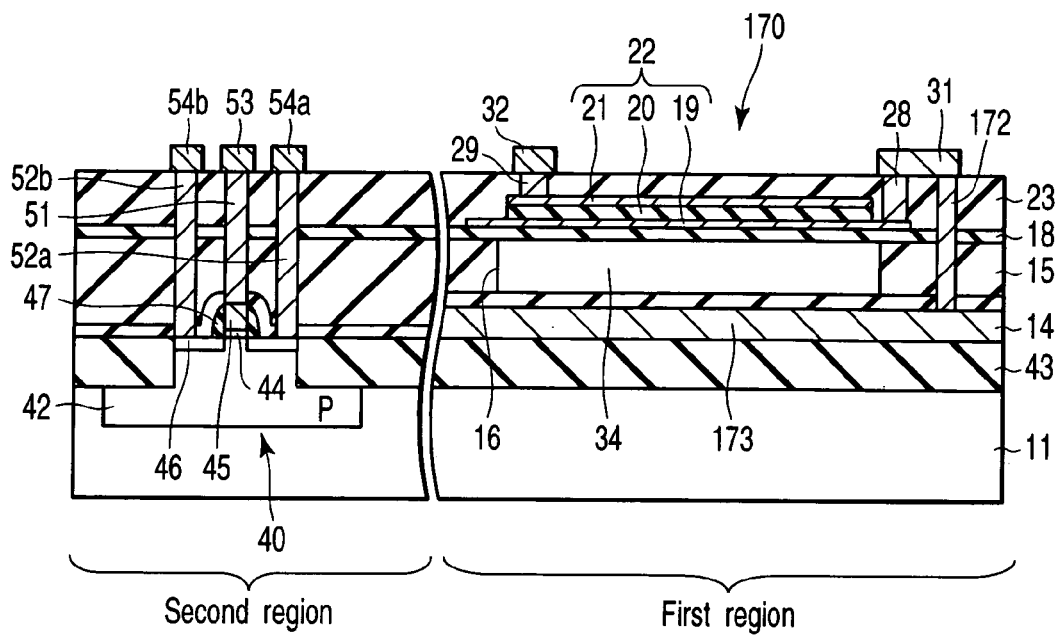
FIG. 75 is a sectional view showing an embedded structure of a MOS transistor and the MEMS element according to the seventeenth embodiment of the present invention.

As shown in FIG. 75, a MOS transistor 40 may be formed on the same substrate 11 as that of the MEMS element of the ultrasonic transducer 170. In this case, the interconnection layer 173 and a gate electrode 45 of the MOS transistor 40 can be formed simultaneously by using the same material.

Figure 76:
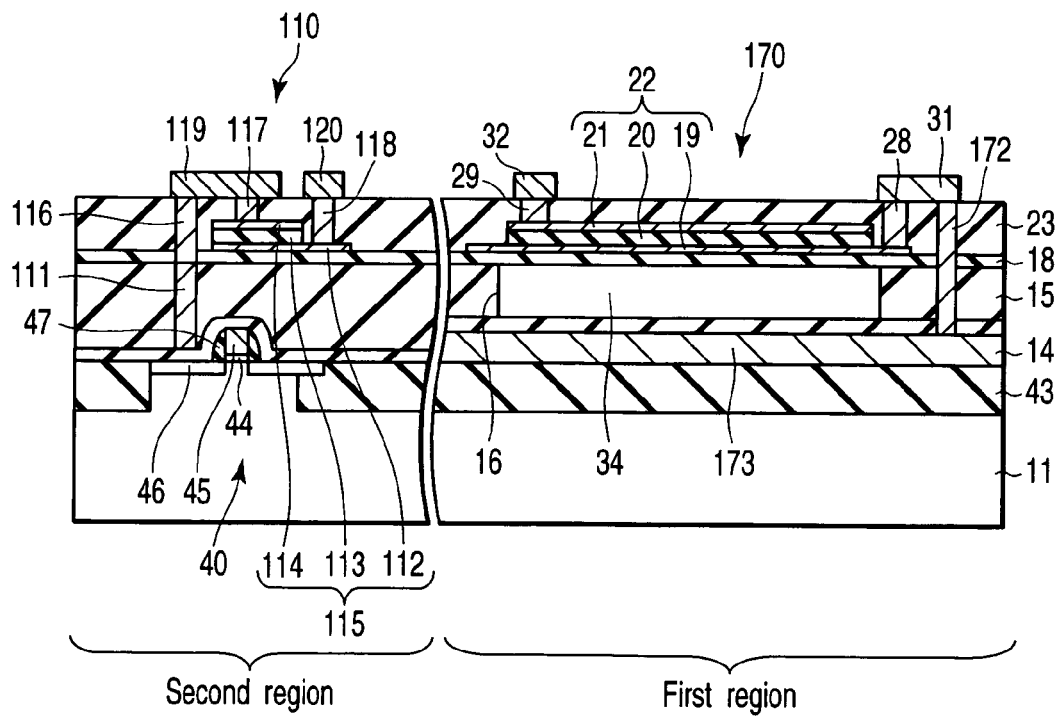
FIG. 76 is a sectional view showing an embedded structure of a ferroelectric memory and the MEMS element according to the seventeenth embodiment of the present invention.

As shown in FIG. 76, a ferroelectric memory 110 may be formed on the same substrate 11 as that of the MEMS element of the ultrasonic transducer 170. In this case, the interconnection layer 173 and the gate electrode 45 of the MOS transistor 40 can be formed simultaneously by using the same material. In addition, the layers 19, 20, and 21 of the actuator 22 and layers 112, 113, and 114 of a ferroelectric capacitor 115 can be formed simultaneously by using the same material.

[6] FBAR Filter

An eighteenth embodiment of the present invention points to a structure in which a piezoelectric MEMS element functions as an FBAR filter. The FBAR filter is a resonator using a piezoelectric thin film and uses oscillation in a microwave band of, e.g., 2 GHz.

(1) Structure

Figure 77:
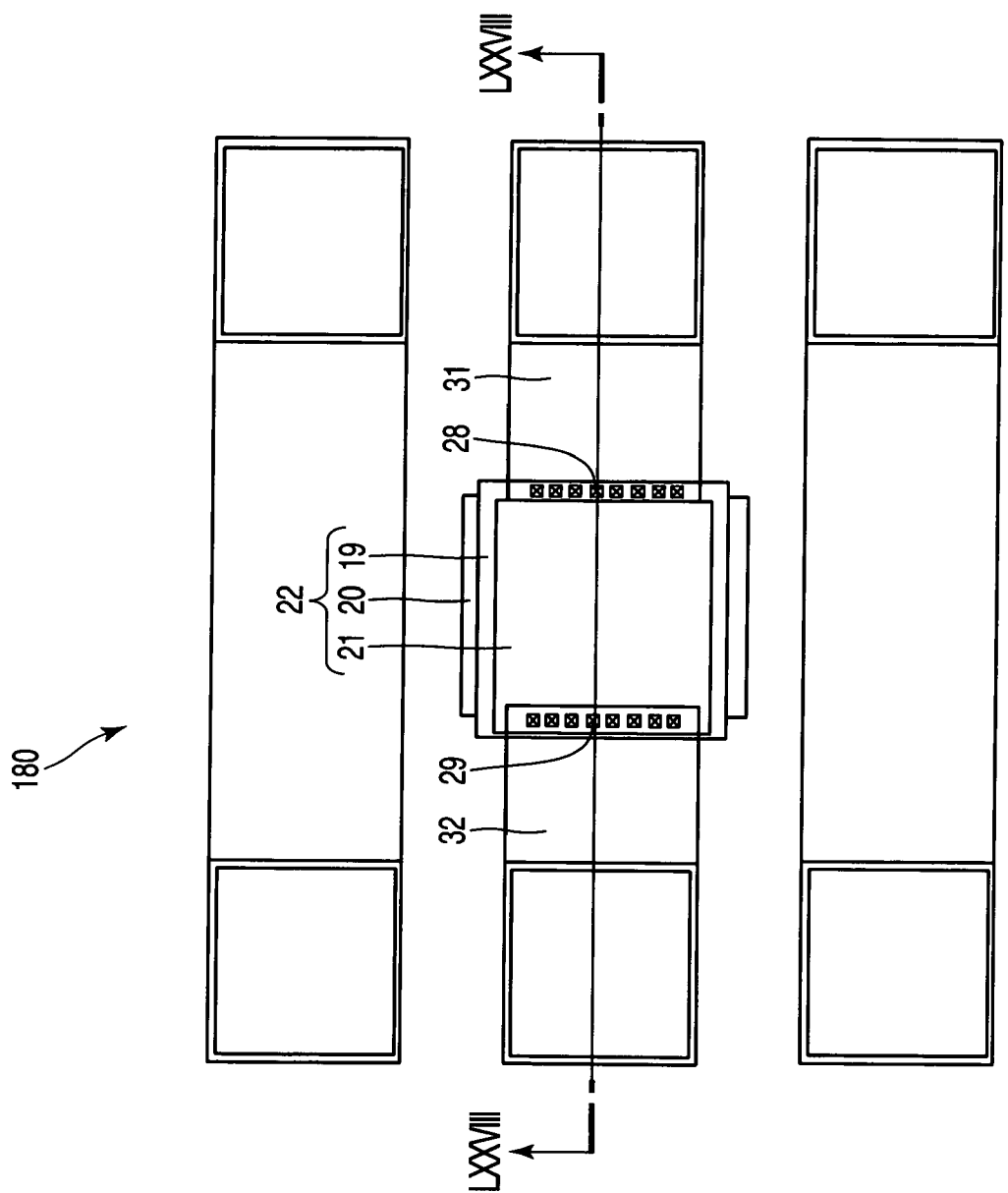
FIG. 77 is a plan view showing a MEMS element according to an eighteenth embodiment of the present invention.
Figure 78:
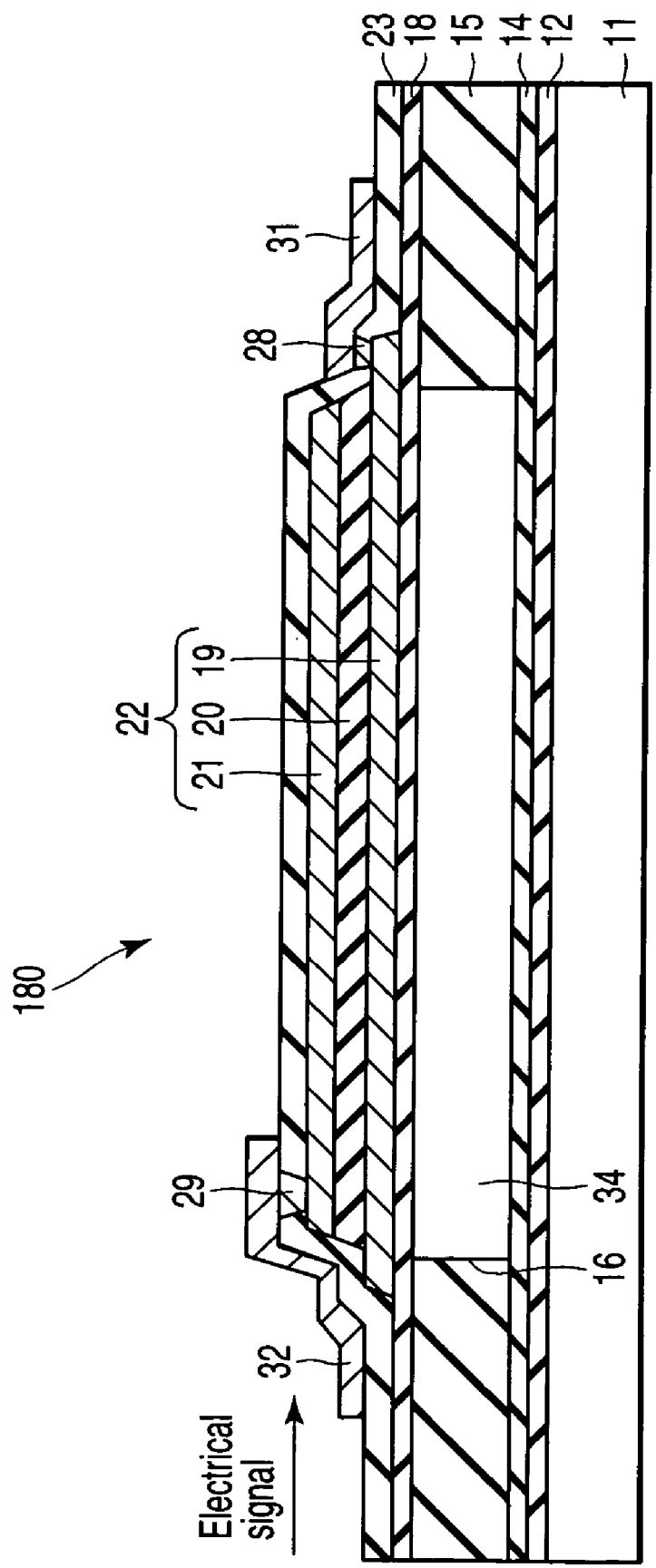
FIG. 78 is a sectional view showing the MEMS element taken along a line LXXVIII-LXXVIII in FIG. 77.

FIG. 77 is a plan view of a MEMS element according to the eighteenth embodiment of the present invention. FIG. 78 is a sectional view of the MEMS element taken along a line LXXVIII-LXXVIII in FIG. 77. The structure of the MEMS element according to the eighteenth embodiment will be described below.

As shown in FIGS. 77 and 78, in an FBAR filter 180, an actuator 22 is arranged across over a cavity 34 formed in an insulating film 15. The actuator 22 includes a lower electrode 19, an upper electrode 21, and a piezoelectric layer 20 sandwiched between the lower electrode 19 and the upper electrode 21. Of the three layers, at least the piezoelectric layer 20 is almost flat.

A thermal oxide film 12 is formed on a semiconductor substrate (e.g., a silicon substrate) 11. A first insulating film 14 is formed on the thermal oxide film 12. The second insulating film 15 is formed on the first insulating film 14. A trench 16 which exposes part of the first insulating film 14 is formed in the second insulating film 15. The cavity 34 is present so that the actuator 22 can move. A third insulating film 18 is formed on the cavity 34 and second insulating film 15. The lower electrode 19 of the actuator 22 is connected to an interconnection layer 31 through a contact 28. The upper electrode 21 of the actuator 22 is connected to an interconnection layer 32 through a contact 29.

(2) Operation

The MEMS element according to the eighteenth embodiment functions as the FBAR filter 180 in the following manner. First, an electrical signal is input from the upper electrode 21 of the actuator 22. The electrical signal passes through the MEMS element only when the frequency resonates with the piezoelectric layer 20. In this way, the MEMS element is used as the FBAR filter 180.

As described above, according to the eighteenth embodiment, in the actuator 22 using the piezoelectric layer 20, at least the piezoelectric layer 20 is almost flat. For this reason, the piezoelectric layer 20 can be suppressed from vibrating nonuniformly with respect to oscillation. In addition, when the actuator 22 moves, any crack generation at the step portion of the piezoelectric layer 20 can be suppressed. Hence, the yield can be increased. As a result, the reliability of the MEMS element can be increased.

Various changes and modifications can be made for the MEMS element of the FBAR filter 180 according to the eighteenth embodiment, as will be described below.

Figure 79:
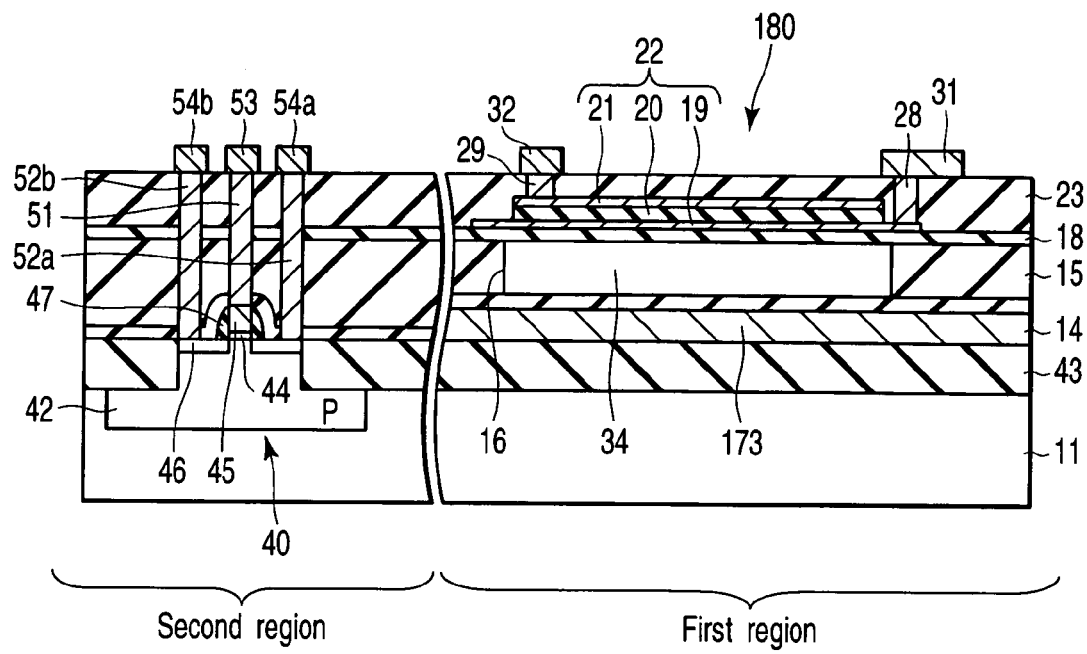
FIG. 79 is a sectional view showing an embedded structure of a MOS transistor and the MEMS element according to the eighteenth embodiment of the present invention.

As shown in FIG. 79, a MOS transistor 40 may be formed on the same substrate 11 as that of the MEMS element of the FBAR filter 180. In this case, an extraction interconnection layer 173 of the upper electrode 21 or lower electrode 19 of the actuator 22 is formed on an element isolation region 43 in the cavity 34. The extraction interconnection layer 173 and a gate electrode 45 of the MOS transistor 40 can be formed simultaneously by using the same material.

Figure 80:
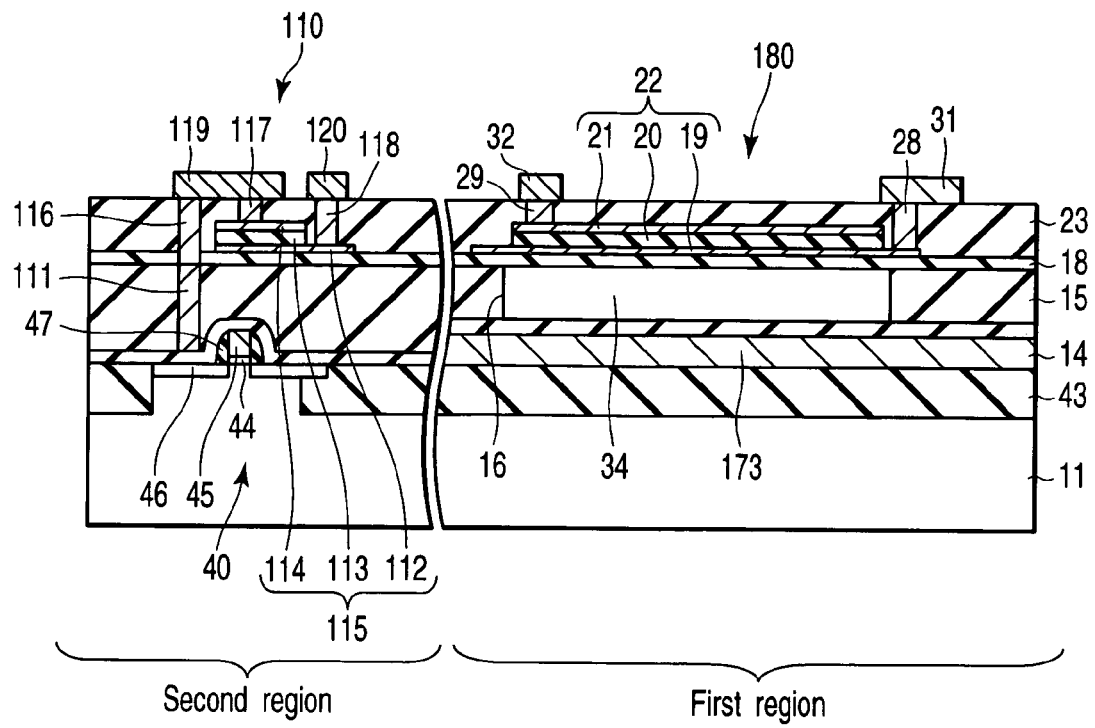
FIG. 80 is a sectional view showing an embedded structure of a ferroelectric memory and the MEMS element according to the eighteenth embodiment of the present invention.

As shown in FIG. 80, a ferroelectric memory 110 may be formed on the same substrate 11 as that of the MEMS element of the FBAR filter 180. In this case, the layers 19, 20, and 21 of the actuator 22 and layers 112, 113, and 114 of a ferroelectric capacitor 115 can be formed simultaneously by using the same material. When the extraction interconnection layer 173 of the upper electrode 21 or lower electrode 19 of the actuator 22 is formed on the element isolation region 43 in the cavity 34, the extraction interconnection layer 173 and the gate electrode 45 of the MOS transistor 40 can be formed simultaneously by using the same material.

The present invention is not limited to the above-described embodiments, and various changes and modifications can be made in practicing the present invention without departing from the sprit and scope of the invention.

Figure 81:
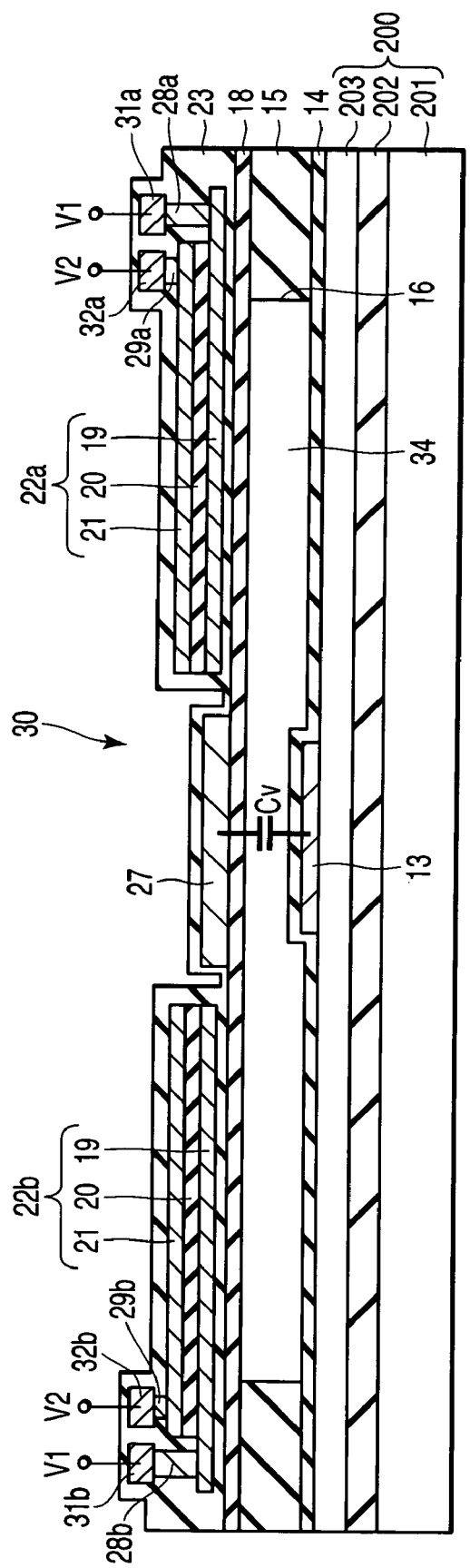
FIGS. 81 to 85 are sectional views showing modifications of the MEMS element according to each of the embodiments of the present invention.

(1) In the above embodiments, as shown in FIG. 81, an SOI (Silicon On Insulator) substrate 200 including a substrate 201, buried insulating film 202, and semiconductor layer 203 may be used in place of the semiconductor substrate 11. In this case, the isolation characteristic can be increased by surrounding the MEMS element by the buried insulating film 202 and STI region (not shown). Hence, any adverse effect such as noise from another element can be suppressed.

(2) In the above embodiments, the semiconductor substrate 11 can have a normal resistivity (e.g., 20Ω·cm or less). However, a substrate having a high resistivity of 500Ω·cm or more is preferably used.

(3) In the above embodiments, referring to, e.g., FIG. 5, the actuators 22a and 22b are moved download by increasing the voltage V2 of the upper electrodes 21 from 0V to 3V. However, the movement of the actuators is not limited to this. For example, the actuators may be warped upward by controlling the voltages V1 and V2 of the electrodes 19 and 21 and using, e.g., the internal stress in the film which forms the second electrode layer 27 of the variable capacitor 30.

Figure 82:
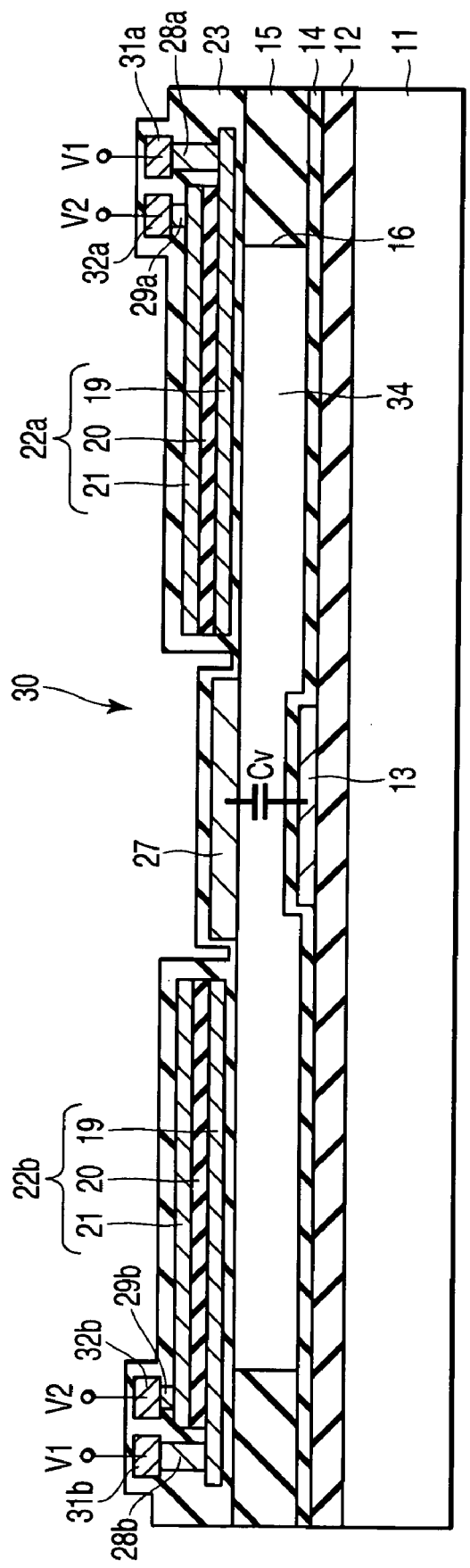
Figure 83:
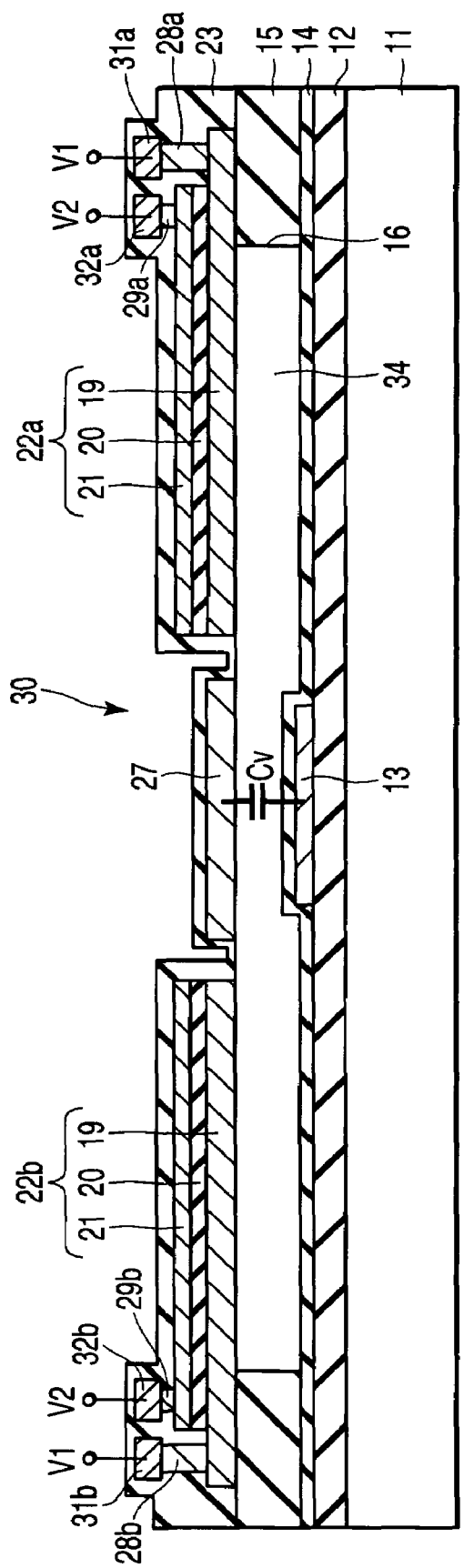

(4) In the above embodiments, as shown in FIG. 82, the insulating film 18 which supports the actuators 22a and 22b may be omitted. In this case, to improve the mobility of the actuators 22a and 22b, the lower electrode 19 is made thicker than the upper electrode 21 (FIG. 83), or the lower electrode 19 and upper electrode 21 are made by using different materials instead of forming the third insulating film 18. Even when the insulating film 18 is not omitted, the lower electrode 19 can be made thicker than the upper electrode 21, or the lower electrode 19 and upper electrode 21 can be made by using different materials.

Figure 84:
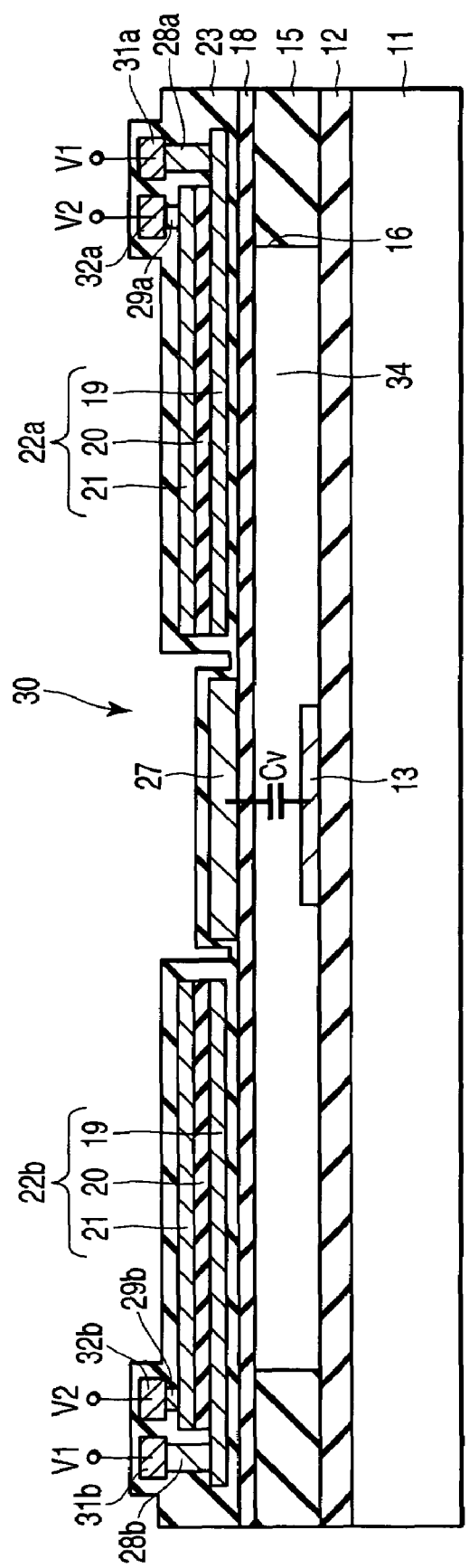

(5) In the above embodiments, the first insulating film 14 is formed to protect the first electrode layer 13 and the like from oxidation. However, the first insulating film 14 may be omitted, as shown in FIG. 84. When the insulating film 18 (the insulating film 14 may also be present) is formed between the first electrode layer 13 and the second electrode layer 27, the ranges of the applied voltage values of the first electrode layer 13 and second electrode layer 27 can be made wide. For this reason, the controllability of the actuator increases.

Figure 85:
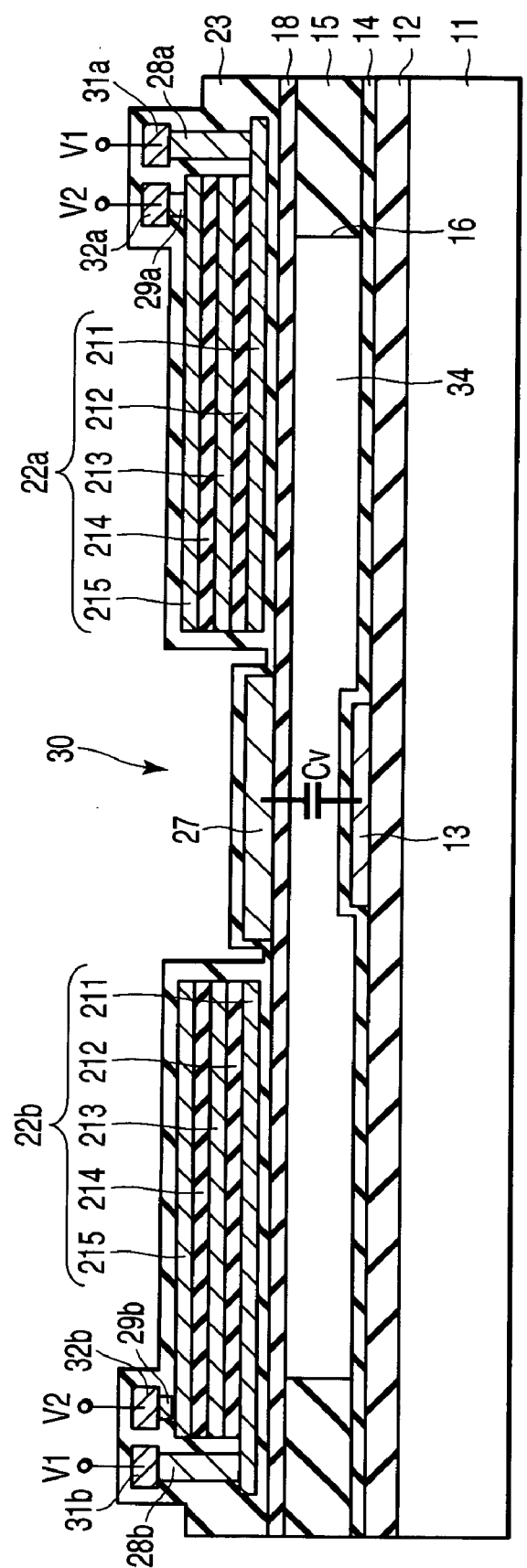

(6) The actuator has a so-called unimorph structure in which the piezoelectric layer 20 is sandwiched between the lower electrode 19 and the upper electrode 21. However, the actuator may have a so-called bimorph structure. More specifically, as shown in FIG. 85, each of the actuators 22a and 22b includes a lower electrode 211, piezoelectric layer 212, intermediate electrode 213, piezoelectric layer 214, and upper electrode 215. The voltages V1 and V2 are applied to the lower electrode 211 and the upper electrode 215. In this case, the actuators 22a and 22b can largely be driven by a low voltage by using a so-called bimorph effect.

(7) In the above embodiment, both the actuator having a doubly-supported-beam structure and the actuator having a cantilever structure are preferably flat in the nonmoving state. However, they need not always be flat.

Figure 86:
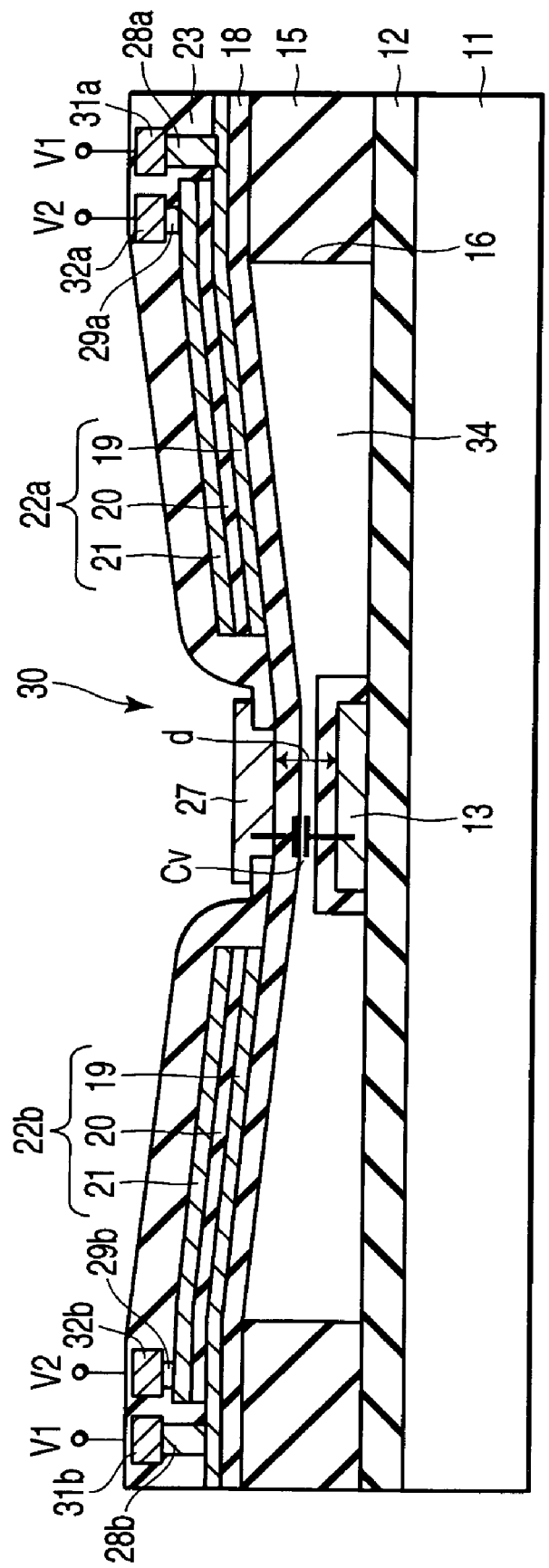
FIG. 86 is a sectional view showing the MEMS element according to each of the embodiments of the present invention in which an actuator having a doubly-supported-beam structure is distorted downward in a nonmoving state.
Figure 87:
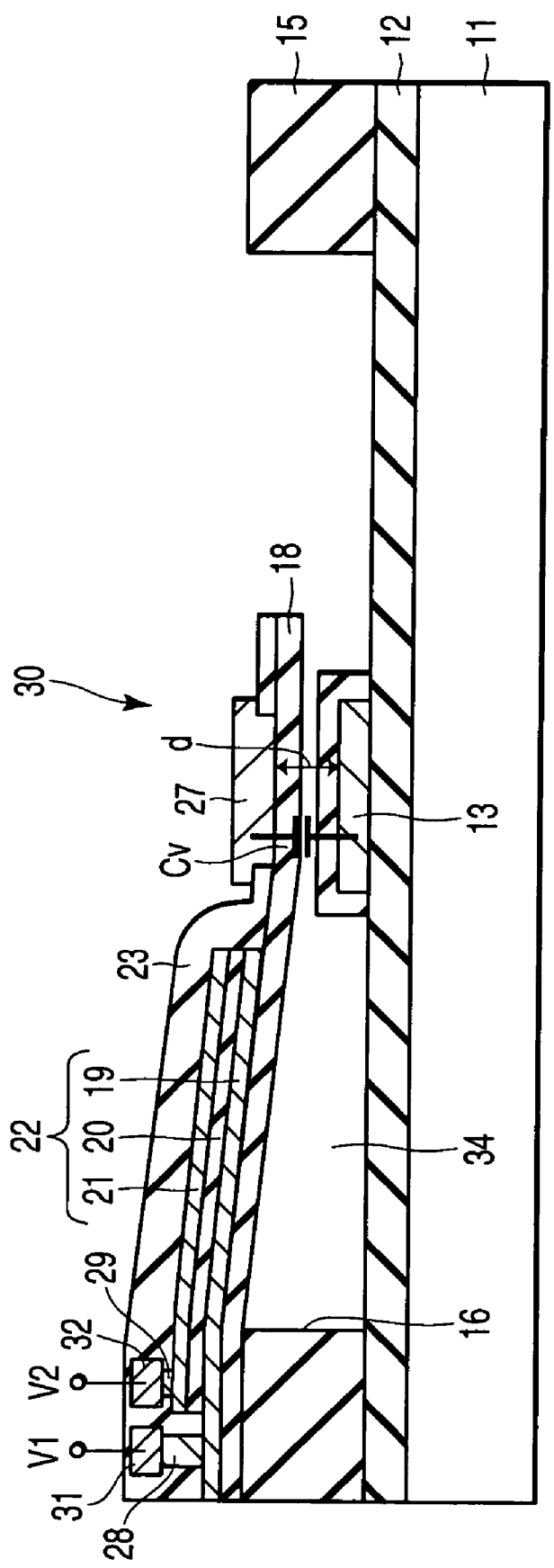
FIG. 87 is a sectional view showing the MEMS element according to each of the embodiments of the present invention in which an actuator having a cantilever structure is distorted downward in a nonmoving state.

For example, as shown in FIGS. 86 and 87, in the nonmoving state, i.e., when both the voltages V1 and V2 of the lower electrodes 19 and upper electrodes 21 of the actuators 22, 22a, and 22b are, e.g., 0V, the end of each of the actuators 22, 22a, and 22b on the side of the variable capacitor 30 may sink downward. As described above, in the nonmoving state, the actuators 22, 22a, and 22b may bend downward from the fulcrums the moving state, and a distance d between the first electrode layer 13 and the second electrode layer 27 of the variable capacitor 30 may be shorter than the depth of the trench 16.

Figure 88:
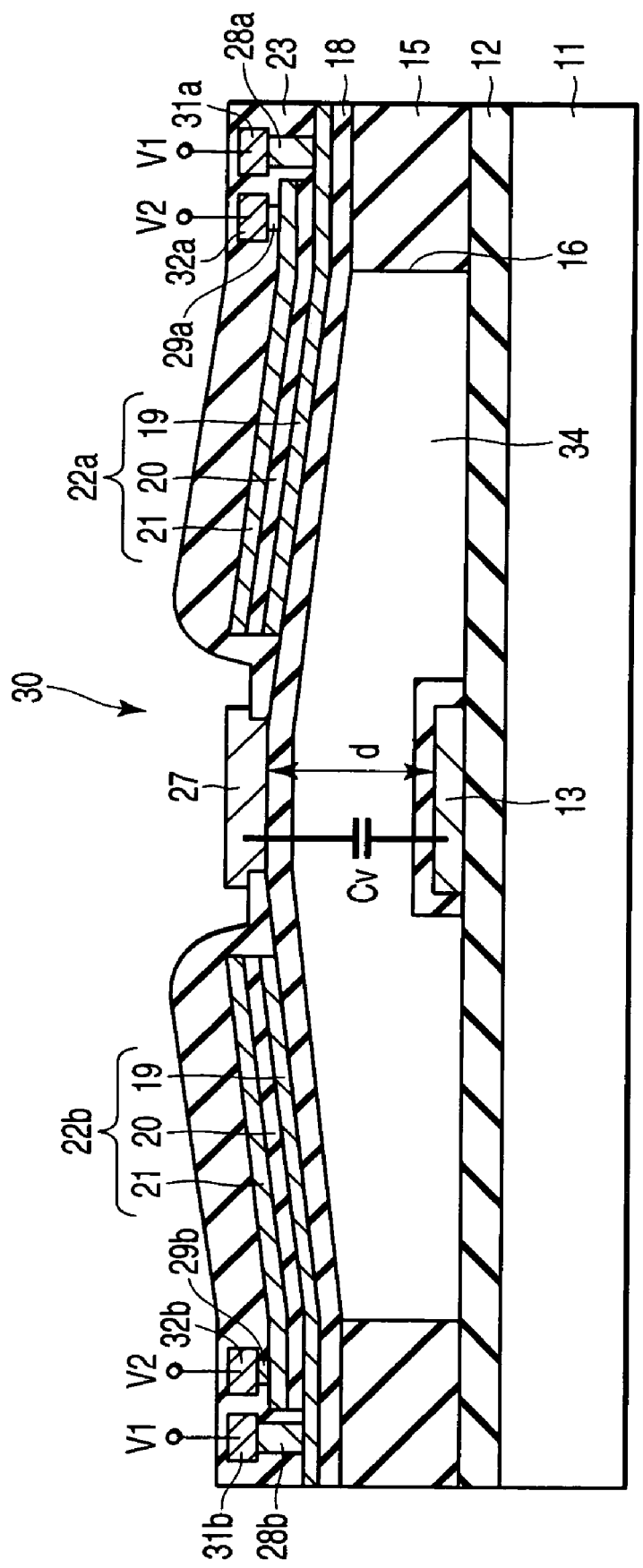
FIG. 88 is a sectional view showing the MEMS element according to each of the embodiments of the present invention in which an actuator having a doubly-supported-beam structure is distorted upward in a nonmoving state.
Figure 89:
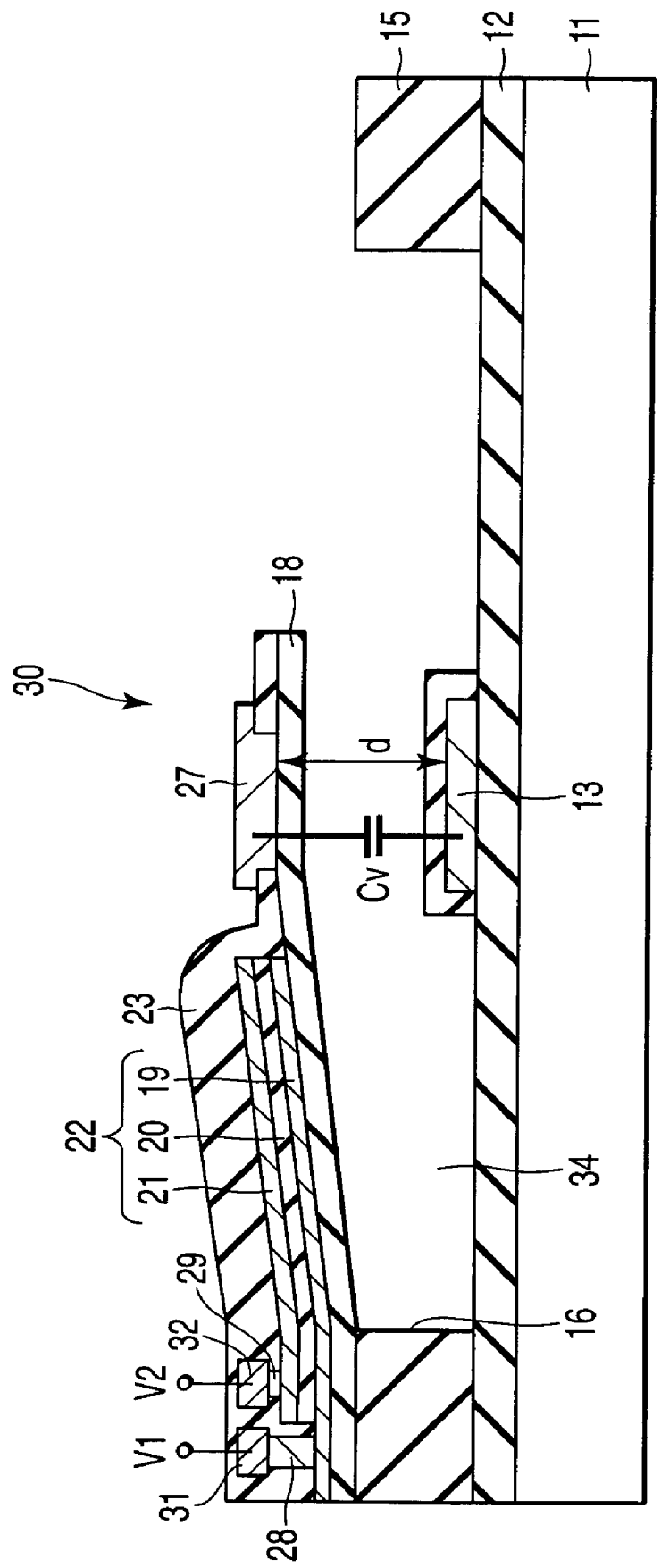
FIG. 89 is a sectional view showing the MEMS element according to each of the embodiments of the present invention in which an actuator having a cantilever structure is distorted upward in a nonmoving state.

Alternatively, as shown in FIGS. 88 and 89, in the nonmoving state, i.e., when both the voltages V1 and V2 of the lower electrodes 19 and upper electrodes 21 of the actuators 22, 22a, and 22b are, e.g., 0V, the end of each of the actuators 22, 22a, and 22b on the side of the variable capacitor 30 may warp upward. As described above, in the nonmoving state, the actuators 22, 22a, and 22b may bend upward from the fulcrums the moving state, and the distance d between the first electrode layer 13 and the second electrode layer 27 of the variable capacitor 30 may be longer than the depth of the trench 16.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device having a surface MEMS element, comprising:
    a semiconductor substrate; and
    an actuator which is arranged above the semiconductor substrate via a space and has a lower electrode, an upper electrode, and a piezoelectric layer sandwiched between the lower electrode and the upper electrode, at least an entire surface of the piezoelectric layer being substantially flat;
    a first electrode layer which is formed on the semiconductor substrate, and
    a second electrode layer which is arranged above the semiconductor substrate via the space, opposes the first electrode layer, and moves in accordance with movement of the actuator, and
    in which the first electrode layer and the second electrode layer function as a variable capacitor when a distance between the first electrode layer and the second electrode layer changes in accordance with the movement of the actuator,
    wherein the semiconductor substrate has a first region and a second region,
    the variable capacitor is formed in the first region,
    a first transistor having a first gate electrode and first source and drain diffusion layers is formed in the second region,
    the first electrode layer is made of a same material as the first gate electrode,
    the first electrode layer is provided above an insulation region in the first region of the semiconductor substrate, and
    a first well layer of a first conductivity type surrounds the first source and drain diffusion layers in the second region and is not provided below the first electrode layer.

2. The device according to claim 1, further comprising an insulating film which is formed between the first electrode layer and the second electrode layer.

3. The device according to claim 1, further comprising a second well layer of a second conductivity type, which surrounds the first well layer.

4. The device according to claim 1, wherein
the semiconductor substrate has a third region,
a resistive element is formed in the third region, the resistive element having a third electrode layer formed on the semiconductor substrate, a fourth electrode layer arranged above the semiconductor substrate, and an insulating layer formed between the third electrode layer and the fourth electrode layer, the fourth electrode layer opposing the third electrode layer,
the first electrode layer and the third electrode layer are made of a same material as the first gate electrode, and
the fourth electrode layer is made of a same material as the second electrode layer.

5. The device according to claim 1, wherein the variable capacitor is used in a matching circuit of an antenna portion.

6. The device according to claim 1, wherein the variable capacitor functions as a filter circuit.

7. The device according to claim 1, which further comprises a third electrode layer which is formed on the semiconductor substrate, is separated from the first electrode layer, and opposes the second electrode layer, and
in which the second electrode layer and the third electrode layer function as the variable capacitor when a distance between the second electrode layer and the third electrode layer changes in accordance with the movement of the actuator.

8. The device according to claim 1, wherein
a ferroelectric memory is formed in the second region, and
the ferroelectric memory stores data to trim voltage values to be applied to the upper electrode and the lower electrode.

9. The device according to claim 8, wherein the ferroelectric memory comprises:
a second transistor which has a second gate electrode and second source and drain diffusion layers, and
a ferroelectric capacitor which has a first capacitor electrode, a second capacitor electrode, and a ferroelectric film sandwiched between the first capacitor electrode and the second capacitor electrode, and
the ferroelectric film is made of a same material as the piezoelectric layer.

10. The device according to claim 1, wherein the piezoelectric layer is formed on only the lower electrode.

11. The device according to claim 1, wherein a planar shape of the piezoelectric layer is almost a same as a planar shape of the upper electrode.

12. The device according to claim 1, wherein an area of the piezoelectric layer is smaller than an area of the lower electrode.

13. The device according to claim 1, wherein a side surface of the lower electrode is in contact with an insulating film.

14. A semiconductor device comprising:
a semiconductor substrate which has a first region and a second region;
an actuator which is arranged above the semiconductor substrate in the first region via a space and has a lower electrode, an upper electrode, and a piezoelectric layer sandwiched between the lower electrode and the upper electrode;
a first electrode layer which is formed on the semiconductor substrate in the first region;
a second electrode layer which is arranged above the semiconductor substrate in the first region via the space, opposes the first electrode layer, and moves in accordance with movement of the actuator;
a gate electrode which is arranged on the semiconductor substrate in the second region and made of a same material as the first electrode layer;
a first electrode layer which is formed on the semiconductor substrate, and
a second electrode layer which is arranged above the semiconductor substrate via the space, opposes the first electrode layer, and moves in accordance with movement of the actuator, and
in which the first electrode layer and the second electrode layer function as a variable capacitor when a distance between the first electrode layer and the second electrode layer changes in accordance with the movement of the actuator,
wherein the semiconductor substrate has a first region and a second region,
the variable capacitor is formed in the first region,
a transistor having a gate electrode and source and drain diffusion layers is formed in the second region,
the first electrode layer is made of a same material as the gate electrode,
the first electrode layer is provided above an insulation region in the first region of the semiconductor substrate, and
a well layer of a conductivity type surrounds the source and drain diffusion layers in the second region and is not provided below the first electrode layer.

15. The device according to claim 14, wherein
a ferroelectric memory which stores data to trim voltage values to be applied to the upper electrode and the lower electrode is formed in the second region,
the ferroelectric memory comprising
the transistor, and
a ferroelectric capacitor which has a first capacitor electrode, a second capacitor electrode, and a ferroelectric film sandwiched between the first capacitor electrode and the second capacitor electrode.

* * * * *